(12) United States Patent
Ha et al.

(10) Patent No.: US 11,830,914 B2
(45) Date of Patent: Nov. 28, 2023

(54) POWER SEMICONDUCTOR DEVICE AND METHOD OF FABRICATING THE SAME

(71) Applicant: HYUNDAI MOBIS CO., LTD., Seoul (KR)

(72) Inventors: Jeong Mok Ha, Yongin-si (KR); Hyuk Woo, Yongin-si (KR); Sin A Kim, Yongin-si (KR); Tae Youp Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/328,600

(22) Filed: May 24, 2021

(65) Prior Publication Data

US 2021/0367039 A1    Nov. 25, 2021

(30) Foreign Application Priority Data

May 22, 2020  (KR) .................. 10-2020-0061694
Jun. 16, 2020  (KR) .................. 10-2020-0073130
(Continued)

(51) Int. Cl.
| H01L 29/10 | (2006.01) |
| H01L 29/16 | (2006.01) |
| H01L 29/06 | (2006.01) |
| H01L 29/66 | (2006.01) |
| H01L 29/08 | (2006.01) |
| H01L 29/78 | (2006.01) |
| H01L 21/74 | (2006.01) |

(52) U.S. Cl.
CPC .......... *H01L 29/1083* (2013.01); *H01L 21/74* (2013.01); *H01L 29/0634* (2013.01);
(Continued)

(58) Field of Classification Search
CPC . H01L 21/74; H01L 29/0623; H01L 29/0684; H01L 29/0696; H01L 29/06;
(Continued)

(56) References Cited

U.S. PATENT DOCUMENTS

2002/0117716 A1   8/2002 Bosco et al.
2017/0117392 A1*  4/2017 Bhalla ................. H01L 29/8083
(Continued)

FOREIGN PATENT DOCUMENTS

JP    2008-172007 A    7/2008
JP    2013-236040 A   11/2013
(Continued)

OTHER PUBLICATIONS

Office Action issued in corresponding Korean Patent Application No. 10-2020-0076554 dated Aug. 9, 2021.
(Continued)

*Primary Examiner* — Fazli Erdem
(74) *Attorney, Agent, or Firm* — MORGAN, LEWIS & BOCKIUS LLP

(57) ABSTRACT

A power semiconductor device includes a semiconductor layer of SiC, a gate insulating layer, a gate electrode layer, a drift region including at least one protruding portion in the semiconductor layer and having a first conductivity type, a well region including a first well region in the semiconductor layer and in contact with the protruding portion, and a second well region in the semiconductor layer outside the gate electrode layer and connected to the first well region, and having a second conductivity type, a source region including a first source region in the first well region and a second source region in the second well region and connected to the first source region, and having the first conductivity type, and a channel region under the gate electrode layer, in the semiconductor layer between the protruding portion and the first source region, and having the first conductivity type.

20 Claims, 48 Drawing Sheets

(30) Foreign Application Priority Data

| | | | |
|---|---|---|---|
| Jun. 23, 2020 | (KR) | ..................... | 10-2020-0076554 |
| Jun. 30, 2020 | (KR) | ..................... | 10-2020-0080162 |
| Jun. 30, 2020 | (KR) | ..................... | 10-2020-0080163 |
| Jul. 7, 2020 | (KR) | ..................... | 10-2020-0083474 |

(52) U.S. Cl.
CPC ...... *H01L 29/0865* (2013.01); *H01L 29/1095* (2013.01); *H01L 29/1608* (2013.01); *H01L 29/66068* (2013.01); *H01L 29/7802* (2013.01)

(58) Field of Classification Search
CPC . H01L 29/0847; H01L 29/0865; H01L 29/08; H01L 29/1037; H01L 29/1083; H01L 29/1095; H01L 29/10; H01L 29/1608; H01L 29/16; H01L 29/66068; H01L 29/66666; H01L 29/66; H01L 29/7802; H01L 29/7806; H01L 29/7827; H01L 29/7828; H01L 29/78
USPC .......................................................... 257/77
See application file for complete search history.

(56) References Cited

U.S. PATENT DOCUMENTS

| | | | | |
|---|---|---|---|---|
| 2019/0198656 | A1* | 6/2019 | Zhang | H01L 29/0646 |
| 2019/0348524 | A1* | 11/2019 | Ebiike | H01L 21/2652 |
| 2020/0295139 | A1* | 9/2020 | Sundaresan | H01L 29/7802 |

FOREIGN PATENT DOCUMENTS

| | | |
|---|---|---|
| JP | 2015-115337 A | 6/2015 |
| JP | 2016-009712 A | 1/2016 |
| JP | 2019-121705 A | 7/2019 |
| JP | 2020-077721 A | 5/2020 |
| KR | 10-2001-0030942 A | 4/2001 |
| KR | 10-2004-0037243 A | 5/2004 |
| KR | 10-2011-0049249 A | 5/2011 |
| KR | 10-1106535 B1 | 1/2012 |
| KR | 10-2013-0024364 A | 3/2013 |
| KR | 10-2013-0073781 A | 7/2013 |
| KR | 10-2014-0091956 A | 7/2014 |
| KR | 10-1780436 B1 | 9/2017 |
| KR | 10-2018-0001044 A | 1/2018 |

OTHER PUBLICATIONS

Office Action issued in corresponding Korean Patent Application No. 10-2020-0080162 dated Aug. 23, 2021.

Office Action issued in corresponding Korean Patent Application No. 10-2020-0083474 dated Sep. 12, 2021.

Notice of Allowance issued in corresponding Korean Patent Application No. 10-2020-0080163 dated Feb. 7, 2022, with English translation.

Notice of Allowance issued in corresponding Korean Patent Application No. 10-2020-0061694 dated Feb. 14, 2022, with English translation.

\* cited by examiner

POWER SEMICONDUCTOR DEVICE AND METHOD OF FABRICATING THE SAME

CROSS-REFERENCE TO RELATED APPLICATION

This application claims the benefit of priority to Korean Patent Application No. 10-2020-0061694, filed in the Korean Intellectual Property Office on May 22, 2020, Korean Patent Application No. 10-2020-0073130, filed in the Korean Intellectual Property Office on Jun. 16, 2020, Korean Patent Application No. 10-2020-0076554, filed in the Korean Intellectual Property Office on Jun. 23, 2020, Korean Patent Application No. 10-2020-0080162, filed in the Korean Intellectual Property Office on Jun. 30, 2020, Korean Patent Application No. 10-2020-0080163, filed in the Korean Intellectual Property Office on Jun. 30, 2020, and Korean Patent Application No. 10-2020-0083474, filed in the Korean Intellectual Property Office on Jul. 7, 2020, the entire contents of which are incorporated herein by reference.

TECHNICAL FIELD

The present disclosure relates to a semiconductor device, and more particularly, to a power semiconductor device for switching power transmission and a method of fabricating the same.

BACKGROUND

A power semiconductor device is a semiconductor device that operates in a high-voltage and high-current environment. The power semiconductor device is being used in a field requiring high-power switching, for example, in power conversion, a power converter, an inverter, etc. For example, the power semiconductor device may include an insulated gate bipolar transistor (IGBT), a metal oxide semiconductor field effect transistor (MOSFET), etc. The power semiconductor device basically requires high withstand voltage characteristics, and nowadays, the power semiconductor device additionally requires a high-speed switching operation.

As such, a power semiconductor device that uses silicon carbide (SiC) instead of silicon (Si) is being developed. The silicon carbide (SiC) that is a wide gap semiconductor material whose bandgap is higher than silicon may maintain stability even at a high temperature compared to silicon. In addition, because a breakdown electric field of the silicon carbide is higher than that of the silicon, the silicon carbide may stably operate even at a high temperature. Accordingly, the power semiconductor device using the silicon carbide as the semiconductor layer shows stable operational characteristics due to higher breakdown voltage and excellent heat release compared to silicon.

When a power semiconductor device uses the silicon carbide, negative charges due to formation of carbon clusters in a gate insulating layer causes the band gap of the silicon carbide surface to rise upward. Therefore, there is a problem that a threshold voltage is increased and the channel resistance is increased. In addition, as a source contact structure is disposed between gate electrodes, it is also difficult to decrease a distance between the gate electrodes. As such, there is a limitation in reducing the channel density.

SUMMARY

The present disclosure has been made to solve the above-mentioned problems occurring in the prior art while advantages achieved by the prior art are maintained intact.

An aspect of the present disclosure provides a silicon carbide power semiconductor device capable of increasing channel density and a method of fabricating the same. However, these problems are exemplary, and the scope of the present disclosure is not limited thereby.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, a power semiconductor device includes a semiconductor layer of silicon carbide (SiC), a gate insulating layer disposed on at least a part of the semiconductor layer, a gate electrode layer disposed on the gate insulating layer, a drift region that includes at least one protruding portion disposed under the gate electrode layer in the semiconductor layer and has a first conductivity type, a well region that includes a first well region, which is disposed in the semiconductor layer of a lower part of the gate electrode layer and is in contact with the at least one protruding portion, and a second well region, which is disposed in the semiconductor layer outside the gate electrode layer and is connected to the first well region, and has a second conductivity type, a source region that includes a first source region disposed in the first well region and a second source region disposed in the second well region and connected to the first source region, and to have the first conductivity type, and a channel region that is disposed under the gate electrode layer, is disposed in the semiconductor layer between the at least one protruding portion of the drift region and the first source region, and has the first conductivity type.

The power semiconductor device may further include a source electrode layer connected to the second source region outside the gate electrode layer.

The power semiconductor device may further include a well contact region extending from the second well region through the second source region in the second source region, connected to the source electrode layer, and having the second conductivity type, and the well contact region may be doped with impurities having a higher concentration than the well region.

The at least one protruding portion of the drift region, the first well region, and the first source region may extend in one direction.

The first well region, the first source region, and the channel region may be respectively disposed in the semiconductor layer on opposite sides of the at least one protruding portion of the drift region.

The channel region may be part of the well region.

The at least one protruding portion may include a plurality of protruding portions whose sidewalls are surrounded by the first well region, and the channel region may be disposed between the plurality of protruding portions and the first source region.

The plurality of protruding portions may extend side by side in one direction.

The first well region may be symmetrically disposed with respect to the second well region, the first source region may be symmetrically disposed with respect to the second source region, and the channel region may be symmetrically disposed with respect to the second well region or the second source region.

The at least one protruding portion may include a plurality of protruding portions symmetrically disposed with respect to the second well region or the second source region, and the plurality of protruding portions may extend in one direction.

The gate electrode layer may expose the second source region and cover the first source region, the channel region, and the at least one protruding portion of the drift region.

The power semiconductor device may further include a drain region having the first conductivity type in the semiconductor layer under the drift region, and the drain region may be doped with impurities having a higher concentration than the drift region.

According to an aspect of the present disclosure, a method of fabricating a power semiconductor device includes forming a drift region having a first conductivity type in a semiconductor layer of silicon carbide (SiC), forming a well region having a second conductivity type, to allow the drift region to include at least one protruding portion, and including a first well region defining the at least one protruding portion and a second well region connected to the first well region, forming a source region including a first source region formed in the first well region and a second source region formed in the second well region and connected to the first source region, and having the first conductivity type, forming a channel region, having the first conductivity type, in the semiconductor layer between the at least one protruding portion of the drift region and the first source region, forming a gate insulating layer on at least the channel region and the at least one protruding portion of the drift region, and forming at least one gate electrode layer on the gate insulating layer, and the second well region is formed in the semiconductor layer outside the gate electrode layer.

The method of fabricating the power semiconductor device may further include forming a well contact region extending from the second well region in the second source region outside the gate electrode layer through the second source region, connected to a source electrode layer, and having the second conductivity type, and the well contact region may be doped with impurities having a higher concentration than the well region.

The method of fabricating the power semiconductor device may further include forming the source electrode layer on the semiconductor layer to be connected to the second source region and the well contact region.

The forming of the well region and the channel region may be performed by implanting impurities of the second conductivity type into the semiconductor layer, and the forming of the source region may be performed by implanting impurities of the first conductivity type into the well region.

The at least one protruding portion may include a plurality of protruding portions whose sidewalls are surrounded by the first well region, and the channel region may be formed between the plurality of protruding portions and the source region.

The first well region may be symmetrically formed with respect to the second well region, the first source region may be symmetrically formed with respect to the second source region, and the channel region may be symmetrically formed with respect to the second well region or the second source region.

The drift region may be formed on a drain region having the first conductivity type, and the drift region may be formed as an epitaxial layer on the drain region.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Below, an embodiment of the present disclosure will be described in detail with reference to accompanying drawings. However, the present disclosure may be implemented in various different forms and should not be construed as being limited to embodiments to be disclosed below. Rather, these embodiments are provided as examples so that this disclosure will be thorough and complete and will fully convey the scope and spirit of the disclosure to one skilled in the art. Also, for convenience of description, sizes of at least some components or elements shown in drawings may be exaggerated or reduced. In drawings, the same sign refers to the same element.

Unless otherwise defined, all terms used herein are to be interpreted as commonly understood by one skilled in the art. In drawings, sizes of layers and regions are exaggerated for description, and are thus provided to describe normal structures of the present disclosure.

The same reference signs indicate the same components. When a first component such as a layer, a region, or a substrate is described as being on a second component, it may be understood as the first component is directly on the second component or a third component is interposed therebetween. On the other hand, when a first component is described as being "directly on" a second component, it is understood as any intermediate component is not interposed therebetween.

Figure 1:
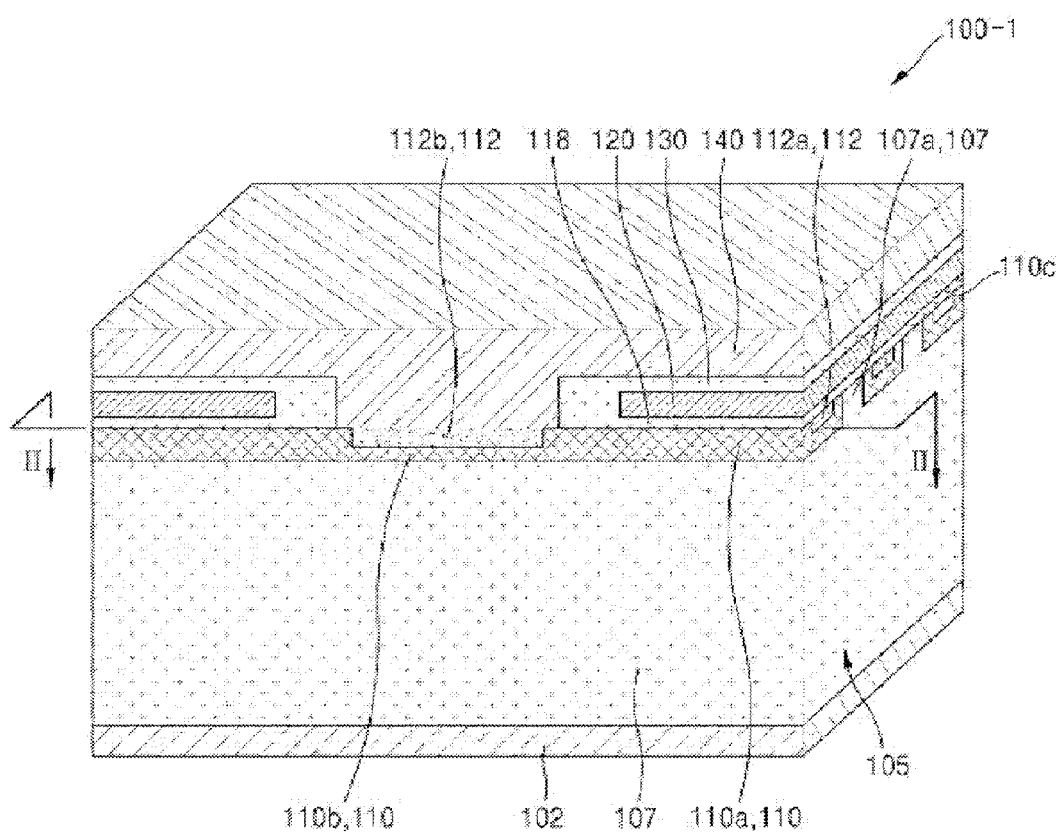
FIG. 1 is a schematic perspective view illustrating a power semiconductor device according to an embodiment of the present disclosure.
Figure 2:
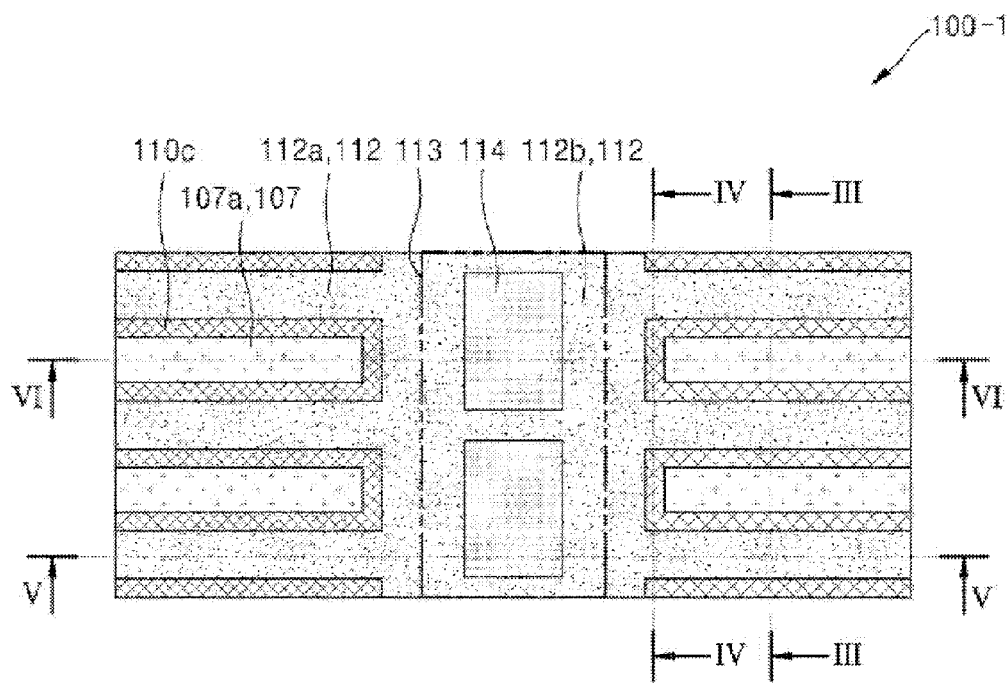
FIG. 2 is a plan view illustrating the power semiconductor device taken along line II-II of FIG. 1.
Figure 3:
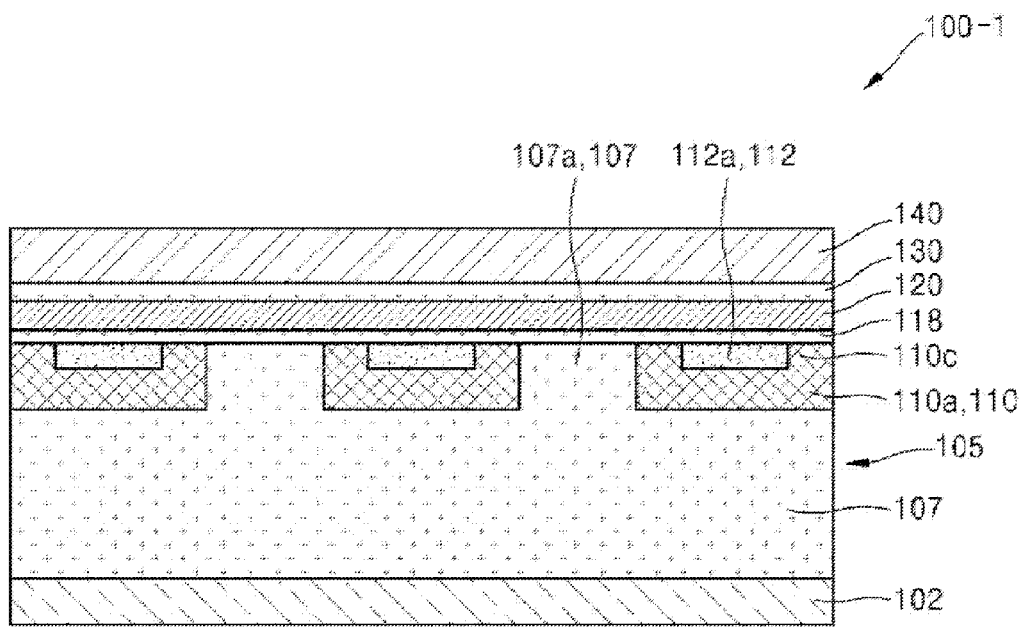
FIG. 3 is a cross-sectional view illustrating the power semiconductor device taken along line III-III of FIG. 2.
Figure 4:
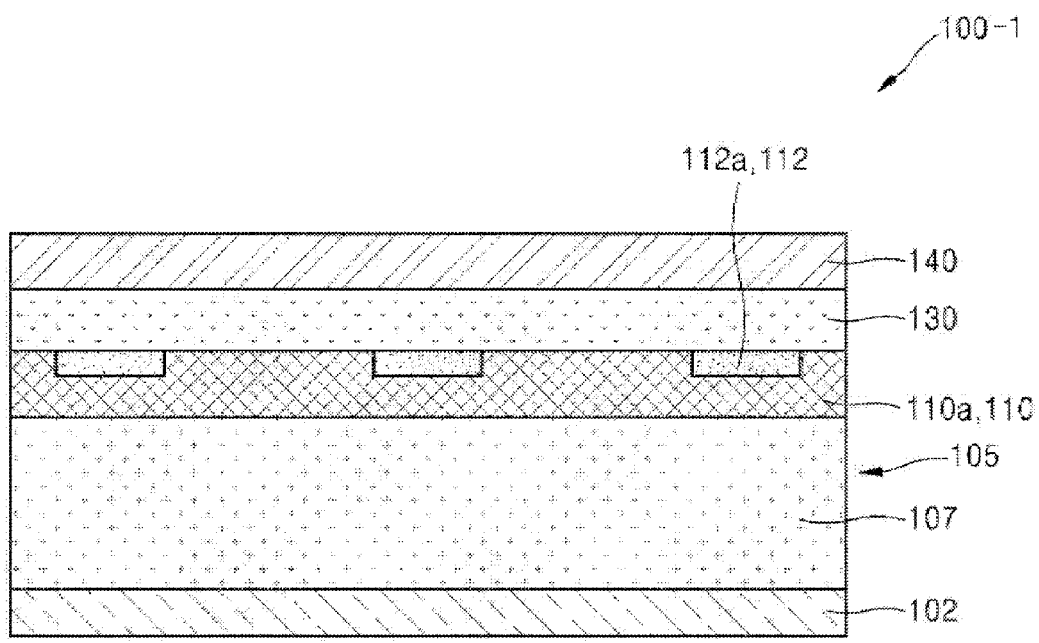
FIG. 4 is a cross-sectional view illustrating the power semiconductor device taken along line IV-IV of FIG. 2.
Figure 5:
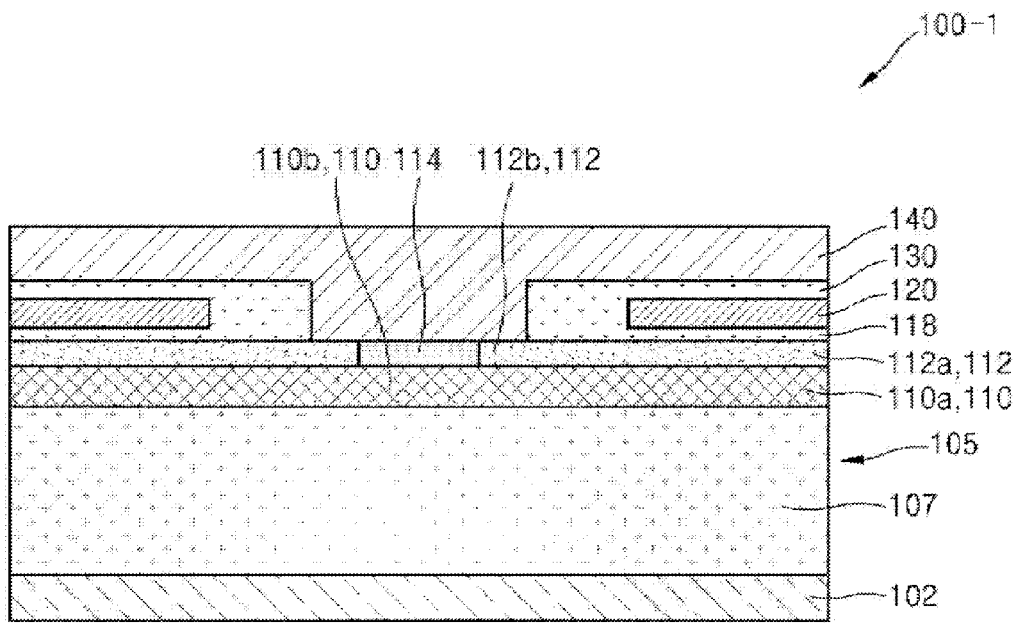
FIG. 5 is a cross-sectional view illustrating the power semiconductor device taken along line V-V of FIG. 2.
Figure 6:
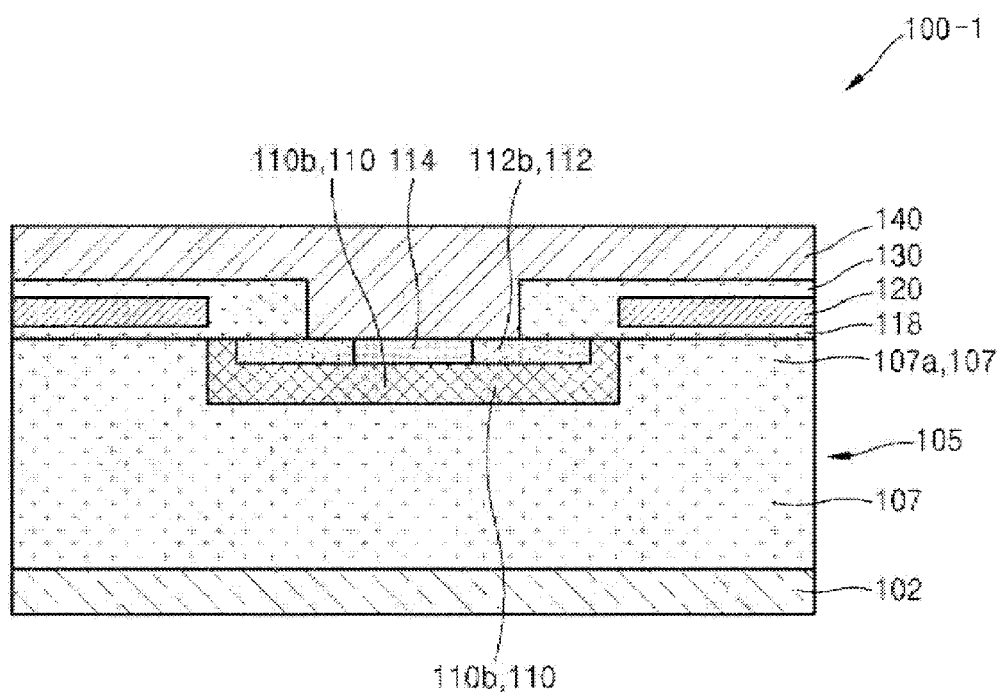
FIG. 6 is a cross-sectional view illustrating the power semiconductor device taken along line VI-VI of FIG. 2.

FIG. 1 is a schematic perspective view illustrating a power semiconductor device 100-1 according to an embodiment of the present disclosure, FIG. 2 is a plan view illustrating the power semiconductor device 100-1 taken along line II-II of FIG, FIG. 3 is a cross-sectional view illustrating the power semiconductor device 100-1 taken along line III-III of FIG. 2, FIG. 4 is a cross-sectional view illustrating the power semiconductor device 100-1 taken along line IV-IV of FIG. 2, FIG. 5 is a cross-sectional view illustrating the power semiconductor device 100-1 taken along line V-V of FIG. 2, and FIG. 6 is a cross-sectional view illustrating the power semiconductor device 100-1 taken along line VI-VI of FIG. 2.

Referring to FIGS. 1 to 6, the power semiconductor device 100-1 may include at least a semiconductor layer 105, a gate insulating layer 118, and a gate electrode layer 120. For example, the power semiconductor device 100-1 may have a power MOSFET structure.

The semiconductor layer 105 may refer to one or a plurality of layers of semiconductor material, and may refer to, for example, one or a plurality of epitaxial layers. Furthermore, the semiconductor layer 105 may refer to one or a plurality of epitaxial layers on a semiconductor substrate.

For example, the semiconductor layer 105 may be formed of silicon carbide (SiC). Specifically, the semiconductor layer 105 may include at least one epitaxial layer of silicon carbide.

Silicon carbide (SiC) may have a wider bandgap compared to silicon, and thus may maintain stability even at a high temperature. In addition, because a breakdown electric field of the silicon carbide is higher than that of the silicon, the silicon carbide may stably operate even at a high temperature. Accordingly, the power semiconductor device 100-3 using the silicon carbide as the semiconductor layer 105 shows stable operational characteristics due to higher breakdown voltage and excellent heat release compared to silicon.

Specifically, the semiconductor layer 105 may include a drift region 107. The drift region 107 may have a first conductivity type, and may be formed by implanting impurities of the first conductivity type into a part of the semiconductor layer 105. For example, the drift region 107 may be formed by doping the impurities of the first conductivity type in the epitaxial layer of silicon carbide.

Further, the drift region 107 may include at least one protruding portion 107a disposed under the gate electrode layer 120. During an operation of the power semiconductor device 100-1, the protruding portion 107a may provide a vertical movement path for electric charges.

A well region 110 may be formed in the semiconductor layer 105 to be in contact with at least a part of the drift region 107, and may have a second conductivity type. For example, the well region 110 may be formed by doping impurities of the second conductivity type opposite to the first conductivity type in the drift region 107.

For example, the well region 110 may include a first well region 110a formed in the semiconductor layer 105 under the gate electrode layer 120 and in contact with the protruding portion 107a of the drift region 107 and a second well region 110b formed in the semiconductor layer 105 outside the gate electrode layer 120. The first well region 110a and the second well region 110b may be connected to each other. Substantially, the protruding portion 107a of the drift region 107 may be defined by the first well region 110a, and specifically, may be in contact with a sidewall of the first well region 110a.

A source region 112 may be formed in the well region 110 and may have the first conductivity type. For example, the source region 112 may be formed by doping the well region 110 with impurities of the first conductivity type. The source region 112 may be formed by doping with a higher concentration of the impurities of the first conductivity type than the drift region 107.

For example, the source region 112 may include a first source region 112a formed in the first well region 110a and a second source region 112b formed in the second well region 110b. The first source region 112a and the second source region 112b may be connected to each other. The first source region 112a may be disposed under the gate electrode layer 120, and the second source region 112b may be disposed outside the gate electrode layer 120.

The second source region 112b may include a source contact region 113 connected to a source electrode layer 140 outside the gate electrode layer 120. For example, the source contact region 113 may be a part of the second source region 112b and may refer to a part to which the source electrode layer 140 is connected.

A well contact region 114 may be formed in the second source region 112b, specifically, in the source contact region 113. For example, the well contact region 114 may extend from the second well region 110b through the second source region 112b, and may have the second conductivity type. One or a plurality of well contact regions 114 may be formed in the source contact region 113.

The well contact region 114 may be connected to the source electrode layer 140. When connected to the source electrode layer 140, the well contact region 114 may be formed by doping with a higher concentration of the impurities of the second conductivity type than the well region 110 for lowering contact resistance.

A channel region 110c may be formed in the semiconductor layer 105 between the drift region 107 and the source region 112. For example, the channel region 110c may be formed in the semiconductor layer 105 between the protruding portion 107a of the drift region 107 and the first source region 112a. The channel region 110c may have the second conductivity type such that an inversion channel is formed.

Because the channel region 110c has the doping type opposite to the source region 112 and the drift region 107, the channel region 110c, the source region 112, and the drift region 107 may form a diode junction. Accordingly, the channel region 110c may not allow movement of charges in a normal situation, but when an operation voltage is applied to the gate electrode layer 120, an inversion channel may be formed therein to allow the movement of charges.

For example, the channel region 110c may be a part of the well region 110. In this case, the channel region 110c may be formed to be continuously connected to the well region 110a. A doping concentration of the impurities of the second conductivity type in the channel region 110c may be the same as those of other portions of the well region 110 or may be different therefrom for adjusting a threshold voltage.

In some embodiments, the protruding portion 107a of the drift region 107, the first well region 110a, the channel region 110c, and/or the first source region 112a may extend in one direction. For example, a direction of the line V-V or the line VI-VI of FIG. 2 may be the one direction.

In some embodiments, the first well region 110a, the channel region 110c, and the first source region 112a may be symmetrically formed based on the protruding portion 107a of the drift region 107. For example, the first well region 110a, the channel region 110c, and the first source region 112a may be formed on the semiconductor layer 105 on opposite sides of the protruding portion 107a of the drift region 107, respectively.

In some embodiments, the drift region 107 may include a plurality of protruding portions 107a whose sidewalls are surrounded by the first well region 110a. For example, the first well region 110a may be formed in a stripe pattern extending in one direction, and the protruding portions 107a may also be formed in a stripe pattern. In this case, the protruding portions 107a may extend side by side in one direction.

In addition, the first source region 112a may be formed in a stripe pattern in the first well region 110a. The channel region 110c may be formed between the protruding portions 107a and the first source region 112a.

In some embodiments, the first well regions 110a may be formed symmetrically with respect to the second well region 110b, and the first source regions 112a may be formed symmetrically with respect to the second source region 112b. In this case, the protruding portions 107a of the drift region 107 and the channel region 110c may be symmetrically formed with respect to the second well region 110b or the second source region 112b.

Further, the first well region 110a and the second well region 110b may be formed repeatedly and alternately in one direction. In this case, the first source region 112a and the second source region 112b may also be repeatedly formed.

Additionally, a drain region 102 may be formed in the semiconductor layer 105 under the drift region 107 and may have the first conductivity type. For example, the drain region 102 may be doped with impurities having a higher concentration than the drift region 107.

In some embodiments, the drain region 102 may be provided as a substrate of silicon carbide having the first conductivity type. In this case, the drain region 102 may be understood as a part of the semiconductor layer 105 or a separate substrate from the semiconductor layer 105.

The gate insulating layer 118 may be formed on at least a part of the semiconductor layer 105. For example, the gate insulating layer 118 may be formed on at least the channel region 110c. Specifically, the gate insulating layer 118 may be formed on the first source region 112a, the channel region 110c, and the protruding portion 107a of the drift region 107.

For example, the gate insulating layer 118 may include an insulating material such as silicon oxide, silicon carbide oxide, silicon nitride, hafnium oxide, zirconium oxide, aluminum oxide, or a stacked structure thereof.

At least one gate electrode layer 120 may be formed on the gate insulating layer 118. For example, the gate electrode layer 120 may be formed on at least the channel region 110c. Specifically, the gate electrode layer 120 may be formed on the first source region 112a, the channel region 110c, and the protruding portion 107a of the drift region 107. Further, the second well region 110b, the second source region 112b, and the well contact region 114 may be disposed outside the gate electrode layer 120 and may be exposed from the gate electrode layer 120.

For example, the gate electrode layer 120 may include a suitable conductive material, such as polysilicon, metal, metal nitride, metal silicide, or the like, or may include a stacked structure thereof.

An interlayer insulating layer 130 may be formed on the gate electrode layer 120. For example, the interlayer insulating layer 130 may include a suitable insulating material, such as an oxide layer, a nitride layer, or a stacked structure thereof.

The source electrode layer 140 may be formed on the interlayer insulating layer 130 and may be connected to the source region 112, specifically, the second source region 112b. Furthermore, the source electrode layer 140 may be commonly connected to the second source region 112b and the well contact region 114. For example, the source electrode layer 140 may be formed of an appropriate conductive material, metal, or the like.

In the power semiconductor device 100-1 described above, the first conductivity type and the second conductivity type may have opposite conductivity types, but may be any one of n-type and p-type, respectively. For example, when the first conductivity type is n-type, the second conductivity type is p-type, and vice versa.

Specifically, when the power semiconductor device 100-1 is an N-type MOSFET, the drift region 107 may be an N− region, the source region 112 and the drain region 102 may be N+ regions, the well region 110 and the channel region 110c may be P− regions, and the well contact region 114 may be a P+ region.

During the operation of the power semiconductor device 100-1, current may generally flow in a vertical direction from the drain region 102 along the protruding portions 107a of the drift region 107, and then may flow through the channel region 110c to the source region 112.

In the power semiconductor device 100-1 described above, the source contact region 113 and the well contact region 114 may be separately disposed outside the gate electrode layer 120. Accordingly, the first well region 110a and the first source region 112a may be formed such that the protruding portions 107a of the drift region 107 are densely disposed, and thus the channel region 110c may be densely formed under the gate electrode layer 120. Accordingly, the power semiconductor device 100-1 may have a high degree of integration.

FIGS. 7 to 10 are schematic perspective views illustrating a method of fabricating the power semiconductor device 100-1 according to an embodiment of the present disclosure.

Figure 7:
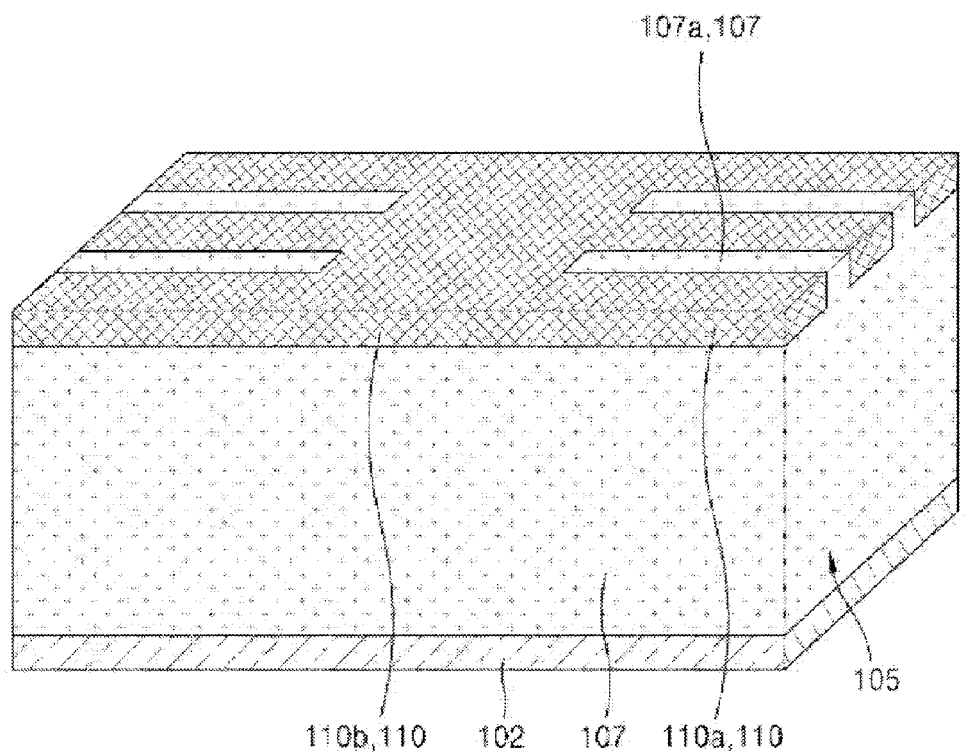
FIGS. 7 to 10 are schematic perspective views illustrating a method of fabricating a power semiconductor device according to an embodiment of the present disclosure.

Referring to FIG. 7, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be provided as a substrate of the first conductivity type, and the drift region 107 may be formed as one or the plurality of epitaxial layers on the substrate.

Subsequently, the well region 110 having the second conductivity type may be formed in the semiconductor layer 105 to be in contact with the at least a part of the drift region 107. For example, the forming of the well region 110 may be performed by implanting the impurities of the second conductivity type into the semiconductor layer 105.

For example, the well region 110 may be formed in the semiconductor layer 105 such that the drift region 107 includes the at least one protruding portion 107a surrounded by at least a part of the well region 110. Specifically, the well region 110 may be formed by doping the drift region 107 with the impurities of a conductivity type opposite to that of the drift region 107.

The well region 110 may be divided into the first well region 110a in which the channel region 110c is to be formed and the second well region 110b in which the well contact region 114 is to be formed. For example, the first well region 110a may define the protruding portion 107a of the drift region 107. The first well region 110a and the second well region 110b may be connected to each other.

Figure 8:
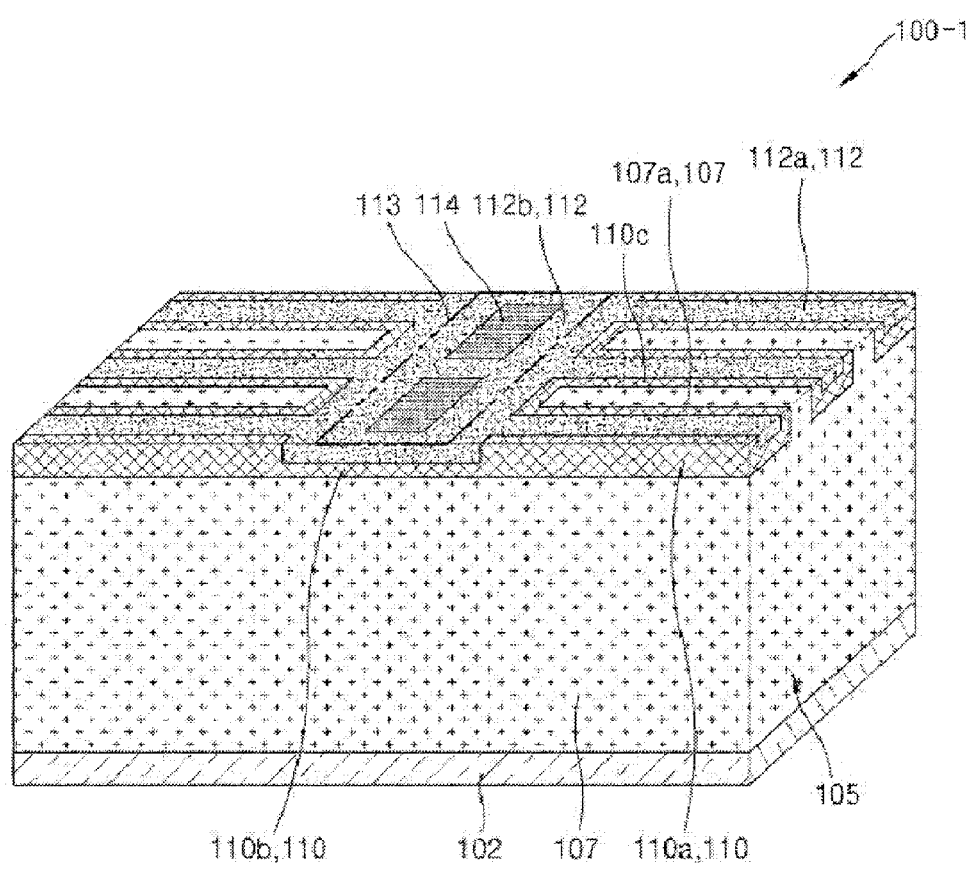

Referring to FIG. 8, the source region 112 having the first conductivity type may be formed in the well region 110. For example, the forming of the source region 112 may be performed by implanting the impurities of the first conductivity type into the well region 110.

For example, the forming of the source region 112 may include forming the first source region 112a in the first well region 110a and forming the second source region 112b in the second well region 110b. A part of the second source region 112b may be allocated as the source contact region 113 to be connected to the source electrode layer 140. The first source region 112a and the second source region 112b may be connected to each other.

In addition to the formation of the source region 112, the channel region 110c having the second conductivity type may be formed to form the inversion channel in the semiconductor layer 105 between the source region 112 and the drift region 107. For example, the channel region 110c may be formed in the semiconductor layer 105 between the protruding portion 107a of the drift region 107 and the first source region 112a.

Optionally, the well contact region 114 extending from the second well region 110b through the second source region 112b may be formed in the second source region 112b. For example, the well contact region 114 may be formed by implanting the second conductivity type impurity into a part of the well region 110 at a higher concentration than the well region 110.

In the above-described fabricating method, impurity implantation or impurity doping may be performed such that the impurities are mixed when the impurities are implanted into the semiconductor layer 105 or the epitaxial layer is formed. However, for implantation of the impurities in the selective region, an ion implantation method using a mask pattern may be used.

Optionally, after the ion implantation, a heat treatment for activating or diffusing the impurities may be followed.

Figure 9:
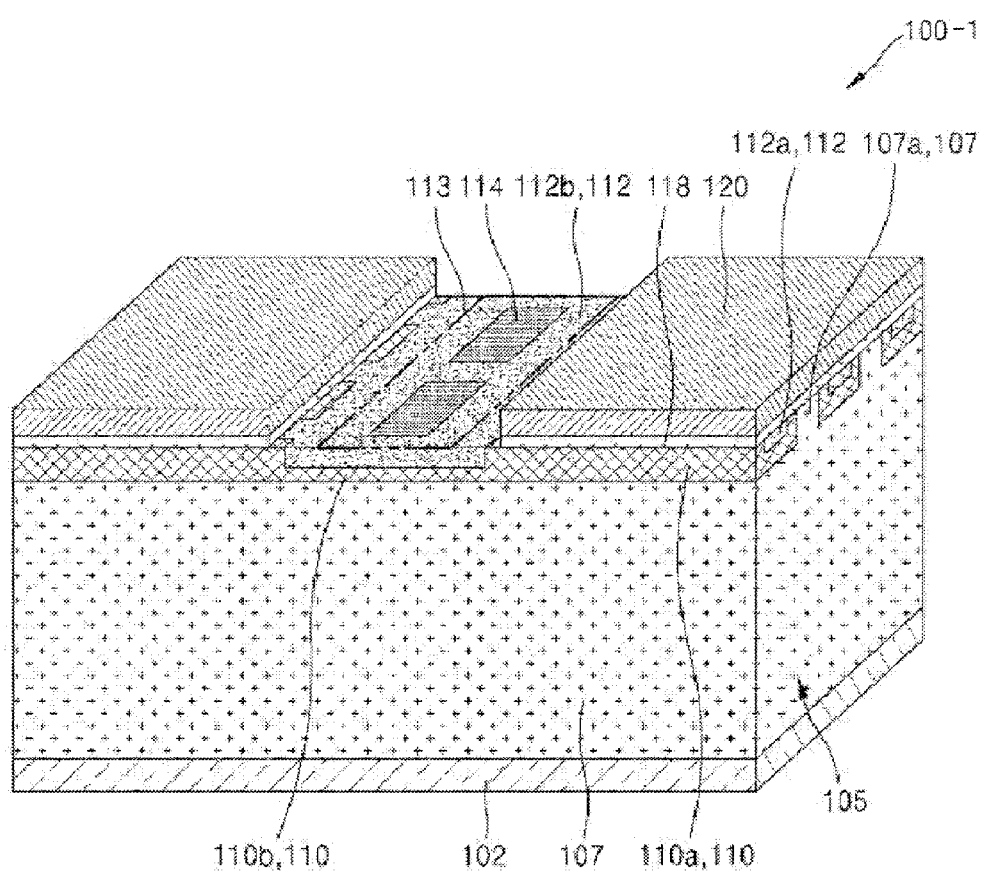

Referring to FIG. 9, the gate insulating layer 118 may be formed on at least a part of the semiconductor layer 105. For example, the gate insulating layer 118 may be formed on at least the channel region 110c and the protruding portion 107a of the drift region 107.

For example, the gate insulating layer 118 may be formed by oxidizing the semiconductor layer 105 to form an oxide, or by depositing an insulating material such as oxide or nitride on the semiconductor layer 105.

Subsequently, the gate electrode layers 120 may be formed on the gate insulating layer 118. For example, the gate electrode layers 120 may be formed by forming a conductive layer on the gate insulating layer 118 and then patterning the conductive layer. The gate electrode layer 120 may be formed by doping polysilicon with impurities, or may be formed to include a conductive metal or metal silicide.

The patterning process may be performed using photo lithography and etching processes. The photolithography process may include a process which forms a photoresist pattern as a mask layer using a photo process and a development process. The etching process may include a process which selectively etches an underlying structure using the photoresist pattern.

Figure 10:
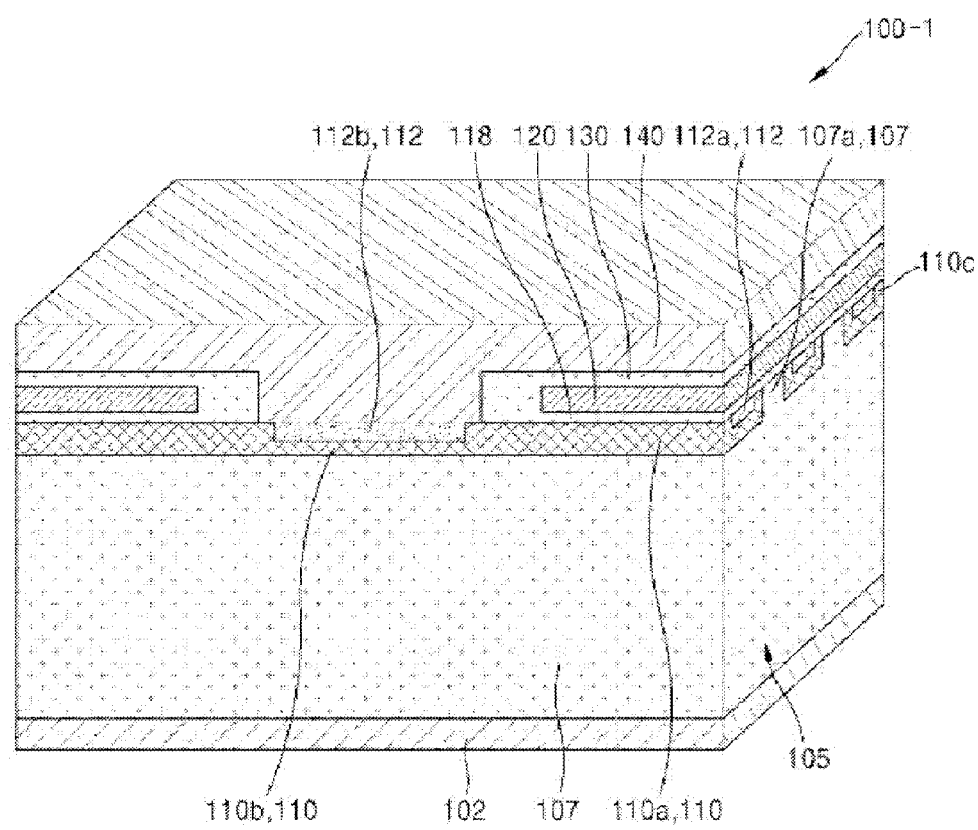

Referring to FIG. 10, the interlayer insulating layer 130 may be formed on the gate electrode layers 120. Optionally, when the interlayer insulating layer 130 is entirely formed on the underlying structure, a process which forms a contact hole pattern for exposing the source contact region 113 and the well contact region 114 may be followed.

Subsequently, the source electrode layer 140 may be formed on the semiconductor layer 105 to be connected to the second source region 112b and the well contact region 114. For example, the source electrode layer 140 may be formed by forming a conductive layer, such as a metal layer, on the interlayer insulating layer 130 and then patterning or planarizing the conductive layer.

According to the above-described fabricating method, it is possible to economically fabricate the highly integrated power semiconductor device 100-1 by using a process used in an existing silicon substrate, using the semiconductor layer 105 of silicon carbide.

Figure 11:
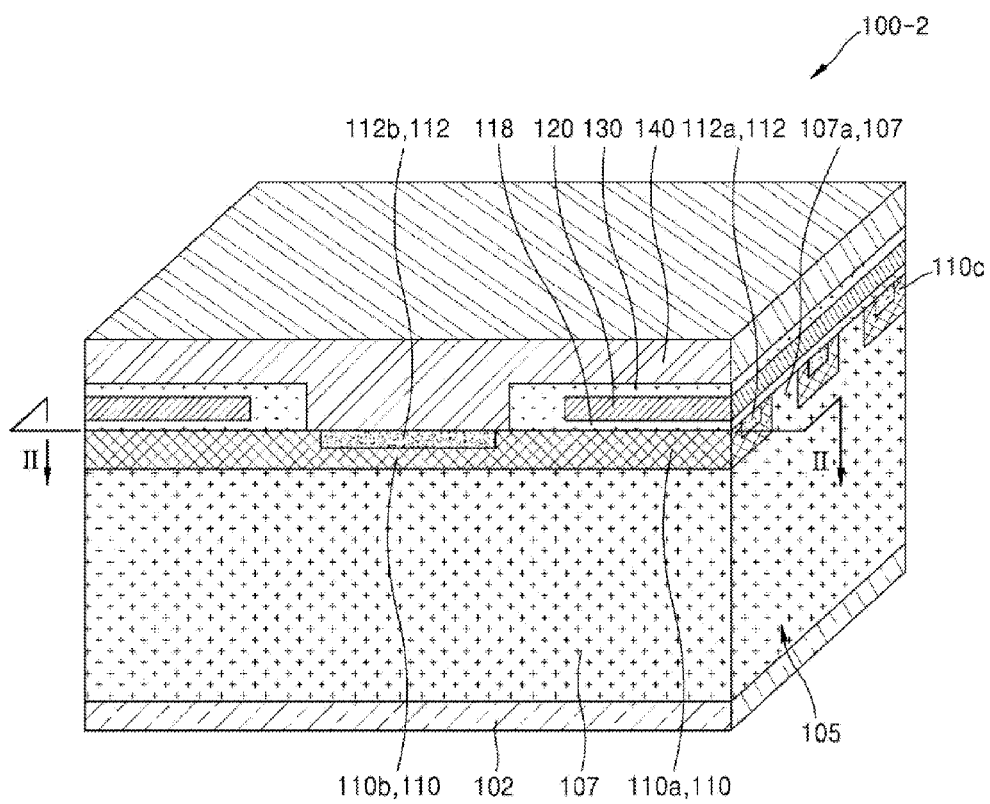
FIG. 11 is a schematic perspective view illustrating a power semiconductor device according to an embodiment of the present disclosure.
Figure 12:
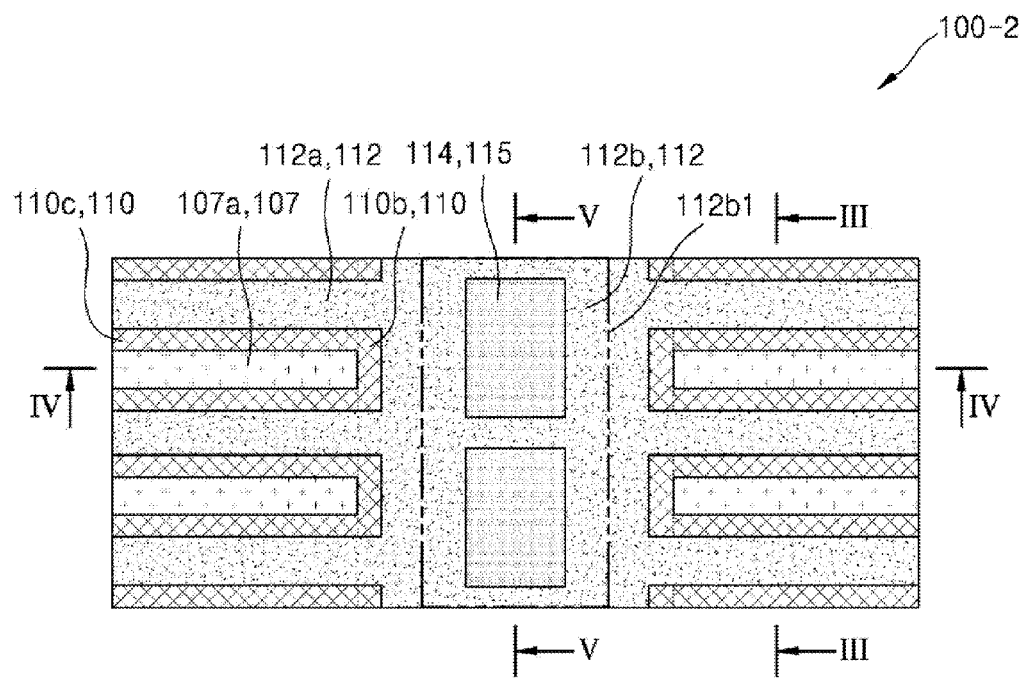
FIG. 12 is a plan view illustrating the power semiconductor device taken along line II-II of FIG. 11.
Figure 13:
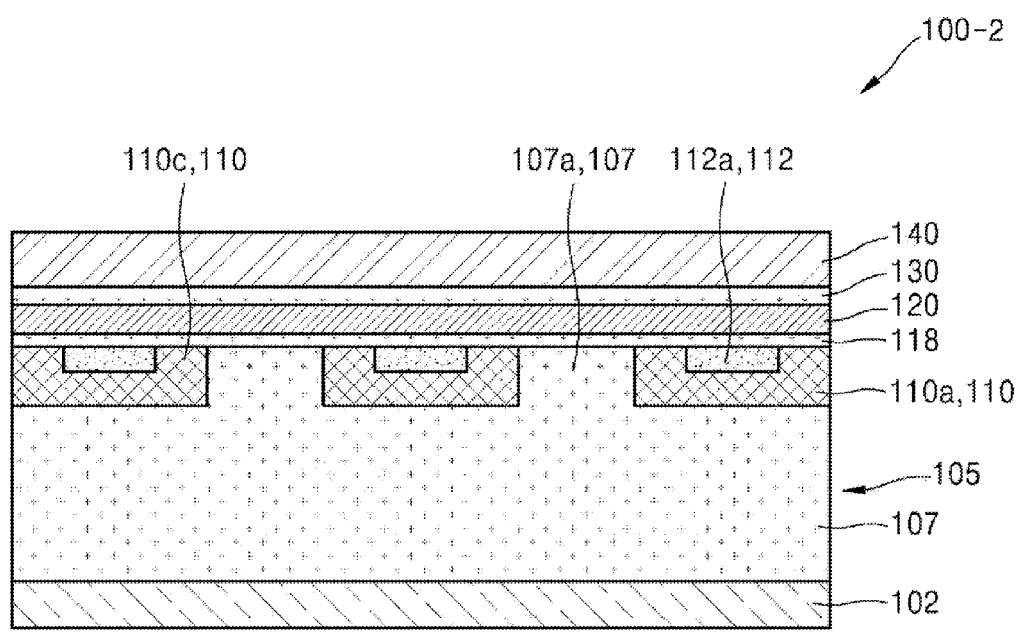
FIG. 13 is a cross-sectional view illustrating the power semiconductor device taken along line III-III of FIG. 12.
Figure 14:
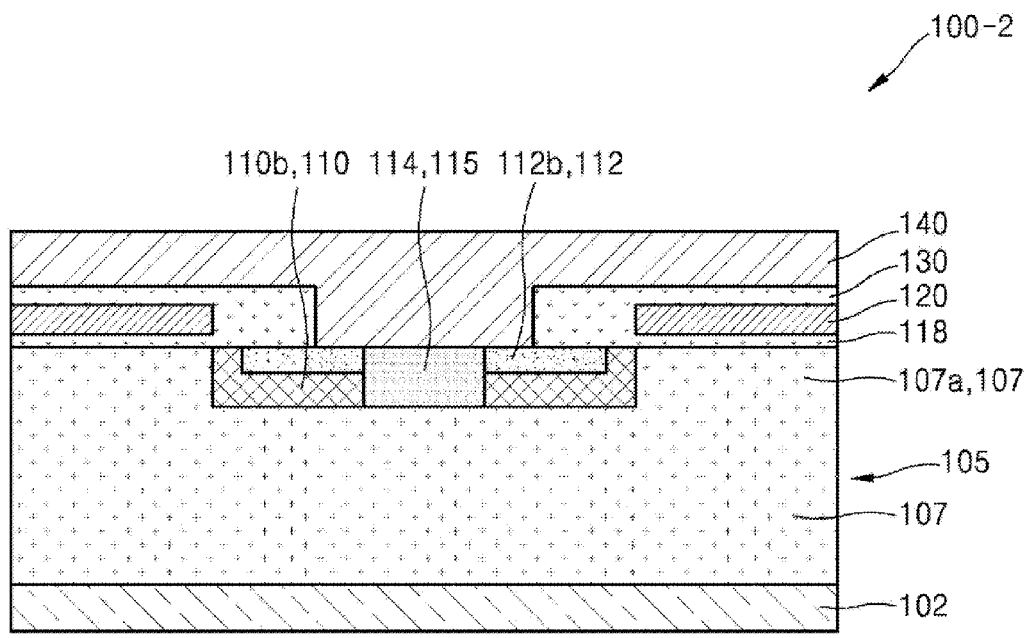
FIG. 14 is a cross-sectional view illustrating the power semiconductor device taken along line IV-IV of FIG. 12.
Figure 15:
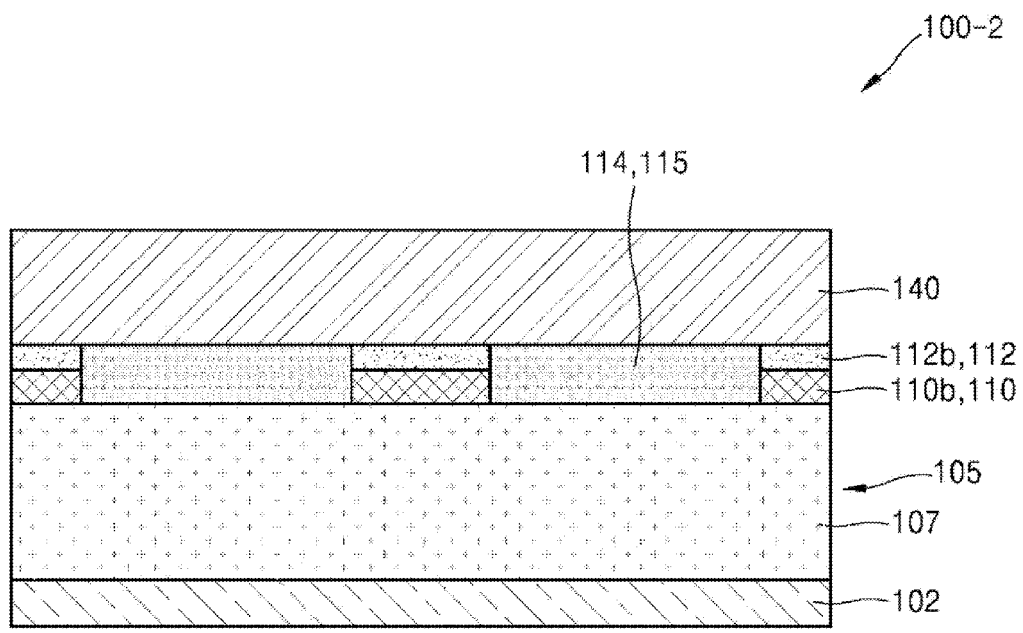
FIG. 15 is a cross-sectional view illustrating the power semiconductor device taken along line V-V of FIG. 12.

FIG. 11 is a schematic perspective view illustrating a power semiconductor device 100-2 according to an embodiment of the present disclosure, FIG. 12 is a plan view illustrating the power semiconductor device 100-2 taken along line II-II of FIG. 11, FIG. 13 is a cross-sectional view illustrating the power semiconductor device 100-2 taken along line III-III of FIG. 12, FIG. 14 is a cross-sectional view illustrating the power semiconductor device 100-2 taken along line IV-IV of FIG. 12, and FIG. 15 is a cross-sectional view illustrating the power semiconductor device 100-2 taken along line V-V of FIG. 12.

Referring to FIGS. 11 to 15, the power semiconductor device 100-2 may include at least a semiconductor layer 105, a gate insulating layer 118, and a gate electrode layer 120. For example, the power semiconductor device 100-2 may have a power MOSFET structure.

The semiconductor layer 105 may refer to one or a plurality of layers of semiconductor material, and may refer to, for example, one or a plurality of epitaxial layers. Furthermore, the semiconductor layer 105 may refer to one or a plurality of epitaxial layers on a semiconductor substrate.

For example, the semiconductor layer 105 may be formed of silicon carbide (SiC). Specifically, the semiconductor layer 105 may include at least one epitaxial layer of silicon carbide.

Silicon carbide (SiC) may have a wider bandgap compared to silicon, and thus may maintain stability even at a high temperature. In addition, because a breakdown electric field of the silicon carbide is higher than that of the silicon, the silicon carbide may stably operate even at a high temperature. Accordingly, the power semiconductor device 100-2 using the silicon carbide as the semiconductor layer 105 shows stable operational characteristics due to higher breakdown voltage and excellent heat release compared to silicon.

Specifically, the semiconductor layer 105 may include a drift region 107. The drift region 107 may have a first conductivity type, and may be formed by implanting impurities of the first conductivity type into a part of the semiconductor layer 105. For example, the drift region 107 may be formed by doping the impurities of the first conductivity type in the epitaxial layer of silicon carbide.

The drift region 107 may provide a vertical movement path for electric charges. Furthermore, the drift region 107 may include at least one protruding portion 107a disposed under the gate electrode layer 120. The protruding portion 107a may extend substantially onto a surface of the semiconductor layer 105.

A well region 110 may be formed in the semiconductor layer 105 to be in contact with at least a part of the drift region 107, and may have a second conductivity type. For example, the well region 110 may be formed by doping impurities of the second conductivity type opposite to the first conductivity type in the semiconductor layer 105 or the drift region 107.

For example, the well region 110 may include a first well region 110a formed in the semiconductor layer 105 under the gate electrode layer 120 and in contact with the protruding portion 107a of the drift region 107 and a second well region 110b formed in the semiconductor layer 105 outside the gate electrode layer 120. The first well region 110a and the second well region 110b may be connected to each other. Substantially, a lower part of the protruding portion 107a of the drift region 107 may be defined by the first well region 110a, and specifically, may be in contact with a sidewall of the first well region 110a.

A source region 112 may be formed on or in the well region 110 and may have the first conductivity type. For example, the source region 112 may be formed by doping the semiconductor layer 105 or the well region 110 with impurities of the first conductivity type. The source region 112 may be formed by doping with a higher concentration of the impurities of the first conductivity type than the drift region 107.

For example, the source region 112 may include a first source region 112a formed on or in the first well region 110a and a second source region 112b formed on or in the second well region 110b. The first source region 112a and the second source region 112b may be connected to each other. The first source region 112a may be disposed under the gate electrode layer 120, and the second source region 112b may be disposed outside the gate electrode layer 120.

The second source region 112b may include a source contact region 112b1 connected to a source electrode layer 140 outside the gate electrode layer 120. For example, the source contact region 112b1 may be a part of the second source region 112b and may refer to a part to which the source electrode layer 140 is connected.

An avalanche induction region 115 may be formed to be in contact with the drift region 107 through the second well region 110b, and may be formed to have the second conductivity type. The avalanche induction region 115 may be doped with a higher concentration of the impurities of the second conductivity type than the well region 110. The avalanche induction region 115 may be connected to the source electrode layer 140.

A well contact region 114 may be formed in the second source region 112b, specifically, in the source contact region 112b1. For example, the well contact region 114 may be connected to the second well region 110b through the second source region 112b, and may have the second conductivity type. One or a plurality of well contact regions 114 may be formed in the source contact region 112b1.

The well contact region 114 may be connected to the source electrode layer 140. When connected to the source electrode layer 140, the well contact region 114 may be formed by doping with a higher concentration of the impurities of the second conductivity type than the well region 110 for lowering contact resistance.

In some embodiments, the well contact region 114 and the avalanche induction region 115 may be formed as an integrated structure. In this case, the well contact region 114 refers to a part connecting the second well region 110b and the source electrode layer 140 in the integrated structure. The avalanche induction region 115 may refer to a part connected to the well contact region 114 or the source electrode layer 140 while contacting 107 the drift region in the integrated structure.

A channel region 110c may be formed in the semiconductor layer 105 between the drift region 107 and the source region 112. For example, the channel region 110c may be formed in the semiconductor layer 105 between the protruding portion 107a of the drift region 107 and the first source region 112a.

For example, the channel region 110c may have the second conductivity type such that an inversion channel is formed. Because the channel region 110c has the doping type opposite to the source region 112 and the drift region 107, the channel region 110c, the source region 112, and the drift region 107 may form a diode junction. Accordingly, the channel region 110c may not allow movement of charges in a normal situation, but when an operation voltage is applied to the gate electrode layer 120, an inversion channel may be formed therein to allow the movement of charges.

For example, the channel region 110c may be a part of the well region 110. In detail, the channel region 110c may be a part of the well region 110 adjacent to the lower part of the gate electrode layer 120. In this case, the channel region 110c may be formed to be integrally or continuously connected to the well region 110a. A doping concentration of the impurities of the second conductivity type in the channel region 110c may be the same as those of other portions of the well region 110 or may be different therefrom for adjusting a threshold voltage.

In some embodiments, the protruding portion 107a of the drift region 107, the first well region 110a, the channel region 110c, and/or the first source region 112a may extend in one direction. Here, a direction of the line IV-IV of FIG. 12 may be the one direction. The direction of extension of the channel region 110c does not mean the direction of movement of electric charges.

In some embodiments, the first well region 110a, the channel region 110c, and the first source region 112a may be symmetrically formed with respect to the protruding portion 107a of the drift region 107. For example, the first well region 110a, the channel region 110c, and the first source region 112a may be formed on the semiconductor layer 105 on opposite sides of the protruding portion 107a of the drift region 107, respectively.

In some embodiments, the drift region 107 may include a plurality of protruding portions 107a formed parallel to each other in one direction. For example, the first well region 110a may be formed in a stripe pattern extending in the one direction, and the protruding portions 107a may also be formed in a stripe pattern. In addition, the first source region 112a may be formed in a stripe pattern on the first well region 110a. The channel region 110c may be formed between the protruding portions 107a of the drift region 107 and the first source region 112a.

In some embodiments, the first well regions 110a may be formed symmetrically with respect to the second well region 110b, and the first source regions 112a may be formed symmetrically with respect to the second source region 112b. In this case, the protruding portions 107a of the drift region 107 may include a plurality of protruding portions 107a formed symmetrically with respect to the second well region 110b or the second source region 112b.

Further, the first well region 110a and the second well region 110b may be formed repeatedly and alternately in one direction. In this case, the first source region 112a and the second source region 112b may also be repeatedly formed.

Additionally, a drain region 102 may be formed in the semiconductor layer 105 under the drift region 107 and may have the first conductivity type. For example, the drain region 102 may be doped with impurities having a higher concentration than the drift region 107.

In some embodiments, the drain region 102 may be provided as a substrate of silicon carbide having the first conductivity type. In this case, the drain region 102 may be understood as a part of the semiconductor layer 105 or a separate substrate from the semiconductor layer 105.

The gate insulating layer 118 may be formed on at least a part of the semiconductor layer 105. For example, the gate insulating layer 118 may be formed on at least the channel region 110c. Specifically, the gate insulating layer 118 may be formed on the first source region 112a, the channel region 110c, and the protruding portion 107a of the drift region 107.

For example, the gate insulating layer 118 may include an insulating material such as silicon oxide, silicon carbide oxide, silicon nitride, hafnium oxide, zirconium oxide, aluminum oxide, or a stacked structure thereof.

At least one gate electrode layer 120 may be formed on the gate insulating layer 118. For example, the gate electrode layer 120 may be formed on at least the channel region 110c. Specifically, the gate electrode layer 120 may be formed on the first source region 112a, the channel region 110c, and the protruding portion 107a of the drift region 107. Further, the second well region 110b, the second source region 112b, and the well contact region 114 may be disposed outside the gate electrode layer 120 and may be exposed from the gate electrode layer 120.

For example, the gate electrode layer 120 may include a suitable conductive material, such as polysilicon, metal, metal nitride, metal silicide, or the like, or may include a stacked structure thereof.

An interlayer insulating layer 130 may be formed on the gate electrode layer 120. For example, the interlayer insulating layer 130 may include a suitable insulating material, such as an oxide layer, a nitride layer, or a stacked structure thereof.

The source electrode layer 140 may be formed on the interlayer insulating layer 130 and may be connected to the source region 112, specifically, the second source region 112b or the source contact region 112b1. Furthermore, the source electrode layer 140 may be commonly connected to the second source region 112b, the well contact region 114, and the avalanche induction region 115. For example, the source electrode layer 140 may be formed of an appropriate conductive material, metal, or the like.

In the power semiconductor device 100-2 described above, the first conductivity type and the second conductivity type may have opposite conductivity types, but may be any one of n-type and p-type, respectively. For example, when the first conductivity type is n-type, the second conductivity type is p-type, and vice versa.

Specifically, when the power semiconductor device 100-2 is an N-type MOSFET, the drift region 107 may be an N− region, the source region 112 and the drain region 102 may be N+ regions, the well region 110 and the channel region 110c may be P− regions, and the well contact region 114 and the avalanche induction region 115 may be P+ regions.

During the operation of the power semiconductor device 100-2, current may generally flow in a vertical direction from the drain region 102 along the protruding portions 107*a* of the drift region 107, and then may flow through the channel region 110*c* to the source region 112.

In the power semiconductor device 100-2, the source contact region 112*b*1, the well contact region 114, and the avalanche induction region 115 may be separately disposed outside the gate electrode layer 120. Accordingly, the first well region 110*a* and the first source region 112*a* may be formed such that the protruding portions 107*a* of the drift region 107 are densely disposed, and thus the channel region 110*c* may be densely formed under the gate electrode layer 120. Accordingly, the power semiconductor device 100-2 may have a high degree of integration.

In the power semiconductor device 100-2, the avalanche induction region 115 has an avalanche breakdown when a latch occurs in the power semiconductor device 100-2. It may be induced to occur through the second well region 110*b* without being generated in the first well region 110*a*. The edge portion of the first well region 110*a* is a weak portion due to the concentration of an electric field. When an avalanche breakdown occurs through the edge portion, a problem of abnormally increasing current occurs.

Figure 24:
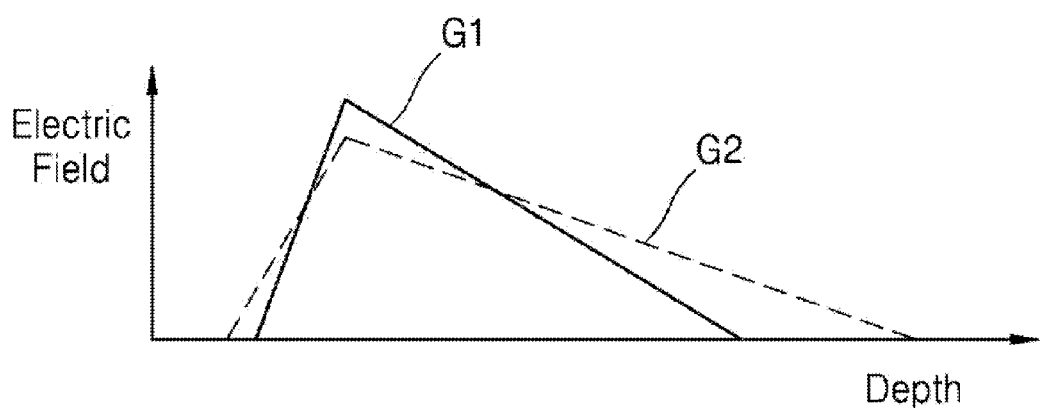
FIG. 24 is a graph showing an electric field depending on a junction structure in a power semiconductor device according to embodiments of the present disclosure.

As shown in FIG. 24, it may be seen than a higher electric filed is applied in a junction structure G1 of the avalanche induction region 115 and the drift region 107 than in a junction structure G2 of the first well region 110*a* and the drift region 107. Accordingly, before avalanche breakdown occurs through the first well region 110*a*, the avalanche breakdown may be induced to the second well region 110*b* through the avalanche induction region 115. This avalanche current may flow to the ground through the source electrode layer 140.

Accordingly, it is possible to suppress the occurrence of avalanche breakdown in the first well region 110*a*, thereby suppressing the occurrence of the latch. Accordingly, operational reliability of the power semiconductor device 100-2 may be increased.

FIGS. 16 to 20 are cross-sectional views illustrating power semiconductor devices 100*a*-2, 100*b*-2, 100*c*-2, 100*d*-2, and 100*e*-2 according to other embodiments of the present disclosure. The power semiconductor devices 100*a*-2, 100*b*-2, 100*c*-2, 100*d*-2, and 100*e*-2 are partially modified or added to the power semiconductor device 100-2 of FIGS. 11 to 15, and thus the embodiments may refer to each other, and redundant descriptions are omitted.

Figure 16:
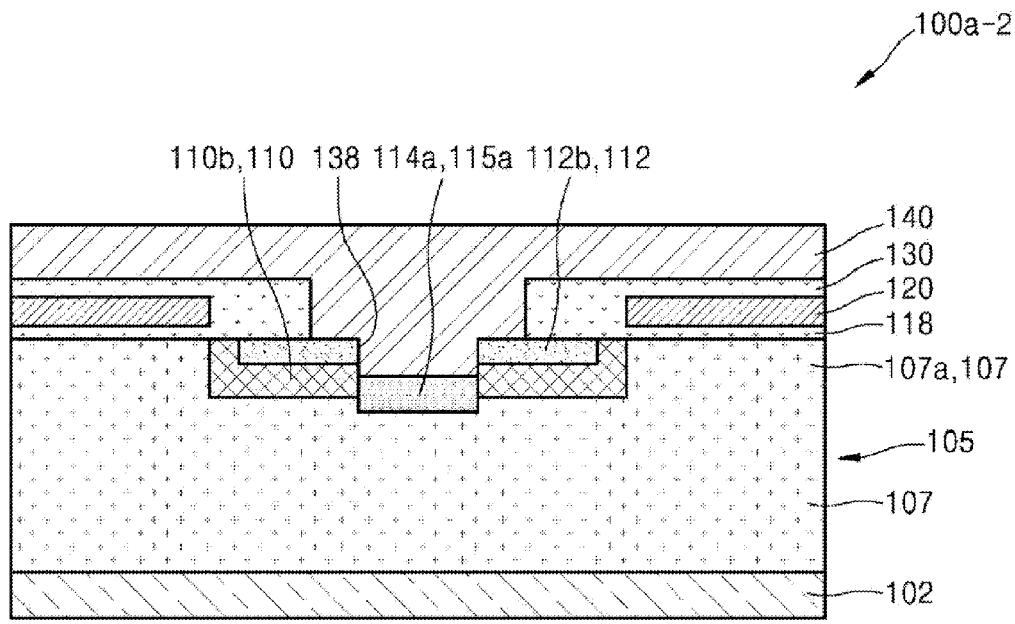
FIGS. 16 to 20 are cross-sectional views illustrating power semiconductor devices according to other embodiments of the present disclosure.

Referring to FIG. 16, the power semiconductor device 100*a*-2 may include at least one groove 138 penetrating the second source region 112*b* and exposing the second well region 110*b*. The groove 138 may be formed to expose a surface of the second well region 110*b* or to be recessed to make the second well region 110*b* have a certain depth.

A well contact region 114*a* may be formed under the groove 138 to be in contact with the second well region 110*b*. For example, a sidewall of the well contact region 114*a* may be in contact with the second well region 110*b*. The avalanche induction region 115*a* may be formed to be in contact with the drift region 107 under the groove 138.

For example, the well contact region 114*a* and the avalanche induction region 115*a* may be formed by doping with a high concentration of impurities of the second conductivity type from the second well region 110*b* exposed by the groove 138 to a certain depth of the drift region 107. The avalanche induction region 115*a* may be formed to be recessed into the drift region 107 by a certain depth.

The source electrode layer 140 may be formed to fill the groove 138, and thus may be connected to the well contact region 114*a*, the avalanche induction region 115*a*, the second well region 110*b*, and/or the second source region 112*b*.

For example, the avalanche induction region 115*a* and the well contact region 114*a* may be formed in an integrated structure to be in contact with the drift region 107, the second well region 110*b*, and the source electrode layer 140.

In some embodiments, the well contact region 114*a* may be entirely formed on a surface of the second well region 110*b* exposed by the groove 138. Accordingly, the well contact region 114*a* may be formed on the second well region 110*b* exposed from bottom and sidewalls of the groove 138. The structure of the well contact region 114*a* may further reduce contact resistance between the source electrode layer 140 and the second well region 110*b*.

Figure 17:
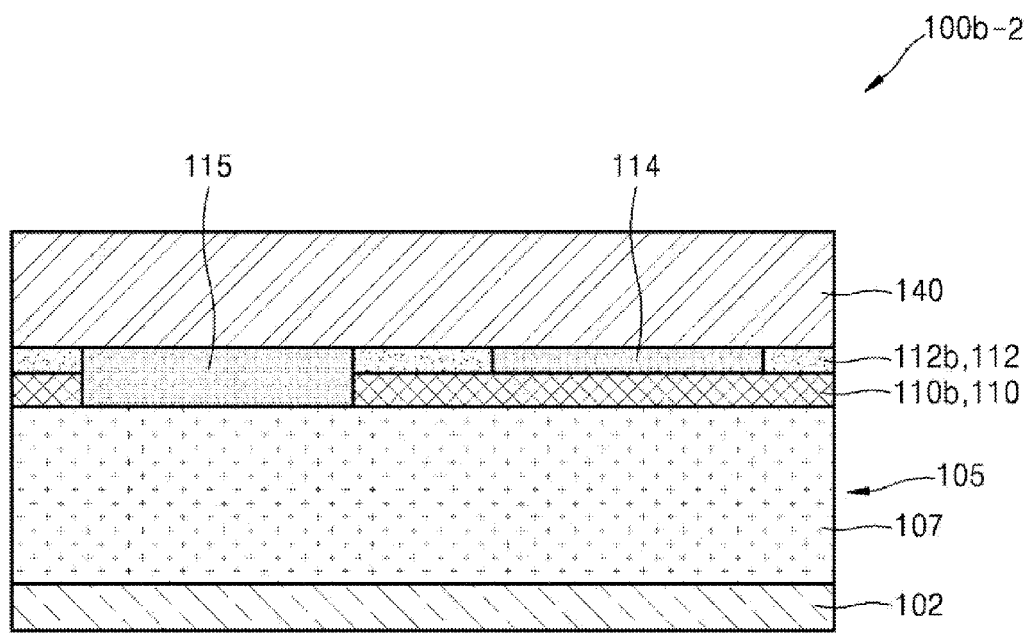

Referring to FIG. 17, the power semiconductor device 100*b*-2 may represent a modified example of the structure of FIG. 15. In the power semiconductor device 100*b*-2, the avalanche induction region 115 and the well contact region 114 may be formed to be separated from each other.

For example, the well contact region 114 may be formed to pass through the second source region 112*b* and connect to the second well region 110*b*. The avalanche induction region 115 may be formed to pass through the second source region 112*b* and the second well region 110*b* and be in contact with the drift region 107. The avalanche induction region 115 and the well contact region 114 may be commonly connected to the source electrode layer 140.

Figure 18:
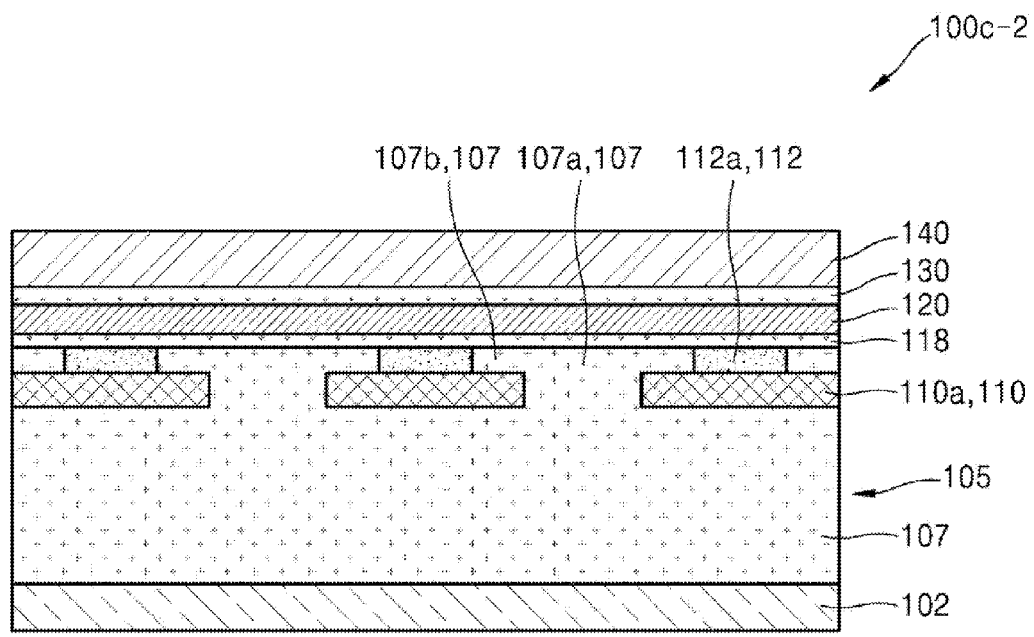

Referring to FIG. 18, in the power semiconductor device 100*c*-2, a channel region 107*b* may be formed in the semiconductor layer 105 between the drift region 107 and the source region 112. For example, the channel region 107*b* may be formed in the semiconductor layer 105 between the protruding portion 107*a* of the drift region 107 and the first source region 112*a*. The channel region 107*b* may have the first conductivity type such that an accumulation channel is formed.

For example, the channel region 107*b* may have the same doping type as the source region 112 and the drift region 107. In this case, the source region 112, the channel region 107*b*, and the drift region 107 may have a structure that is normally electrically connected. However, in the structure of the semiconductor layer 105 of silicon carbide, a band of the channel region 107*b* is bent upward due to influence of negative charges generated when carbon clusters are formed in the gate insulating layer 118, thereby causing a potential barrier. Accordingly, when an operation voltage is applied to the gate electrode layer 120, the accumulation channel that allows the flow of electric charges or current may be formed in the channel region 107*b*.

Therefore, a threshold voltage to be applied to the gate electrode layer 120 to form the accumulation channel in the channel region 107*b* may be significantly lower than a threshold voltage to be applied to the gate electrode layer 120 to form a conventional inversion channel.

In some embodiments, the channel region 107*b* may be a part of the drift region 107. Specifically, the channel region 107*b* may be a part of the protruding portion 107*a* of the drift region 107. For example, the channel region 107*b* may be integrally formed with the drift region 107.

The drift region 107 may be connected to the source region 112 through the channel region 107*b*. Specifically, in the channel region 107*b*, the protruding portion 107*a* of the drift region 107 and the first source region 112*a* may be in contact with each other.

For example, the doping concentration of the impurities of the first conductivity type in the channel region 107*b* may be the same as other parts of the drift region 107 or may be different therefrom for adjusting the threshold voltage.

In some embodiments, the first well region 110a may be formed under the first source region 112a to further protrude toward the protruding portion 107a of the drift region 107 than the first source region 112a. The channel region 107b may be formed in the semiconductor layer 105 on the protruding portion of the first well region 110a. For example, the protruding portion 107a of the drift region 107 may be further extended to a groove portion between the first well region 110a and the gate electrode layer 120, and the channel region 107b may be formed thereon. This structure may allow the channel region 107b to be defined between the gate electrode layer 120 and the well region 110.

In some embodiments, the first well region 110a and the first source region 112a may have the same width. In this case, the first source region 112a may be in contact with the protruding portion 107a of the drift region 107, and the channel region 107b may be defined at a part in contact with the protruding portion 107a.

Figure 19:
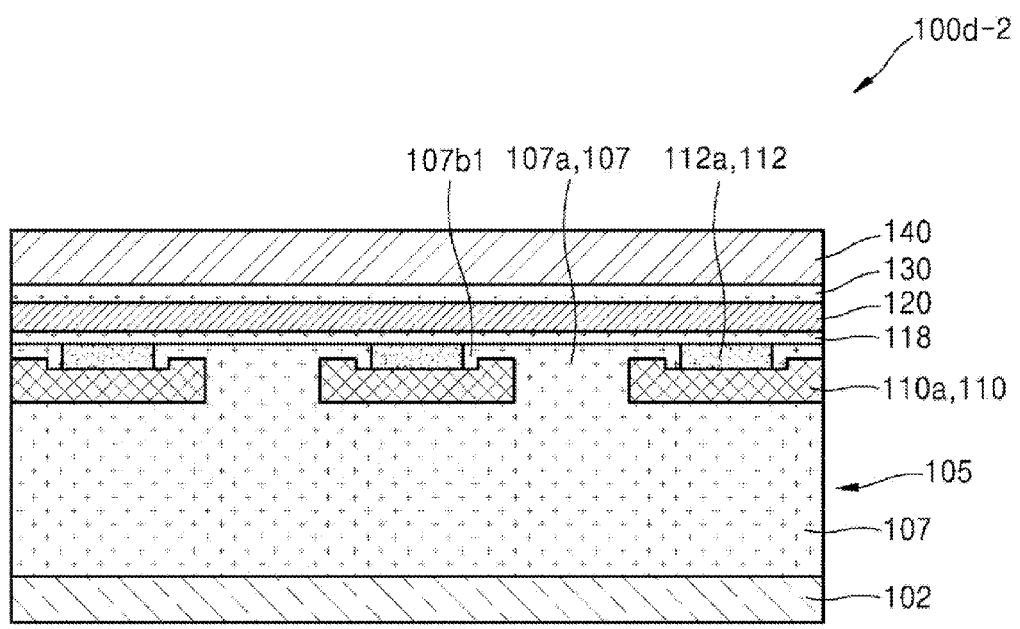

Referring to FIG. 19, in the power semiconductor device 100d-2, the first well region 110a may further protrude from the first source region 112a toward the protruding portion 107a of the drift region 107, and may include a tab portion extending toward the gate electrode layer 120 at an end thereof.

A channel region 107b1 may be formed in the semiconductor layer 105 on the protruding portion of the first well region 110a. For example, the channel region 107b1 may be formed in a bent shape on the protruding portion and the tab portion of the first well region 110a. This structure may allow the channel region 107b1 to be more limited between the gate electrode layer 120 and the first well region 110a.

Figure 20:
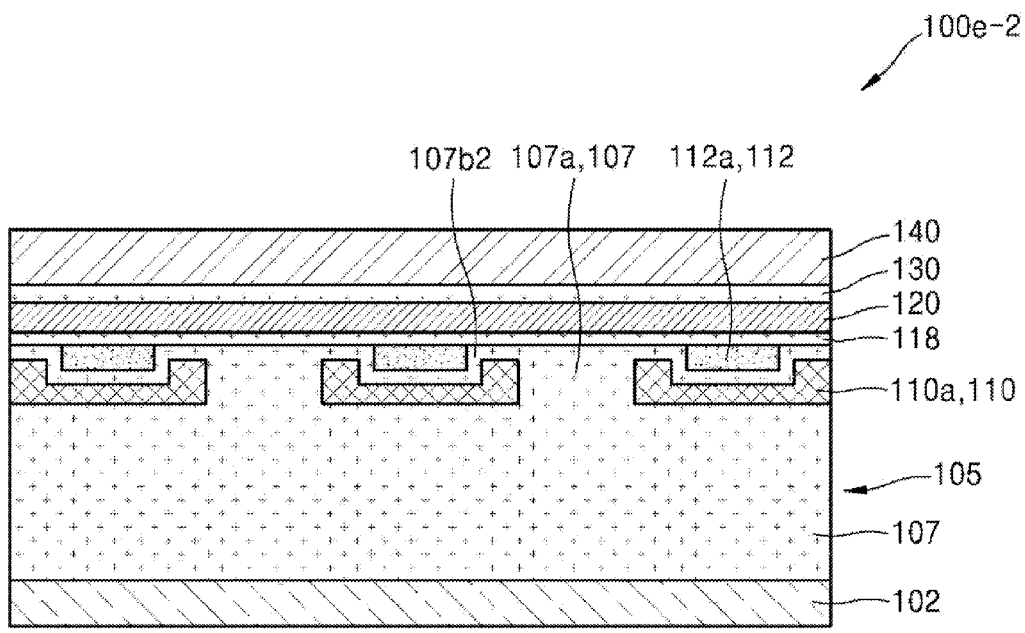

Referring to FIG. 20, in the power semiconductor device 100e-2, the first well region 110a may further protrude from the first source region 112a toward the protruding portion 107a of the drift region 107, and may include a tab portion extending toward the gate electrode layer 120 at an end thereof. Furthermore, the protruding portion 107a of the drift region 107 may further extend between a lower part of the first source region 112a and the first well region 110a.

A channel region 107b2 may be formed to extend further into the semiconductor layer 105 between the lower part of the first source region 112a and the first well region 110a. For example, the channel region 107b2 may be formed in a bent shape from an upper part of the tab portion of the first well region 110a to the lower part of the first source region 112a. This structure may contribute to widening the contact area between the channel region 107b2 and the first source region 112a.

Figure 21:
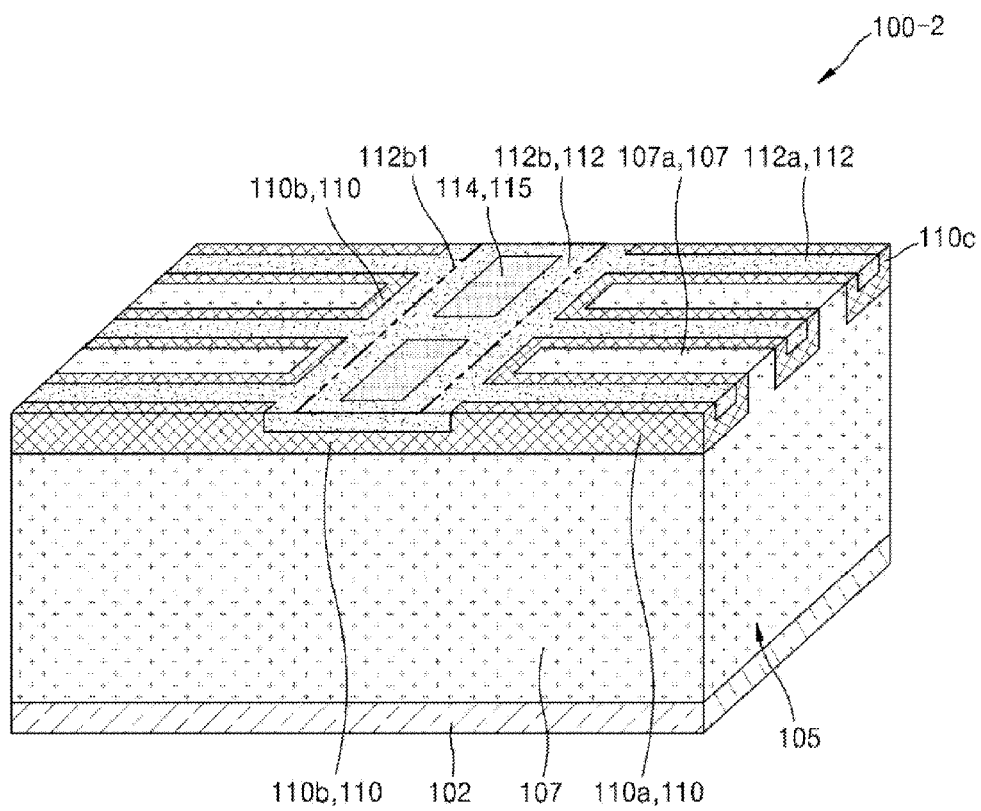
FIGS. 21 to 23 are schematic perspective views illustrating a method of fabricating a power semiconductor device according to an embodiment of the present disclosure.
Figure 22:
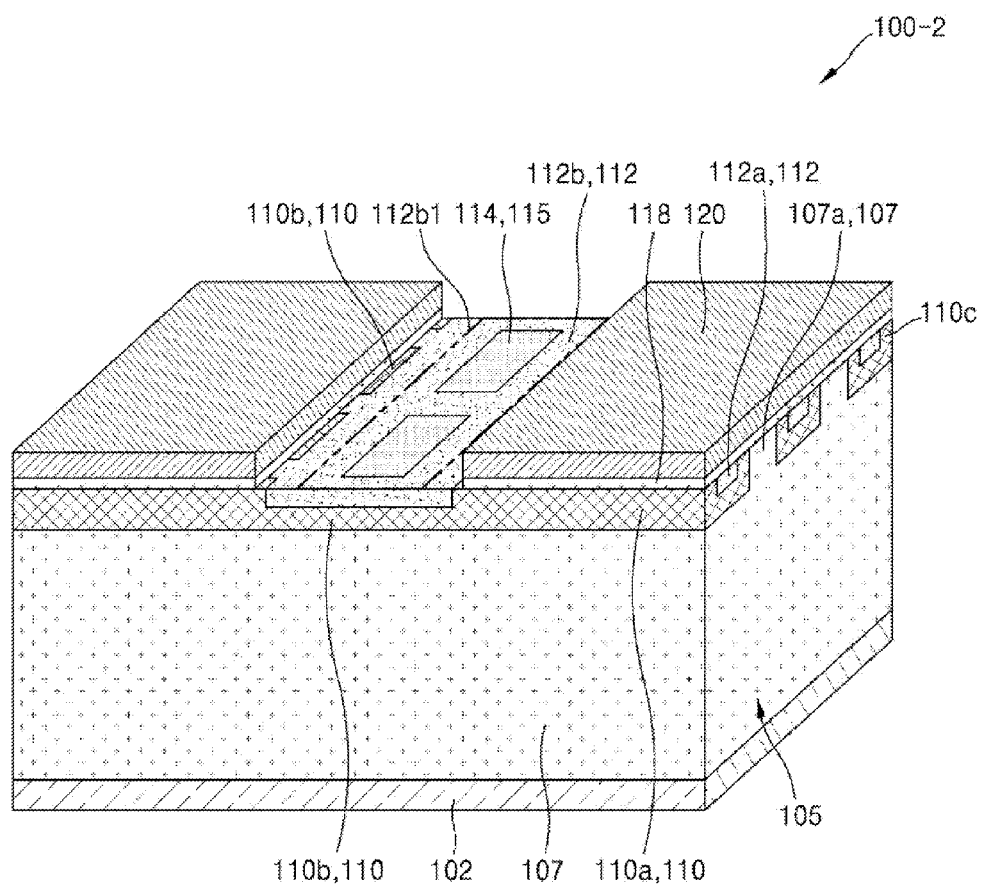
Figure 23:
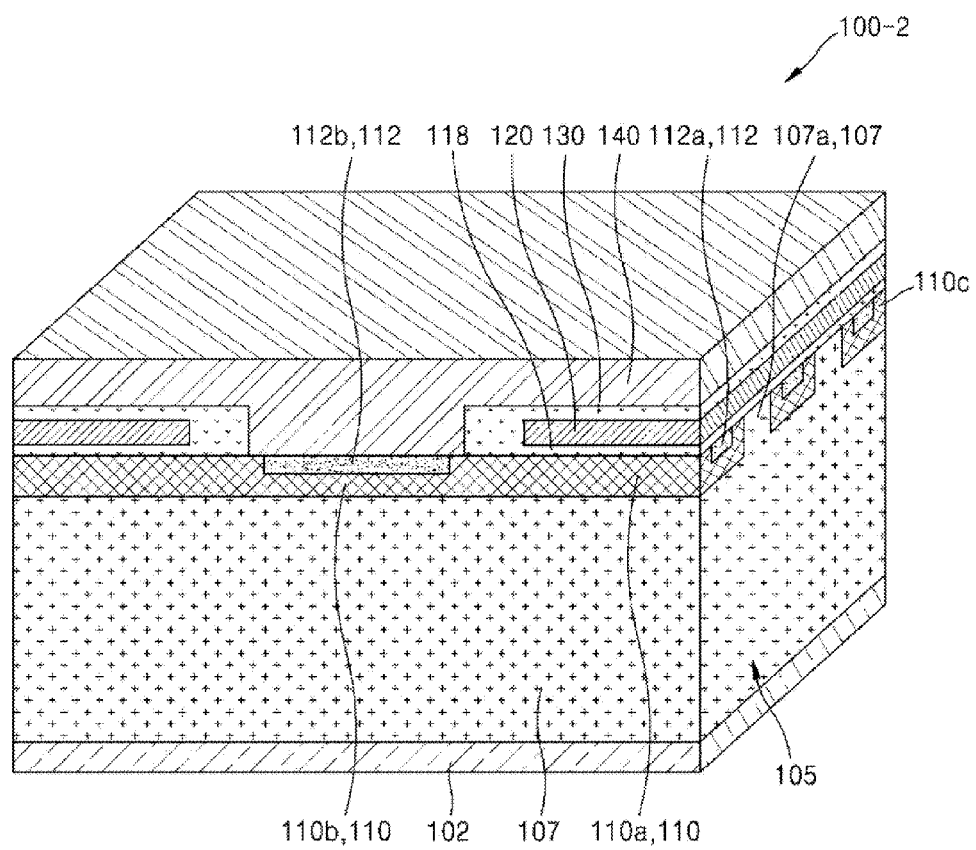

FIGS. 21 to 23 are schematic perspective views illustrating a method of fabricating the power semiconductor device 100-2 according to an embodiment of the present disclosure.

Referring to FIG. 21, the drift region 107 having the first conductivity type may be formed in the semiconductor layer 105 of silicon carbide (SiC) to provide a vertical movement path of charges. For example, the drift region 107 may be formed on the drain region 102 having the first conductivity type. In some embodiments, the drain region 102 may be provided as a substrate of the first conductivity type, and the drift region 107 may be formed as one or the plurality of epitaxial layers on the substrate.

Subsequently, the well region 110 having the second conductivity type may be formed in the semiconductor layer 105 to be in contact with the at least a part of the drift region 107. In detail, the well region 110 may be formed on the semiconductor layer 105 in contact with the protruding portion 107a to define at least one protruding portion 107a of the drift region 107. Specifically, the well region 110 may be formed by doping the drift region 107 or the semiconductor layer 105 with impurities of conductivity type opposite to the drift region 107, for example, impurities of the second conductivity type.

The well region 110 may be divided into the first well region 110a under the gate electrode layer 120 and the second well region 110b outside the gate electrode layer 120. For example, the first well region 110a may define the protruding portion 107a of the drift region 107, and the well contact region 114 may be formed in the second well region 110b later. The first well region 110a and the second well region 110b may be connected to each other.

Further, a source region 112 having the first conductivity type may be formed on or in the well region 110. For example, the forming of the source region 112 may be performed by implanting impurities of the first conductivity type into the well region 110 or into the semiconductor layer 105.

For example, the forming of the source region 112 may include forming the first source region 112a on or in the first well region 110a and forming the second source region 112b on the second well region 110b or in the second well region 110b. A part of the second source region 112b may be allocated as the source contact region 112b1 to be connected to the source electrode layer 140. The first source region 112a and the second source region 112b may be connected to each other. The source region 112 may be formed substantially from a surface of the semiconductor layer 105 into the well region 110 or above the well region 110, with a certain depth.

In addition to the formation of the source region 112, the channel region 110c having the second conductivity type may be formed to form the inversion channel in the semiconductor layer 105 between the source region 112 and the drift region 107. For example, the channel region 110c may be formed in the semiconductor layer 105 between the protruding portion 107a of the drift region 107 and the first source region 112a. For example, the channel region 110c that is a part of the first well region 110a may not be separately formed but may be formed together with the first well region 110a.

Further, the avalanche induction region 115 may be formed by doping the impurities of the second conductivity type with a higher concentration than the well region 110 to be in contact with the drift region 107 through the second well region 110b.

In addition, the well contact region 114 connected to the second well region 110b may be formed in the second source region 112b through the second source region 112b. For example, the well contact region 114 may be formed by implanting impurities of the second conductivity type into a part of the second well region 110b at a higher concentration than the well region 110.

In a modified example of this embodiment, an impurity doping order of the well region 110, the source region 112, the channel region 110c, the well contact region 114, and the avalanche induction region 115 may be appropriately changed.

In the above-described fabricating method, impurity implantation or impurity doping may be performed such that the impurities are mixed when the impurities are implanted into the semiconductor layer 105 or the epitaxial layer is formed. However, for implantation of the impurities in the selective region, an ion implantation method using a mask pattern may be used.

Optionally, after ion implantation, a heat treatment for activating or diffusing the impurities may be followed.

Referring to FIG. 21, the gate insulating layer 118 may be formed on at least a part of the semiconductor layer 105. For example, the gate insulating layer 118 may be formed on at least the channel region 110c and the protruding portion 107a of the drift region 107.

For example, the gate insulating layer 118 may be formed by oxidizing the semiconductor layer 105 to form an oxide, or by depositing an insulating material such as oxide or nitride on the semiconductor layer 105.

Subsequently, the gate electrode layers 120 may be formed on the gate insulating layer 118. For example, the gate electrode layers 120 may be formed by forming a conductive layer on the gate insulating layer 118 and then patterning the conductive layer. The gate electrode layer 120 may be formed by doping polysilicon with impurities, or may be formed to include a conductive metal or metal silicide.

The patterning process may be performed using photo lithography and etching processes. The photolithography process may include a process which forms a photoresist pattern as a mask layer using a photo process and a development process. The etching process may include a process which selectively etches an underlying structure using the photoresist pattern.

Referring to FIG. 22, the interlayer insulating layer 130 may be formed on the gate electrode layers 120. Optionally, when the interlayer insulating layer 130 is entirely formed on the underlying structure, a process which forms a contact hole pattern for exposing the source contact region 113 and the well contact region 114 may be followed.

Subsequently, the source electrode layer 140 may be formed on the semiconductor layer 105 to be connected to the second source region 112b, the well contact region 114, and the avalanche induction region 115. For example, the source electrode layer 140 may be formed by forming a conductive layer, such as a metal layer, on the interlayer insulating layer 130 and then patterning or planarizing the conductive layer.

Meanwhile, the power semiconductor device 100a-2 of FIG. 16 may be fabricated by adding or modifying some processes to the fabricating process of the power semiconductor device 100-2 described above.

The fabricating of the power semiconductor device 100a-2 of FIG. 16 may further include forming at least one groove 138 through the second source region 112b and exposing the second well region 110b in the second source region 112b, forming the well contact region 114a in contact with the second well region 110b and the avalanche induction region 115a in contact with the drift region 107 under the groove 138, and filling the groove 138 to form the source electrode layer 140 to be connected to the source region 112, the well contact region 114, and the avalanche induction region 115a.

Meanwhile, when the power semiconductor devices 100c-2, 100d-2, and 100e-2 of FIGS. 18 to 20 are fabricated, the channel regions 107b, 107b1, and 107b2 may have the first conductive type to form the accumulation channel. For example, the channel regions 107b, 107b1, and 107b2 may be formed as a part of the drift region 107.

According to the above-described fabricating method, it is possible to economically fabricate the highly integrated power semiconductor device 100-2 by using a process used in an existing silicon substrate, using the semiconductor layer 105 of silicon carbide.

Figure 25:
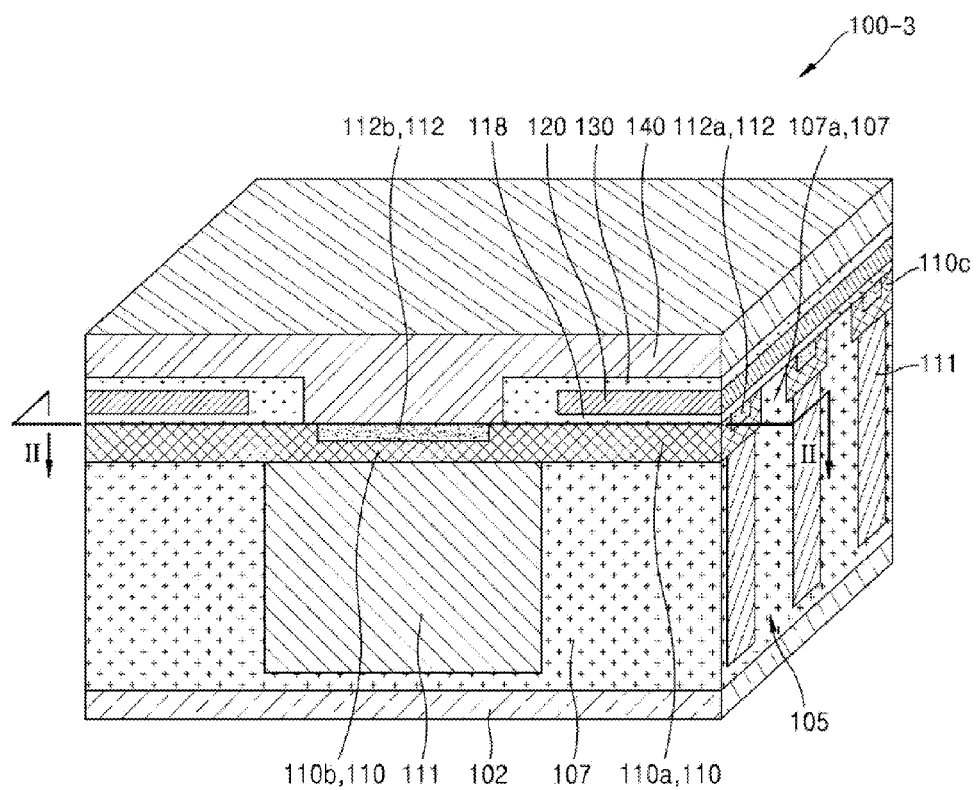
FIG. 25 is a schematic perspective view illustrating a power semiconductor device according to an embodiment of the present disclosure.
Figure 26:
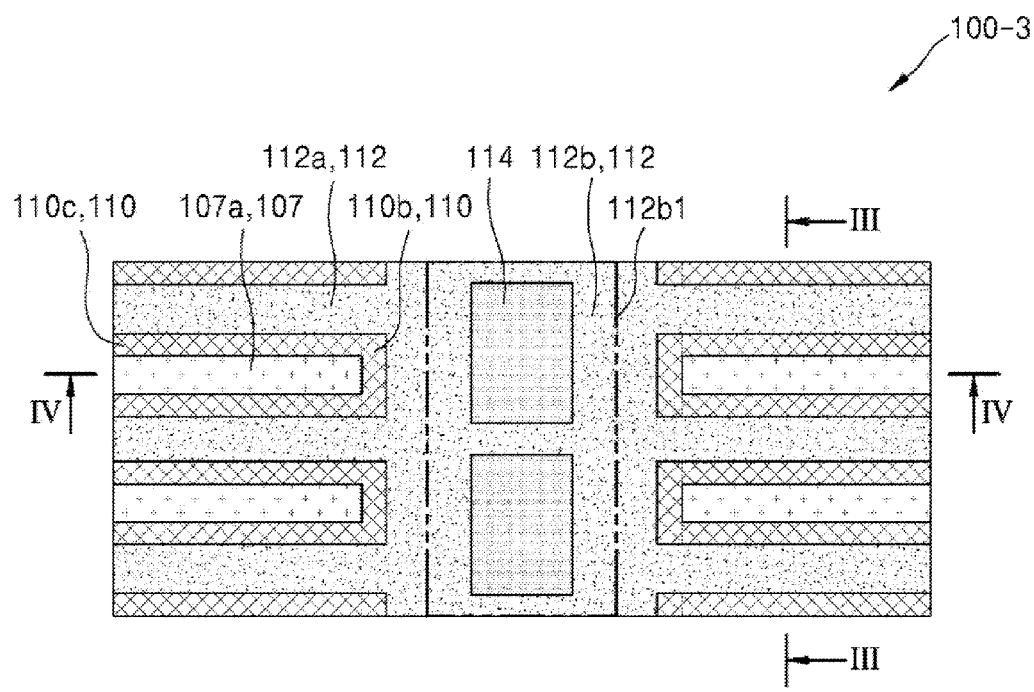
FIG. 26 is a plan view illustrating the power semiconductor device taken along line II-II of FIG. 25.
Figure 27:
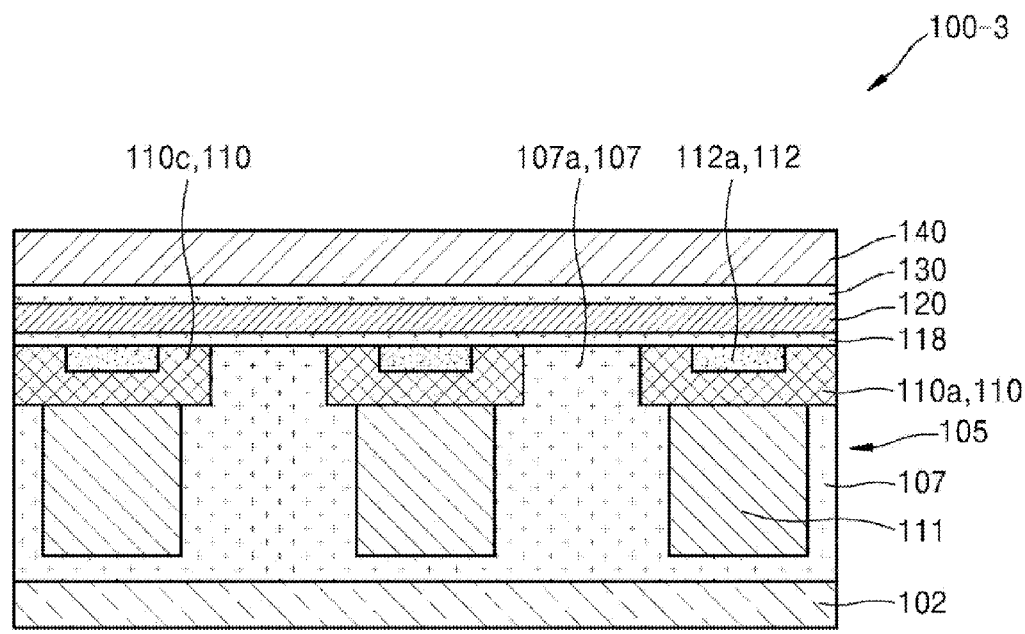
FIG. 27 is a cross-sectional view illustrating the power semiconductor device taken along line III-III of FIG. 26.
Figure 28:
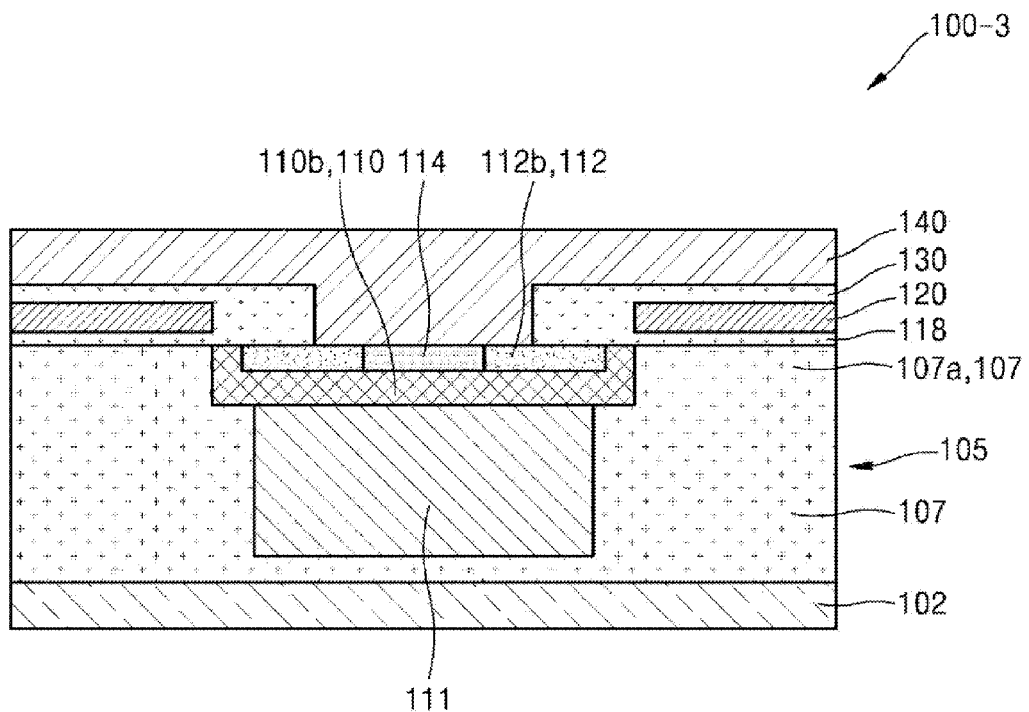
FIG. 28 is a cross-sectional view illustrating the power semiconductor device taken along line IV-IV of FIG. 26.

FIG. 25 is a schematic perspective view illustrating a power semiconductor device 100-3 according to an embodiment of the present disclosure, FIG. 26 is a plan view illustrating the power semiconductor device 100-3 taken along line II-II of FIG. 25, FIG. 27 is a cross-sectional view illustrating the power semiconductor device 100-3 taken along line III-III of FIG. 26, and FIG. 28 is a cross-sectional view illustrating the power semiconductor device 100-3 taken along line IV-IV of FIG. 26.

Referring to FIGS. 25 to 28, the power semiconductor device 100-3 may include at least a semiconductor layer 105, a gate insulating layer 118, and a gate electrode layer 120. For example, the power semiconductor device 100-3 may have a power MOSFET structure.

The semiconductor layer 105 may refer to one or a plurality of layers of semiconductor material, and may refer to, for example, one or a plurality of epitaxial layers.

Furthermore, the semiconductor layer 105 may refer to one or a plurality of epitaxial layers on a semiconductor substrate.

For example, the semiconductor layer 105 may be formed of silicon carbide (SiC). Specifically, the semiconductor layer 105 may include at least one epitaxial layer of silicon carbide.

Silicon carbide (SiC) may have a wider bandgap compared to silicon, and thus may maintain stability even at a high temperature. In addition, because a breakdown electric field of the silicon carbide is higher than that of the silicon, the silicon carbide may stably operate even at a high temperature. Accordingly, the power semiconductor device 100-3 using the silicon carbide as the semiconductor layer 105 shows stable operational characteristics due to higher breakdown voltage and excellent heat release compared to silicon.

Specifically, the semiconductor layer 105 may include a drift region 107. The drift region 107 may have a first conductivity type, and may be formed by implanting impurities of the first conductivity type into a part of the semiconductor layer 105. For example, the drift region 107 may be formed by doping the impurities of the first conductivity type in the epitaxial layer of silicon carbide.

The drift region 107 may provide a vertical movement path for electric charges. Furthermore, the drift region 107 may include at least one protruding portion 107a disposed under the gate electrode layer 120. The protruding portion 107a may extend substantially onto a surface of the semiconductor layer 105.

A well region 110 may be formed in the semiconductor layer 105 to be in contact with at least a part of the drift region 107, and may have a second conductivity type. For example, the well region 110 may be formed by doping impurities of the second conductivity type opposite to the first conductivity type in the semiconductor layer 105 or the drift region 107.

For example, the well region 110 may include a first well region 110a formed in the semiconductor layer 105 under the gate electrode layer 120 and in contact with the protruding portion 107a of the drift region 107 and a second well region 110b formed in the semiconductor layer 105 outside the gate electrode layer 120. The first well region 110a and the second well region 110b may be connected to each other. Substantially, a lower part of the protruding portion 107a of the drift region 107 may be defined by the first well region 110a, and specifically, may be in contact with a sidewall of the first well region 110a.

A pillar region 111 may be formed in the semiconductor layer 105 having a conductivity type different from that of the drift region 107 to form a super junction with the drift region 107. For example, the pillar region 111 may have the second conductivity type and may be formed in the semiconductor layer 105 under the well region 110 to be in contact with the well region 110. The pillar region 111 may also be referred to as a deep well region.

For example, the pillar region 111 may be formed to be in contact with or surround a sidewall of the drift region 107. As another example, a plurality of pillar regions 111 may be provided, and the pillar regions 111 and the drift region 107 may be alternately formed and may be in contact with each other.

In some embodiments, the pillar region 111 may have a width narrower than that of the well region 110 to expose at least a part of a bottom surface of the well region 110 and may be shortened inward from an end of the well region 110 to be formed under the well region 110. Accordingly, the well region 110 may be formed to protrude further toward the protruding portion 107a of the drift region 107 than the pillar region 111.

A source region 112 may be formed on or in the well region 110 and may have the first conductivity type. For example, the source region 112 may be formed by doping the semiconductor layer 105 or the well region 110 with impurities of the first conductivity type. The source region 112 may be formed by doping with a higher concentration of the impurities of the first conductivity type than the drift region 107.

For example, the source region 112 may include a first source region 112a formed on the first well region 110a and a second source region 112b formed on the second well region 110b. The first source region 112a and the second source region 112b may be connected to each other. The first source region 112a may be disposed under the gate electrode layer 120, and the second source region 112b may be disposed outside the gate electrode layer 120.

The second source region 112b may include a source contact region 112b1 connected to a source electrode layer 140 outside the gate electrode layer 120. For example, the source contact region 112b1 may be a part of the second source region 112b and may refer to a part to which the source electrode layer 140 is connected.

A well contact region 114 may be formed in the second source region 112b, specifically, in the source contact region 112b1. For example, the well contact region 114 may be extended from the second well region 110b through the second source region 112b, and may have the second conductivity type. One or a plurality of well contact regions 114 may be formed in the source contact region 112b1.

The well contact region 114 may be connected to the source electrode layer 140. When connected to the source electrode layer 140, the well contact region 114 may be formed by doping with a higher concentration of the impurities of the second conductivity type than the well region 110 for lowering contact resistance.

A channel region 110c may be formed in the semiconductor layer 105 between the drift region 107 and the source region 112. For example, the channel region 110c may be formed in the semiconductor layer 105 between the protruding portion 107a of the drift region 107 and the first source region 112a.

For example, the channel region 110c may have the second conductivity type such that an inversion channel is formed. Because the channel region 110c has the doping type opposite to the source region 112 and the drift region 107, the channel region 110c, the source region 112, and the drift region 107 may form a diode junction. Accordingly, the channel region 110c may not allow movement of charges in a normal situation, but when an operation voltage is applied to the gate electrode layer 120, the inversion channel may be formed therein to allow the movement of charges.

For example, the channel region 110c may be a part of the well region 110. In detail, the channel region 110c may be a part of the well region 110 adjacent to the lower part of the gate electrode layer 120. In this case, the channel region 110c may be formed to be integrally or continuously connected to the well region 110a. A doping concentration of the impurities of the second conductivity type in the channel region 110c may be the same as those of other portions of the well region 110 or may be different therefrom for adjusting a threshold voltage.

In some embodiments, the protruding portion 107a of the drift region 107, the first well region 110a, the channel region 110c, and/or the first source region 112a may extend in one direction. Here, a direction of the line IV-IV of FIG. 26 may be the one direction. Here, the direction of extension of the channel region 110c does not mean the direction of movement of electric charges.

In some embodiments, the first well region 110a, the channel region 110c, and the first source region 112a may be symmetrically formed with respect to the protruding portion 107a of the drift region 107. For example, the first well region 110a, the channel region 110c, and the first source region 112a may be formed on the semiconductor layers 105 on opposite sides of the protruding portion 107a of the drift region 107, respectively. Further, the pillar region 111 may also be formed under the first well region 110a on opposite sides of the protruding portion 107a of the drift region 107.

In some embodiments, the drift region 107 may include a plurality of protruding portions 107a formed parallel to each other in one direction. For example, the first well region 110a may be formed in a stripe pattern extending in the one direction, and the protruding portions 107a may also be formed in a stripe pattern. In addition, the first source region 112a may be formed in a stripe pattern on the first well region 110a. The channel region 110c may be formed between the protruding portions 107a of the drift region 107 and the first source region 112a.

In some embodiments, the first well regions 110a may be formed symmetrically with respect to the second well region 110b, and the first source regions 112a may be formed symmetrically with respect to the second source region 112b. In this case, the protruding portions 107a of the drift region 107 may include a plurality of protruding portions 107a formed symmetrically with respect to the second well region 110b or the second source region 112b.

Further, the first well region 110a and the second well region 110b may be formed repeatedly and alternately in one direction. In this case, the first source region 112a and the second source region 112b may also be repeatedly formed.

Additionally, a drain region 102 may be formed in the semiconductor layer 105 under the drift region 107 and may have the first conductivity type. For example, the drain region 102 may be doped with a higher concentration than the drift region 107.

In some embodiments, the drain region 102 may be provided as a substrate of silicon carbide having the first conductivity type. In this case, the drain region 102 may be understood as a part of the semiconductor layer 105 or a separate substrate from the semiconductor layer 105.

The gate insulating layer 118 may be formed on at least a part of the semiconductor layer 105. For example, the gate insulating layer 118 may be formed on at least the channel region 110c. Specifically, the gate insulating layer 118 may be formed on the first source region 112a, the channel region 110c, and the protruding portion 107a of the drift region 107.

For example, the gate insulating layer 118 may include an insulating material such as silicon oxide, silicon carbide oxide, silicon nitride, hafnium oxide, zirconium oxide, aluminum oxide, or a stacked structure thereof.

At least one gate electrode layer 120 may be formed on the gate insulating layer 118. For example, the gate electrode layer 120 may be formed on at least the channel region 110c. Specifically, the gate electrode layer 120 may be formed on the first source region 112a, the channel region 110c, and the protruding portion 107a of the drift region 107. The second well region 110b, the second source region 112b, and the well contact region 114 may be disposed outside the gate electrode layer 120 and may be exposed from the gate electrode layer 120.

For example, the gate electrode layer 120 may include a suitable conductive material, such as polysilicon, metal, metal nitride, metal silicide, or the like, or may include a stacked structure thereof.

An interlayer insulating layer 130 may be formed on the gate electrode layer 120. For example, the interlayer insulating layer 130 may include a suitable insulating material, such as an oxide layer, a nitride layer, or a stacked structure thereof.

The source electrode layer 140 may be formed on the interlayer insulating layer 130 and may be connected to the source region 112, specifically, the second source region 112b or the source contact region 112b1. Furthermore, the source electrode layer 140 may be commonly connected to the second source region 112b and the well contact region 114. For example, the source electrode layer 140 may be formed of an appropriate conductive material, metal, or the like.

In the power semiconductor device 100-3 described above, the first conductivity type and the second conductivity type may have opposite conductivity types, but may be any one of n-type and p-type, respectively. For example, when the first conductivity type is n-type, the second conductivity type is p-type, and vice versa.

Specifically, when the power semiconductor device 100-3 is an N-type MOSFET, the drift region 107 may be an N− region, the source region 112 and the drain region 102 may be N+ regions, the well region 110, the channel region 110c, and the pillar region 111 may be P− regions, and the well contact region 114 may be a P+ region.

During the operation of the power semiconductor device 100-3, current may generally flow in a vertical direction from the drain region 102 along the protruding portions 107a of the drift region 107, and then may flow through the channel region 110c to the source region 112.

In the power semiconductor device 100-3 described above, the source contact region 112b and the well contact region 114 may be separately disposed outside the gate electrode layer 120. Accordingly, the first well region 110a and the first source region 112a may be formed such that the protruding portions 107a of the drift region 107 are densely disposed, and thus the channel region 110c may be densely formed under the gate electrode layer 120. Accordingly, the power semiconductor device 100-3 may have a high degree of integration.

Meanwhile, the power semiconductor device 100-3 is required to have high withstand voltage characteristics because it is used for high power switching. When a high voltage is applied to the drain region 102, a depletion region may extend from the semiconductor layer 105 adjacent to the drain region 102, and thus a voltage barrier of the channel may be lowered. This phenomenon is called drain induced barrier lowering (DIBL).

The DIBL may cause abnormal turn-on of the channel region 110c, and further, a punch through phenomenon in which the depletion layers between the drain region 102 and the source region 112 expand and are in contact with each other.

However, the above-described power semiconductor device 100-3 may reduce resistance of the drift region 107 and the channel region 110c using the pillar region 111 which forms the super junction with the drift region 107 and may suppress abnormal current flow and punch-through phenomenon caused by DIBL to secure appropriate withstand voltage characteristics. Therefore, although a thickness of the drift region 107 constituting a body is reduced, the high breakdown voltage may be maintained.

The breakdown voltage characteristics may be further improved by adjusting the amount of charge in the pillar region 111 and the amount of charge in the drift region 107.

Figure 36:
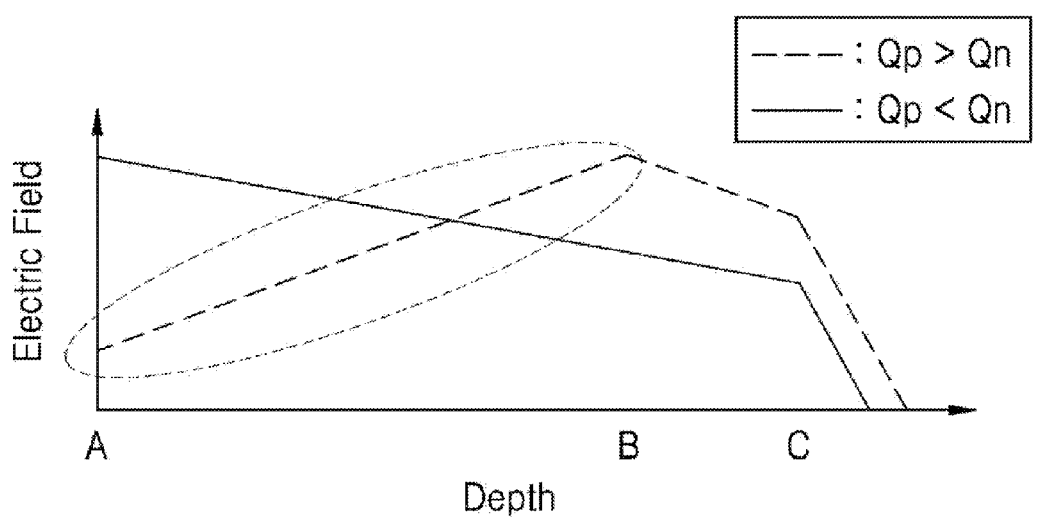
FIG. 36 is a graph showing an electric field change depending on a depth of a power semiconductor device according to an embodiment of the present disclosure.

FIG. 36 is a graph showing an electric field change depending on a depth of the power semiconductor device 100-3 according to an embodiment of the present disclosure. In FIG. 36, a position of "A" indicates a surface of the first well region 110a, a position of "B" indicates a bottom surface of the pillar region 111, and a position of "C" indicates a bottom surface of the drift region 107.

Referring to FIG. 36, when the amount of charge Qp of the pillar region 111 is larger than the amount of charge Qn of the drift region 107, maximum electric field during operation of the power semiconductor device 100-3 may be generated in the drift region 107 on the same line as the bottom surface of the pillar region 111, thereby increasing the breakdown voltage. In FIG. 36, a slope of electric field intensity between the "A" position and the "B" position may be controlled by adjusting the electric charge Qp of the pillar region 111.

For example, the doping concentration of the impurities of the second conductivity type in the pillar region 111 may be higher than the doping concentration of the impurities of the first conductivity type in the drift region 107, thereby adjusting the charge amount balance. Accordingly, the field applied to the gate insulating layer 118 may be lowered and a DIBL margin may be increased through charge balance adjustment, thereby improving the withstand voltage characteristics of the power semiconductor device 100-3.

Therefore, according to the above-described power semiconductor device 100-3, while increasing the channel density to increase the degree of integration, it is possible to maintain the breakdown voltage, thereby reducing the operation loss.

FIGS. 29 to 32 are cross-sectional views illustrating power semiconductor devices 100a-3, 100b-3, 100c-3, and 100d-3 according to other embodiments of the present disclosure. The power semiconductor devices 100a-3, 100b-3, 100c-3, and 100d-3 are partially modified or added to the power semiconductor device 100-3 of FIGS. 25 to 28, and thus the embodiments may refer to each other, and redundant descriptions are omitted.

Figure 29:
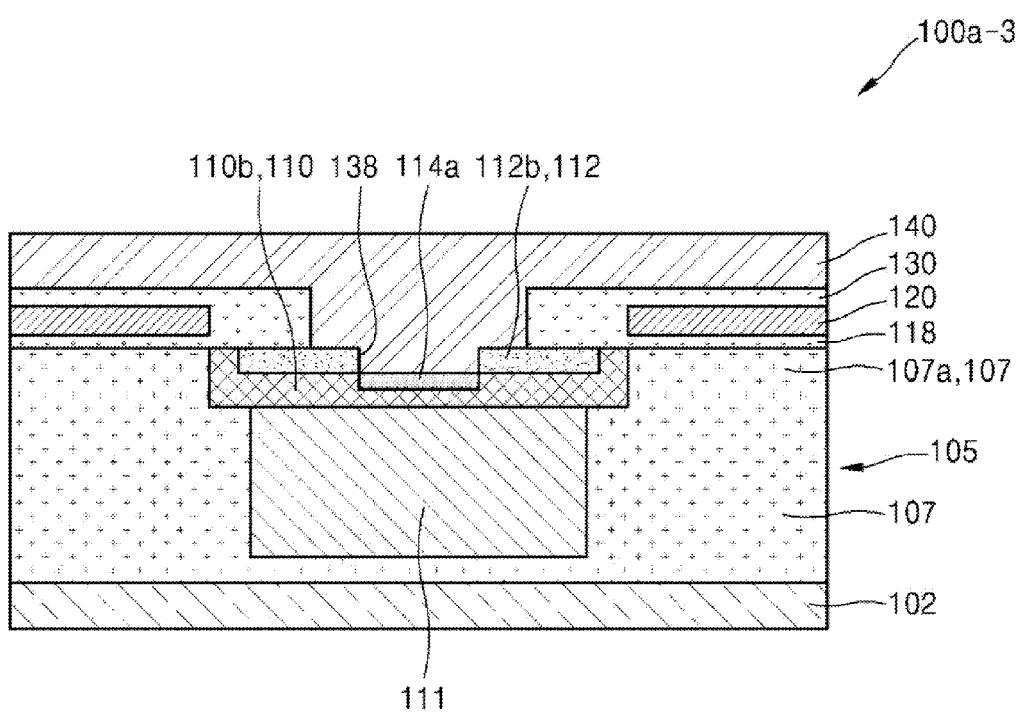
FIGS. 29 to 32 are cross-sectional views illustrating power semiconductor devices according to other embodiments of the present disclosure.

Referring to FIG. 29, the power semiconductor device 100a-3 may include at least one groove 138 penetrating the second source region 112b and exposing the second well region 110b. The groove 138 may be formed to expose a surface of the second well region 110b or to be recessed to make the second well region 110b have a certain depth. The well contact region 114a may be formed on at least a bottom surface of the groove 138 to be in contact with the second well region 110b.

The source electrode layer 140 may be formed to fill the groove 138, and thus may be connected to the well contact region 114a, the second well region 110b, and/or the second source region 112b. This structure may help to reduce contact resistance between the source electrode layer 140, and the second well region 110b and the second source region 112b by increasing the contact area therebetween.

In some embodiments, the well contact region 114a may be entirely formed on a surface of the second well region 110b exposed by the groove 138. Accordingly, the well contact region 114a may be formed on the second well region 110b exposed from the bottom and sidewall of the groove 138. The structure of the well contact region 114a may further reduce contact resistance between the source electrode layer 140 and the second well region 110b.

Figure 30:
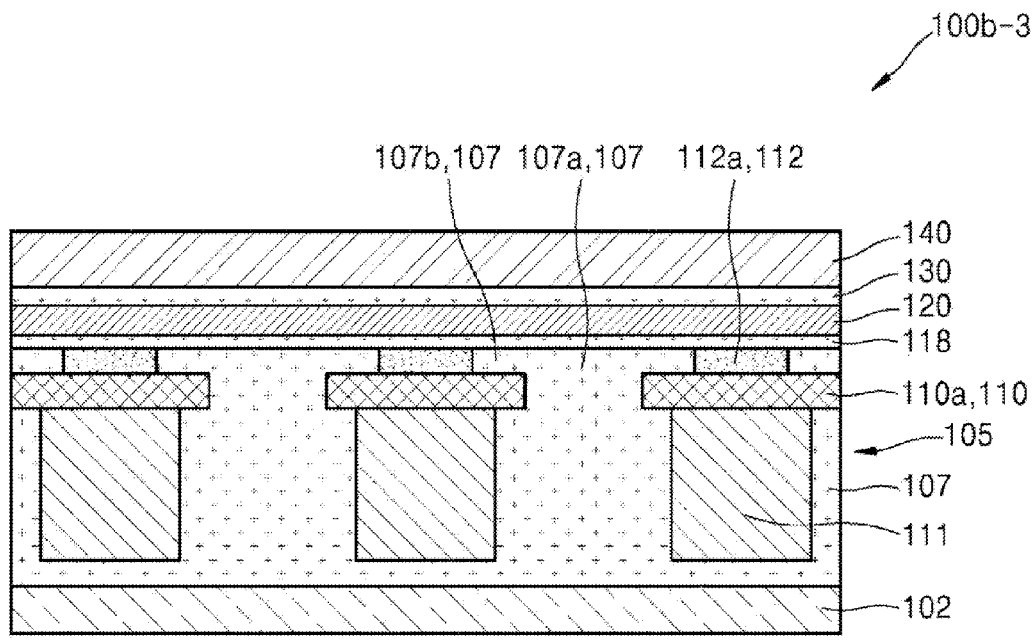

Referring to FIG. 30, in the power semiconductor device 100b-3, a channel region 107b may be formed in the semiconductor layer 105 between the drift region 107 and the source region 112. For example, the channel region 107b may be formed in the semiconductor layer 105 between the protruding portion 107a of the drift region 107 and the first source region 112a. The channel region 107b may have the first conductivity type such that an accumulation channel is formed.

For example, the channel region 107b may have the same doping type as the source region 112 and the drift region 107. In this case, the source region 112, the channel region 107b, and the drift region 107 may have a structure that is normally electrically connected. However, in the structure of the semiconductor layer 105 of silicon carbide, a band of the channel region 107b is bent upward due to influence of negative charges generated when carbon clusters are formed in the gate insulating layer 118, thereby causing a potential barrier. Accordingly, when an operation voltage is applied to the gate electrode layer 120, the accumulation channel that allows the flow of electric charges or current may be formed in the channel region 107b.

Therefore, a threshold voltage to be applied to the gate electrode layer 120 to form the accumulation channel in the channel region 107b may be significantly lower than a threshold voltage to be applied to the gate electrode layer 120 to form a conventional inversion channel.

In some embodiments, the channel region 107b may be a part of the drift region 107. Specifically, the channel region 107b may be a part of the protruding portion 107a of the drift region 107. For example, the channel region 107b may be integrally formed with the drift region 107.

The drift region 107 may be connected to the source region 112 through the channel region 107b. Specifically, in the channel region 107b, the protruding portion 107a of the drift region 107 and the first source region 112a may be in contact with each other.

For example, the doping concentration of the impurities of the first conductivity type in the channel region 107b may be the same as other parts of the drift region 107 or may be different therefrom for adjusting the threshold voltage.

In some embodiments, the first well region 110a may be formed under the first source region 112a to further protrude toward the protruding portion 107a of the drift region 107 than the first source region 112a. The channel region 107b may be formed in the semiconductor layer 105 on the protruding portion of the first well region 110a. For example, the protruding portion 107a of the drift region 107 may be further extended to a groove portion between the first well region 110a and the gate electrode layer 120, and the channel region 107b may be formed thereon. This structure may allow the channel region 107b to be defined between the gate electrode layer 120 and the well region 110.

In some embodiments, the first well region 110a and the first source region 112a may have the same width. In this case, the first source region 112a may be in contact with the protruding portion 107a of the drift region 107, and the channel region 107b may be defined at a part in contact with the protruding portion 107a.

Figure 31:
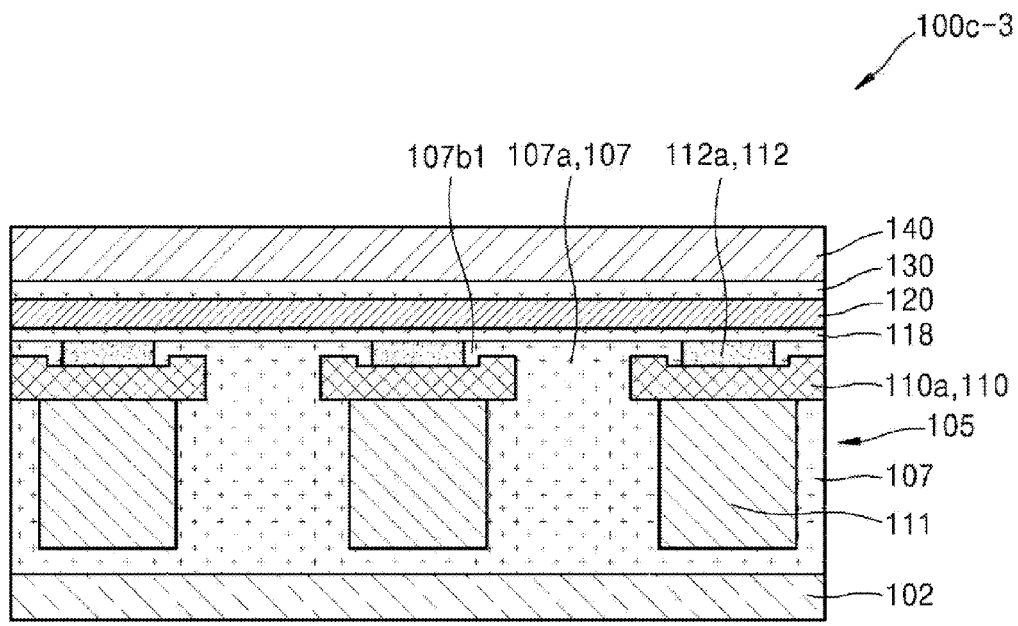

Referring to FIG. 31, in the power semiconductor device 100c-3, the first well region 110a may further protrude from the first source region 112a toward the protruding portion 107a of the drift region 107, and may include a tab portion extending toward the gate electrode layer 120 at an end thereof.

A channel region 107b1 may be formed in the semiconductor layer 105 on the protruding portion of the first well region 110a. For example, the channel region 107b1 may be formed in a bent shape on the protruding portion and the tab portion of the first well region 110a. This structure may allow the channel region 107b1 to be more limited between the gate electrode layer 120 and the first well region 110a.

Figure 32:
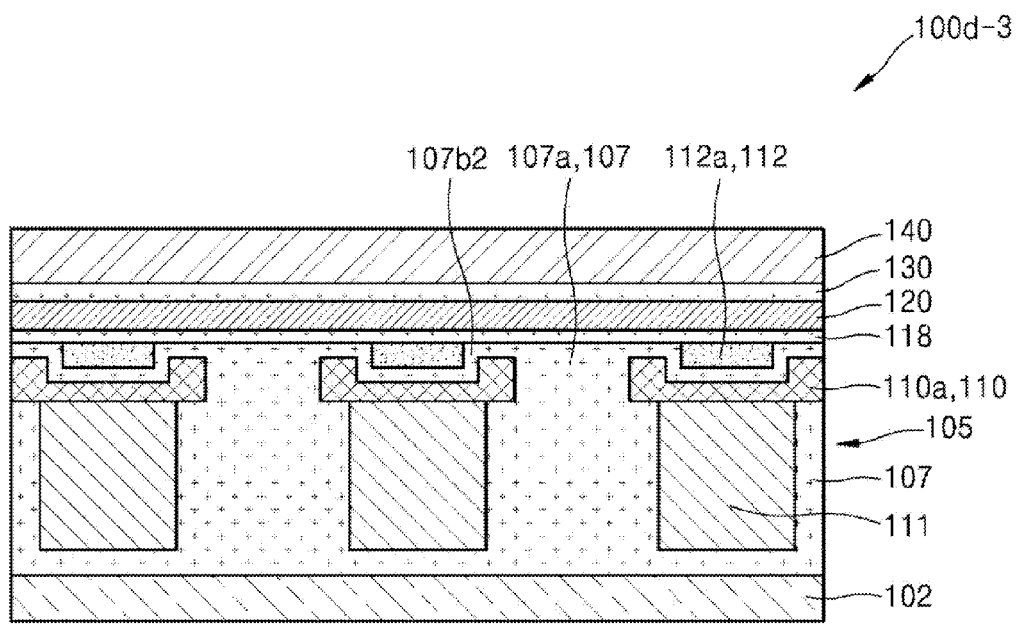

Referring to FIG. 32, in the power semiconductor device 100d-3, the first well region 110a may further protrude from the first source region 112a toward the protruding portion 107a of the drift region 107, and may include a tab portion extending toward the gate electrode layer 120 at an end thereof. Furthermore, the protruding portion 107a of the drift region 107 may further extend between a lower part of the first source region 112a and the first well region 110a.

A channel region 107b2 may be formed to extend further into the semiconductor layer 105 between the lower part of the first source region 112a and the first well region 110a. For example, the channel region 107b2 may be formed in a bent shape from an upper part of the tab portion of the first well region 110a to the lower part of the first source region 112a. This structure may contribute to widening the contact area between the channel region 107b2 and the first source region 112a.

Figure 33:
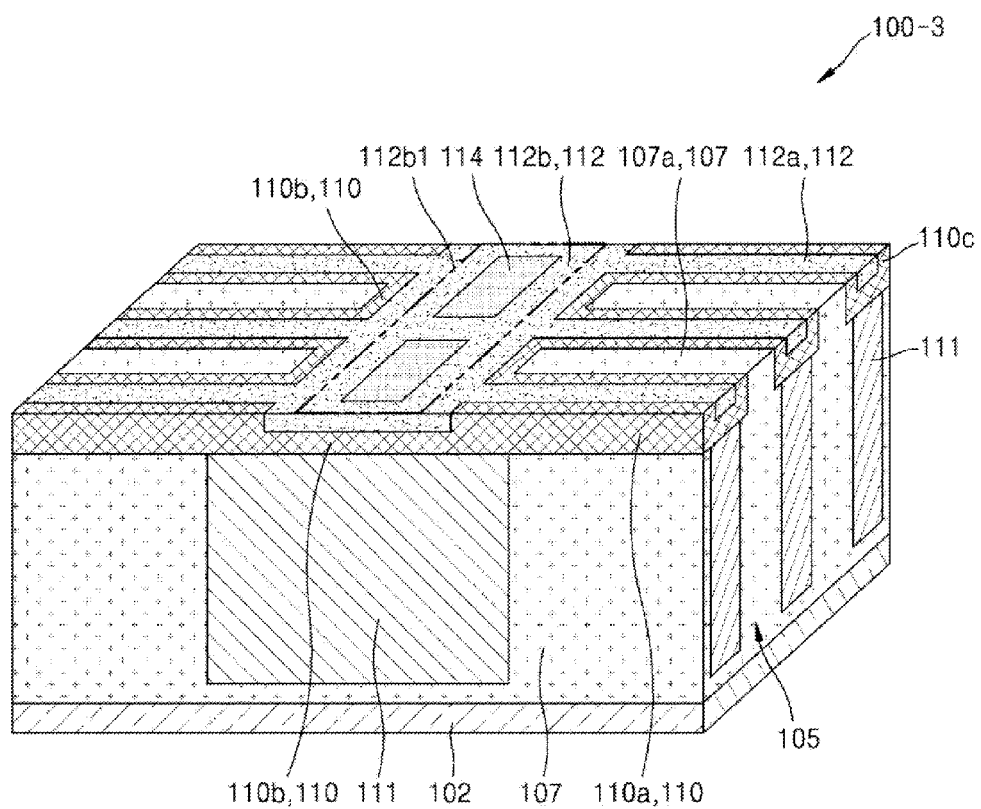
FIGS. 33 to 35 are schematic perspective views illustrating a method of fabricating a power semiconductor device according to an embodiment of the present disclosure.
Figure 34:
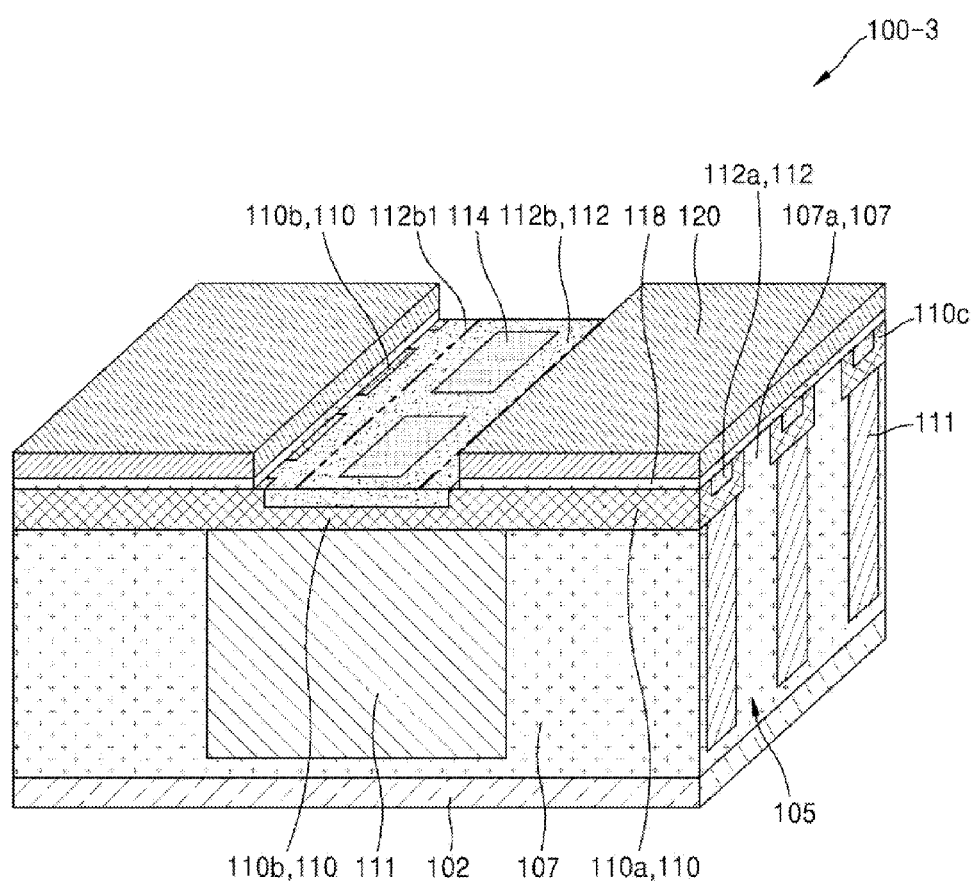
Figure 35:
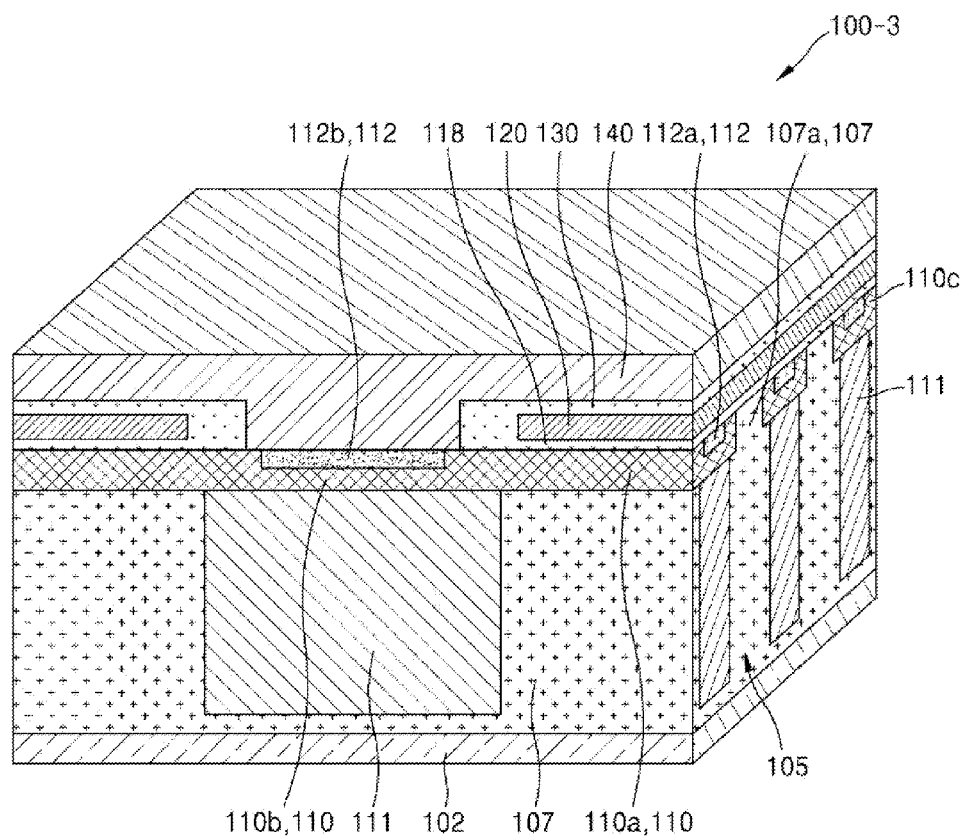

FIGS. 33 to 35 are schematic perspective views illustrating a method of fabricating the power semiconductor device 100-3 according to an embodiment of the present disclosure.

Referring to FIG. 33, the drift region 107 having the first conductivity type may be formed in the semiconductor layer 105 of silicon carbide (SiC) to provide a vertical movement path of charges. For example, the drift region 107 may be formed on the drain region 102 having the first conductivity type. In some embodiments, the drain region 102 may be provided as a substrate of the first conductivity type, and the drift region 107 may be formed as one or the plurality of epitaxial layers on the substrate.

Subsequently, the well region 110 having the second conductivity type may be formed in the semiconductor layer 105 to be in contact with the at least a part of the drift region 107. For example, the forming of the well region 110 may be performed by implanting impurities of the second conductivity type into the semiconductor layer 105.

In detail, the well region 110 may be formed on the semiconductor layer 105 in contact with the protruding portion 107a to define at least one protruding portion 107a of the drift region 107. Specifically, the well region 110 may be formed by doping the drift region 107 or the semiconductor layer 105 with impurities of conductivity type opposite to the drift region 107.

The well region 110 may be divided into the first well region 110a under the gate electrode layer 120 and the second well region 110b outside the gate electrode layer 120. For example, the first well region 110a may define the protruding portion 107a of the drift region 107, and the well contact region 114 may be formed in the second well region 110b later. The first well region 110a and the second well region 110b may be connected to each other.

The pillar region 111 may be formed in the semiconductor layer 105 under the well region 110 to be in contact with the well region 110. The pillar region 111 may have the second conductivity type to form the super junction with the drift region 107. For example, the pillar region 111 may be formed by implanting the impurities of the second conductivity type into the semiconductor layer 105 or the drift region 107.

Further, a source region 112 having the first conductivity type may be formed on or in the well region 110. For example, the forming of the source region 112 may be performed by implanting impurities of the first conductivity type into the well region 110 or into the semiconductor layer 105.

For example, the forming of the source region 112 may include forming the first source region 112a on or in the first well region 110a and forming the second source region 112b on the second well region 110b or in the second well region 110b. A part of the second source region 112b may be allocated as the source contact region 112b1 to be connected to the source electrode layer 140. The first source region 112a and the second source region 112b may be connected to each other. The source region 112 may be formed substantially from a surface of the semiconductor layer 105 into the well region 110 or above the well region 110, with a certain depth.

In addition to the formation of the source region 112, the channel region 110c having the second conductivity type may be formed to form the inversion channel in the semiconductor layer 105 between the source region 112 and the drift region 107. For example, the channel region 110c may be formed in the semiconductor layer 105 between the protruding portion 107a of the drift region 107 and the first source region 112a. For example, the channel region 110c that is a part of the first well region 110a may not be separately formed but may be formed together with the first well region 110a.

Optionally, the well contact region 114 extending from the second well region 110b through the second source region 112b may be formed in the second source region 112b. For example, the well contact region 114 may be formed by implanting impurities of the second conductivity type into a part of the well region 110 at a higher concentration than the well region 110.

In a modified example of this embodiment, an impurity doping order of the well region 110, the pillar region 111, the source region 112, the channel region 110c, and the well contact region 114 may be appropriately changed.

In the above-described fabricating method, impurity implantation or impurity doping may be performed such that the impurities are mixed when the impurities are implanted into the semiconductor layer 105 or the epitaxial layer is formed. However, for implantation of the impurities in the selective region, an ion implantation method using a mask pattern may be used.

Optionally, after ion implantation, a heat treatment for activating or diffusing the impurities may be followed.

Referring to FIG. 34, the gate insulating layer 118 may be formed on at least a part of the semiconductor layer 105.

For example, the gate insulating layer 118 may be formed on at least the channel region 110c and the protruding portion 107a of the drift region 107.

For example, the gate insulating layer 118 may be formed by oxidizing the semiconductor layer 105 to form an oxide, or by depositing an insulating material such as oxide or nitride on the semiconductor layer 105.

Subsequently, the gate electrode layers 120 may be formed on the gate insulating layer 118. For example, the gate electrode layers 120 may be formed by forming a conductive layer on the gate insulating layer 118 and then patterning the conductive layer. The gate electrode layer 120 may be formed by doping polysilicon with impurities, or may be formed to include a conductive metal or metal silicide.

The patterning process may be performed using photo lithography and etching processes. The photolithography process may include a process which forms a photoresist pattern as a mask layer using a photo process and a development process. The etching process may include a process which selectively etches an underlying structure using the photoresist pattern.

Referring to FIG. 35, the interlayer insulating layer 130 may be formed on the gate electrode layers 120. Optionally, when the interlayer insulating layer 130 is entirely formed on the underlying structure, a process which forms a contact hole pattern for exposing the source contact region 113 and the well contact region 114 may be followed.

Subsequently, the source electrode layer 140 may be formed on the semiconductor layer 105 to be connected to the second source region 112b and the well contact region 114. For example, the source electrode layer 140 may be formed by forming a conductive layer, such as a metal layer, on the interlayer insulating layer 130 and then patterning or planarizing the conductive layer.

Meanwhile, the power semiconductor device 100a-3 of FIG. 29 may be fabricated by adding or modifying some processes to the fabricating process of the power semiconductor device 100-3 described above.

The fabricating of the power semiconductor device 100a-3 of FIG. 29 may further include forming at least one groove 138 through the second source region 112b and exposing the second well region 110b in the second source region 112b, forming the well contact region 114 to be in contact with the well region 110 on a bottom surface of the groove 138, and filling the groove 138 to form the source electrode layer 140 to be connected to the source region 112 and the well contact region 114.

Meanwhile, when the power semiconductor devices 100b-3, 100c-3, and 100d-3 of FIGS. 30 to 32 are fabricated, the channel regions 107b, 107b1, and 107b2 may have the first conductive type to form the accumulation channel. For example, the channel regions 107b, 107b1, and 107b2 may be formed as a part of the drift region 107.

According to the above-described fabricating method, it is possible to economically fabricate the highly integrated power semiconductor device 100-3 by using a process used in an existing silicon substrate, using the semiconductor layer 105 of silicon carbide.

Figure 37:
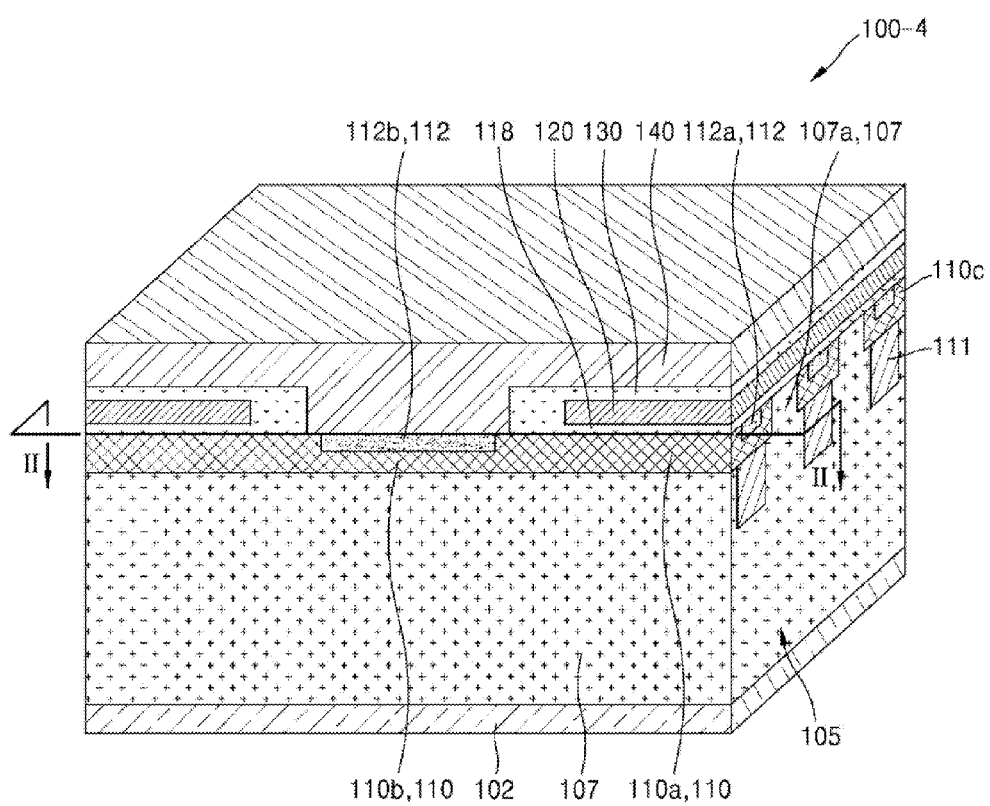
FIG. 37 is a schematic perspective view showing a power semiconductor device according to an embodiment of the present disclosure.
Figure 38:
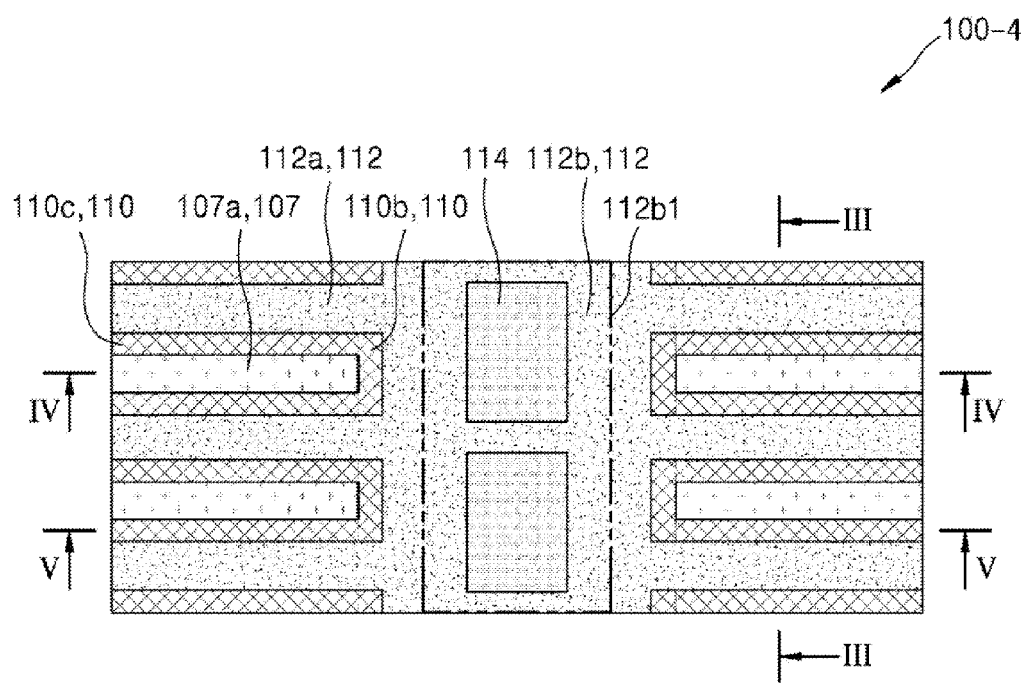
FIG. 38 is a plan view illustrating the power semiconductor device taken along line II-II of FIG. 37.
Figure 39:
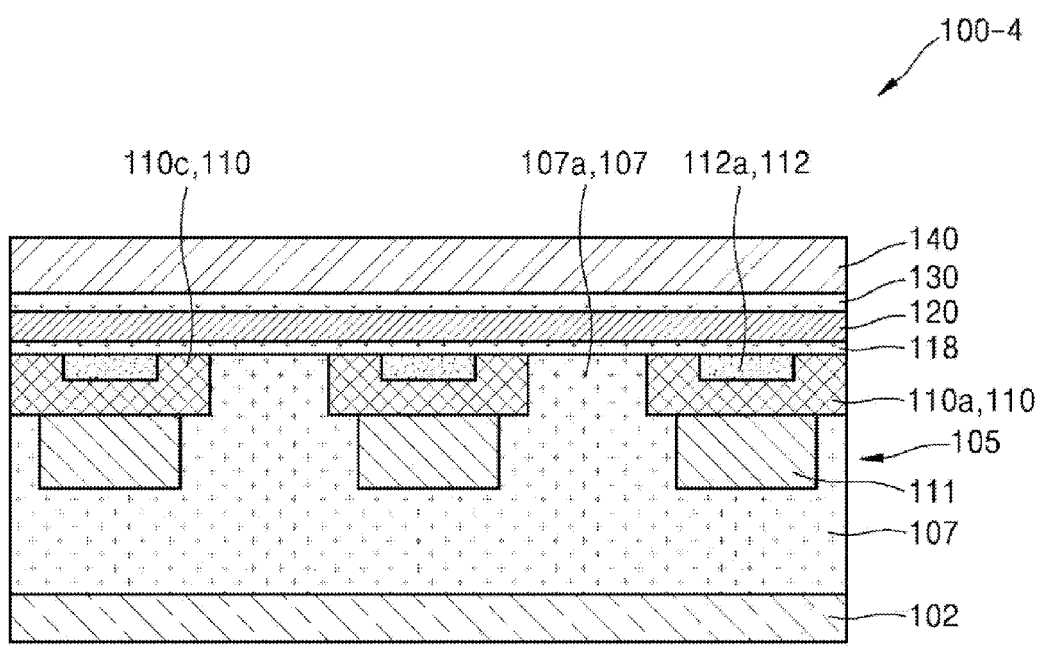
FIG. 39 is a cross-sectional view illustrating the power semiconductor device taken along line III-III of FIG. 38.
Figure 40:
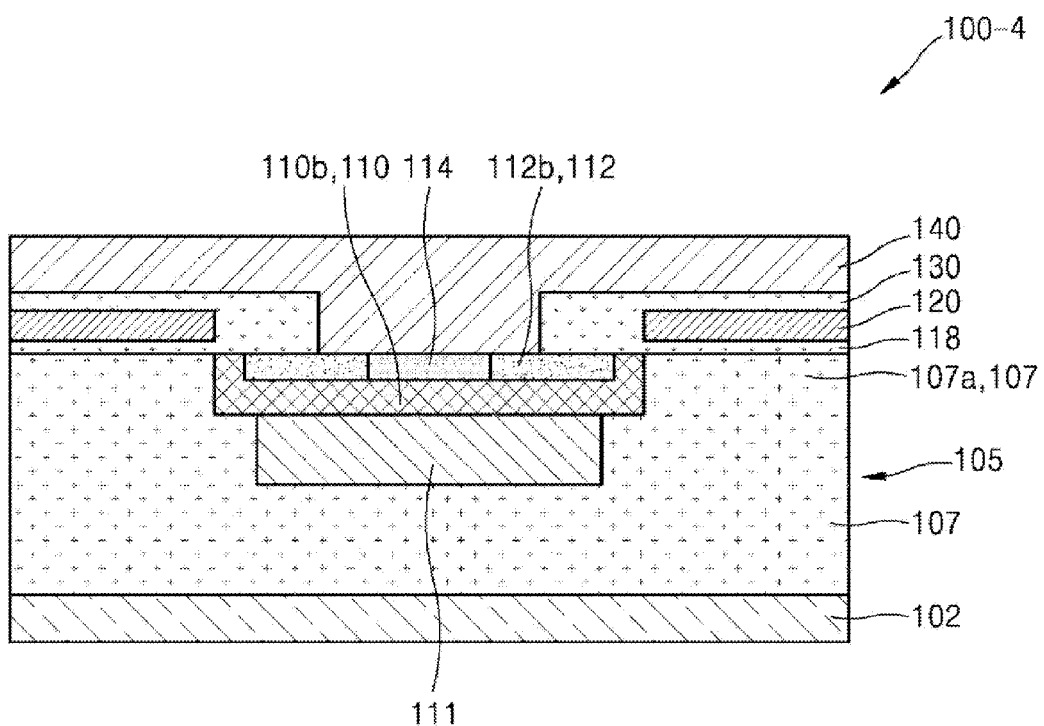
FIG. 40 is a cross-sectional view illustrating the power semiconductor device taken along line IV-IV of FIG. 38.
Figure 41:
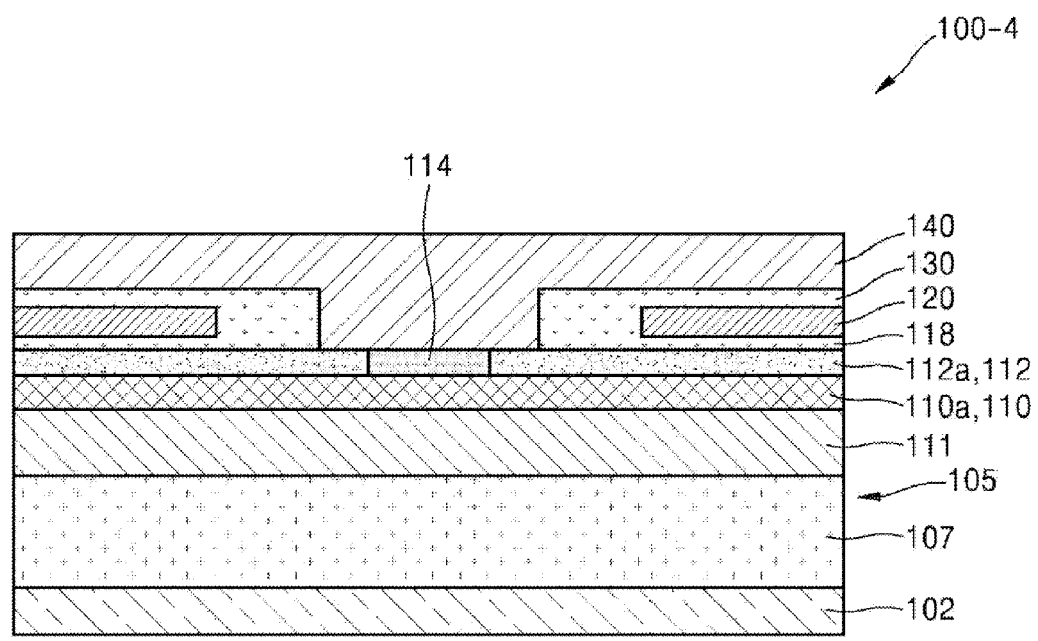
FIG. 41 is a cross-sectional view illustrating the power semiconductor device taken along line V-V of FIG. 38.

FIG. 37 is a schematic perspective view showing a power semiconductor device 100-4 according to an embodiment of the present disclosure, FIG. 38 is a plan view illustrating the power semiconductor device 100-4 taken along line II-II of FIG. 37, FIG. 39 is a cross-sectional view illustrating the power semiconductor device 100-4 taken along line III-III of FIG. 38, FIG. 40 is a cross-sectional view illustrating the power semiconductor device 100-4 taken along line IV-IV of FIG. 38, and FIG. 41 is a cross-sectional view illustrating the power semiconductor device 100-4 taken along line V-V of FIG. 38.

Referring to FIGS. 37 to 41, the power semiconductor device 100-4 may include at least a semiconductor layer 105, a gate insulating layer 118, and a gate electrode layer 120. For example, the power semiconductor device 100-4 may have a power MOSFET structure.

The semiconductor layer 105 may refer to one or a plurality of layers of semiconductor material, and may refer to, for example, one or a plurality of epitaxial layers.

Furthermore, the semiconductor layer 105 may refer to one or a plurality of epitaxial layers on a semiconductor substrate.

For example, the semiconductor layer 105 may be formed of silicon carbide (SiC). Specifically, the semiconductor layer 105 may include at least one epitaxial layer of silicon carbide.

Silicon carbide (SiC) may have a wider bandgap compared to silicon, and thus may maintain stability even at a high temperature. In addition, because a breakdown electric field of the silicon carbide is higher than that of the silicon, the silicon carbide may stably operate even at a high temperature. Accordingly, the power semiconductor device 100-4 using the silicon carbide as the semiconductor layer 105 shows stable operational characteristics due to higher breakdown voltage and excellent heat release compared to silicon.

Specifically, the semiconductor layer 105 may include a drift region 107. The drift region 107 may have a first conductivity type, and may be formed by implanting impurities of the first conductivity type into a part of the semiconductor layer 105. For example, the drift region 107 may be formed by doping the impurities of the first conductivity type in the epitaxial layer of silicon carbide.

The drift region 107 may provide a vertical movement path for electric charges. Furthermore, the drift region 107 may include at least one protruding portion 107a disposed under the gate electrode layer 120. The protruding portion 107a may extend substantially onto a surface of the semiconductor layer 105.

A well region 110 may be formed in the semiconductor layer 105 to be in contact with at least a part of the drift region 107, and may have a second conductivity type. For example, the well region 110 may be formed by doping impurities of the second conductivity type opposite to the first conductivity type in the semiconductor layer 105 or the drift region 107.

For example, the well region 110 may include a first well region 110a formed in the semiconductor layer 105 under the gate electrode layer 120 and in contact with the protruding portion 107a of the drift region 107 and a second well region 110b formed in the semiconductor layer 105 outside the gate electrode layer 120. The first well region 110a and the second well region 110b may be connected to each other. Substantially, a lower part of the protruding portion 107a of the drift region 107 may be defined by the first well region 110a, and specifically, may be in contact with a sidewall of the first well region 110a.

A deep well region 111 may be formed in the semiconductor layer 105 under the well region 110 with a conductivity type different from that of the drift region 107. For example, the deep well region 111 may have the same second conductivity type as the well region 110 and may be formed in the semiconductor layer 105 under the well region 110 in contact with the well region 110 and the drift region 107. A doping concentration of impurities of the second conductivity type in the deep well region 111 may be equal to or less than a doping concentration of impurities of the second conductivity type in the well region 110.

For example, the deep well region 111 may be formed to be in contact with or surround the sidewall of the drift region 107 under the well region 110. As another example, a plurality of deep well regions 111 may be provided and may be alternately formed to be in contact with the drift region 107.

In some embodiments, the deep well region 111 may have a width narrower than that of the well region 110 to expose at least a part of a bottom surface of the well region 110 in one direction. For example, opposite ends of the deep well region 111 may shortened inward from opposite ends of the well region 110 in one direction and may formed under the well region 110. The one direction may refer to line IV-IV or line V-V in FIG. 38. Accordingly, the well region 110 may be formed to protrude further toward the protruding portion 107a of the drift region 107 than the deep well region 111 in the one direction.

A source region 112 may be formed on or in the well region 110 and may have the first conductivity type. For example, the source region 112 may be formed by doping the semiconductor layer 105 or the well region 110 with impurities of the first conductivity type. The source region 112 may be formed by doping with a higher concentration of the impurities of the first conductivity type than the drift region 107.

For example, the source region 112 may include a first source region 112a formed on the first well region 110a and a second source region 112b formed on the second well region 110b. The first source region 112a and the second source region 112b may be connected to each other. The first source region 112a may be disposed under the gate electrode layer 120, and the second source region 112b may be disposed outside the gate electrode layer 120.

The second source region 112b may include a source contact region 112b1 connected to a source electrode layer 140 outside the gate electrode layer 120. For example, the source contact region 112b1 may be a part of the second source region 112b and may refer to a part to which the source electrode layer 140 is connected.

A well contact region 114 may be formed in the second source region 112b, specifically, in the source contact region 112b1. For example, the well contact region 114 may be extended from the second well region 110b through the second source region 112b, and may have the second conductivity type. One or a plurality of well contact regions 114 may be formed in the source contact region 112b1.

The well contact region 114 may be connected to the source electrode layer 140. When connected to the source electrode layer 140, the well contact region 114 may be formed by doping with a higher concentration of the impurities of the second conductivity type than the well region 110 for lowering contact resistance.

A channel region 110c may be formed in the semiconductor layer 105 between the drift region 107 and the source region 112. For example, the channel region 110c may be formed in the semiconductor layer 105 between the protruding portion 107a of the drift region 107 and the first source region 112a.

For example, the channel region 110c may have the second conductivity type such that an inversion channel is formed. Because the channel region 110c has the doping type opposite to the source region 112 and the drift region 107, the channel region 110c, the source region 112, and the drift region 107 may form a diode junction. Accordingly, the channel region 110c may not allow movement of charges in a normal situation, but when an operation voltage is applied to the gate electrode layer 120, the inversion channel may be formed therein to allow the movement of charges.

For example, the channel region 110c may be a part of the well region 110. In detail, the channel region 110c may be a part of the well region 110 adjacent to the lower part of the gate electrode layer 120. In this case, the channel region 110c may be formed to be integrally or continuously connected to the well region 110a. A doping concentration of the impurities of the second conductivity type in the channel region 110c may be the same as those of other portions of the well region 110 or may be different therefrom for adjusting a threshold voltage.

In some embodiments, the protruding portion 107a of the drift region 107, the first well region 110a, the channel region 110c, and/or the first source region 112a may extend in one direction. As the first well region 110a extends in one direction, the deep well region 111 under the first well region 110a may also extend in the one direction. Here, the direction of extension of the channel region 110c does not mean the direction of movement of electric charges.

In some embodiments, the first well region 110a, the channel region 110c, and the first source region 112a may be symmetrically formed with respect to the protruding portion 107a of the drift region 107. For example, the first well region 110a, the channel region 110c, and the first source region 112a may be formed on the semiconductor layers 105 on opposite sides of the protruding portion 107a of the drift region 107, respectively. Further, a part of the deep well region 111 may also be formed under the first well region 110a on opposite sides of the protruding portion 107a of the drift region 107.

In some embodiments, the drift region 107 may include a plurality of protruding portions 107a formed parallel to each other in one direction. For example, the first well region 110a may be formed in a stripe pattern extending in the one direction, and the protruding portions 107a may also be formed in a stripe pattern. In addition, the first source region 112a may be formed in a stripe pattern on the first well region 110a. The channel region 110c may be formed between the protruding portions 107a of the drift region 107 and the first source region 112a.

In some embodiments, the first well regions 110a may be formed symmetrically with respect to the second well region 110b, and the first source regions 112a may be formed symmetrically with respect to the second source region 112b. In this case, the protruding portions 107a of the drift region 107 may include a plurality of protruding portions 107a formed symmetrically with respect to the second well region 110b or the second source region 112b.

Further, the first well region 110a and the second well region 110b may be formed repeatedly and alternately in one direction. In this case, the first source region 112a and the second source region 112b may also be repeatedly formed.

Additionally, a drain region 102 may be formed in the semiconductor layer 105 under the drift region 107 and may have the first conductivity type. For example, the drain region 102 may be doped with a higher concentration than the drift region 107.

In some embodiments, the drain region 102 may be provided as a substrate of silicon carbide having the first conductivity type. In this case, the drain region 102 may be understood as a part of the semiconductor layer 105 or a separate substrate from the semiconductor layer 105.

The gate insulating layer 118 may be formed on at least a part of the semiconductor layer 105. For example, the gate insulating layer 118 may be formed on at least the channel region 110c. Specifically, the gate insulating layer 118 may be formed on the first source region 112a, the channel region 110c, and the protruding portion 107a of the drift region 107.

For example, the gate insulating layer 118 may include an insulating material such as silicon oxide, silicon carbide oxide, silicon nitride, hafnium oxide, zirconium oxide, aluminum oxide, or a stacked structure thereof.

At least one gate electrode layer 120 may be formed on the gate insulating layer 118. For example, the gate electrode layer 120 may be formed on at least the channel region 110c. Specifically, the gate electrode layer 120 may be formed on the first source region 112a, the channel region 110c, and the protruding portion 107a of the drift region 107. The second well region 110b, the second source region 112b, and the well contact region 114 may be disposed outside the gate electrode layer 120 and may be exposed from the gate electrode layer 120.

For example, the gate electrode layer 120 may include a suitable conductive material, such as polysilicon, metal, metal nitride, metal silicide, or the like, or may include a stacked structure thereof.

An interlayer insulating layer 130 may be formed on the gate electrode layer 120. For example, the interlayer insulating layer 130 may include a suitable insulating material, such as an oxide layer, a nitride layer, or a stacked structure thereof.

The source electrode layer 140 may be formed on the interlayer insulating layer 130 and may be connected to the source region 112, specifically, the second source region 112b or the source contact region 112b1. Furthermore, the source electrode layer 140 may be commonly connected to the second source region 112b and the well contact region 114. For example, the source electrode layer 140 may be formed of an appropriate conductive material, metal, or the like.

In the power semiconductor device 100-4 described above, the first conductivity type and the second conductivity type may have opposite conductivity types, but may be any one of n-type and p-type, respectively. For example, when the first conductivity type is n-type, the second conductivity type is p-type, and vice versa.

Specifically, when the power semiconductor device 100-4 is an N-type MOSFET, the drift region 107 may be an N− region, the source region 112 and the drain region 102 may be N+ regions, the well region 110, the channel region 110c, and the deep well region 111 may be P− regions, and the well contact region 114 may be a P+ region.

During the operation of the power semiconductor device 100-4, current may generally flow in a vertical direction from the drain region 102 along the protruding portions 107a of the drift region 107, and then may flow through the channel region 110c to the source region 112.

In the power semiconductor device 100-4 described above, the source contact region 112b and the well contact region 114 may be separately disposed outside the gate electrode layer 120. Accordingly, the first well region 110a and the first source region 112a may be formed such that the protruding portions 107a of the drift region 107 are densely disposed, and thus the channel region 110c may be densely formed under the gate electrode layer 120. Accordingly, the power semiconductor device 100-4 may have a high degree of integration.

In the case of the power semiconductor device 100-4 described above, the deep well region 111 may be disposed under the well region 110, and thus electric field applied to the gate insulating layer 118 on the protruding portion 107a of the drift region 107 between the well regions 110 may be reduced. Furthermore, lowering the electric field may allow junction resistance of the power semiconductor device 100-4 to be reduced. Accordingly, electric field margin applied to the gate insulating layer 118 in the power semiconductor device 100-4 may be increased, and operation reliability of the power semiconductor device 100-4 may be improved.

FIGS. 42 to 45 are cross-sectional views illustrating power semiconductor devices 100a-4, 100b-4, 100c-4, and 100d-4 according to other embodiments of the present disclosure. The power semiconductor devices 100a-4, 100b-4, 100c-4, and 100d-4 are partially modified or added to the power semiconductor device 100-4 of FIGS. 37 to 41, and thus the embodiments may refer to each other, and redundant descriptions are omitted.

Figure 42:
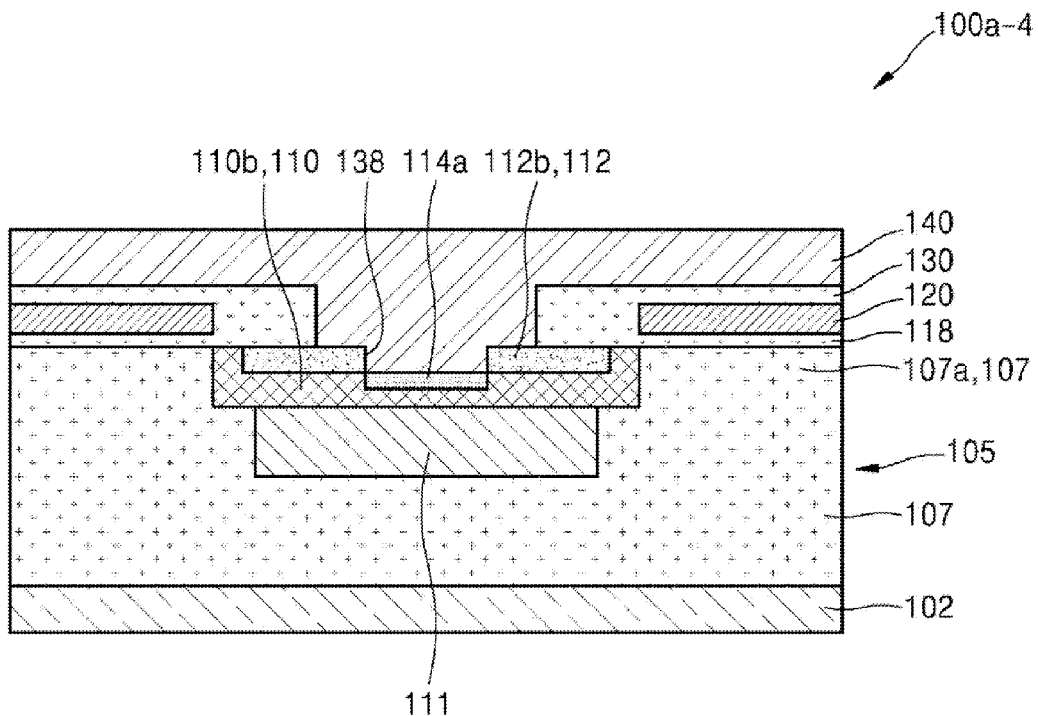
FIGS. 42 to 45 are cross-sectional views illustrating power semiconductor devices according to other embodiments of the present disclosure.

Referring to FIG. 42, the power semiconductor device 100a-4 may include at least one groove 138 penetrating the second source region 112b and exposing the second well region 110b. The groove 138 may be formed to expose a surface of the second well region 110b or to be recessed to make the second well region 110b have a certain depth. The well contact region 114a may be formed on at least a bottom surface of the groove 138 to be in contact with the second well region 110b.

The source electrode layer 140 may be formed to fill the groove 138, and thus may be connected to the well contact region 114a, the second well region 110b, and/or the second source region 112b. This structure may help to reduce contact resistance between the source electrode layer 140, and the second well region 110b and the second source region 112b by increasing the contact area therebetween.

In some embodiments, the well contact region 114a may be entirely formed on a surface of the second well region 110b exposed by the groove 138. Accordingly, the well contact region 114a may be formed on the second well region 110b exposed from the bottom and sidewall of the groove 138. The structure of the well contact region 114a may further reduce contact resistance between the source electrode layer 140 and the second well region 110b.

Figure 43:
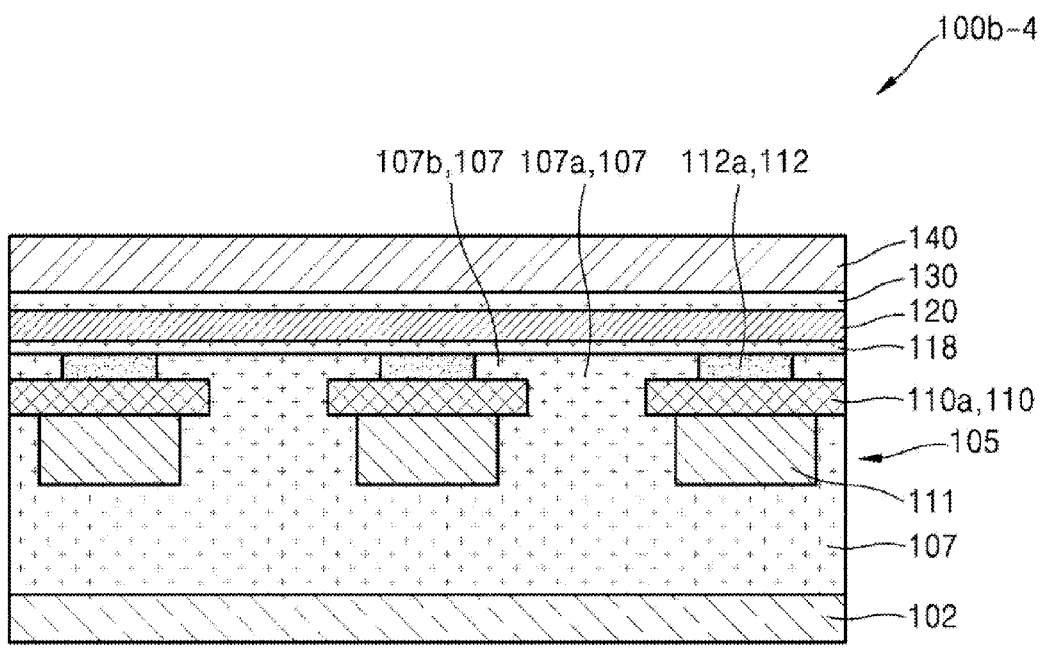

Referring to FIG. 43, in the power semiconductor device 100b-4, a channel region 107b may be formed in the semiconductor layer 105 between the drift region 107 and the source region 112. For example, the channel region 107b may be formed in the semiconductor layer 105 between the protruding portion 107a of the drift region 107 and the first source region 112a. The channel region 107b may have the first conductivity type such that an accumulation channel is formed.

For example, the channel region 107b may have the same doping type as the source region 112 and the drift region 107. In this case, the source region 112, the channel region 107b, and the drift region 107 may have a structure that is normally electrically connected. However, in the structure of the semiconductor layer 105 of silicon carbide, a band of the channel region 107b is bent upward due to influence of negative charges generated when carbon clusters are formed in the gate insulating layer 118, thereby causing a potential barrier. Accordingly, when an operation voltage is applied to the gate electrode layer 120, the accumulation channel that allows the flow of electric charges or current may be formed in the channel region 107b.

Therefore, a threshold voltage to be applied to the gate electrode layer 120 to form the accumulation channel in the channel region 107b may be significantly lower than a threshold voltage to be applied to the gate electrode layer 120 to form a conventional inversion channel.

In some embodiments, the channel region 107b may be a part of the drift region 107. Specifically, the channel region 107b may be a part of the protruding portion 107a of the drift region 107. For example, the channel region 107b may be integrally formed with the drift region 107.

The drift region 107 may be connected to the source region 112 through the channel region 107b. Specifically, in the channel region 107b, the protruding portion 107a of the drift region 107 and the first source region 112a may be in contact with each other.

For example, the doping concentration of the impurities of the first conductivity type in the channel region 107b may be the same as other parts of the drift region 107 or may be different therefrom for adjusting the threshold voltage.

In some embodiments, the first well region 110a may be formed under the first source region 112a to further protrude toward the protruding portion 107a of the drift region 107 than the first source region 112a. The channel region 107b may be formed in the semiconductor layer 105 on the protruding portion of the first well region 110a. For example, the protruding portion 107a of the drift region 107 may be further extended to a groove portion between the first well region 110a and the gate electrode layer 120, and the channel region 107b may be formed thereon. This structure may allow the channel region 107b to be defined between the gate electrode layer 120 and the well region 110.

In some embodiments, the first well region 110a and the first source region 112a may have the same width. In this case, the first source region 112a may be in contact with the protruding portion 107a of the drift region 107, and the channel region 107b may be defined at a part in contact with the protruding portion 107a.

Figure 44:
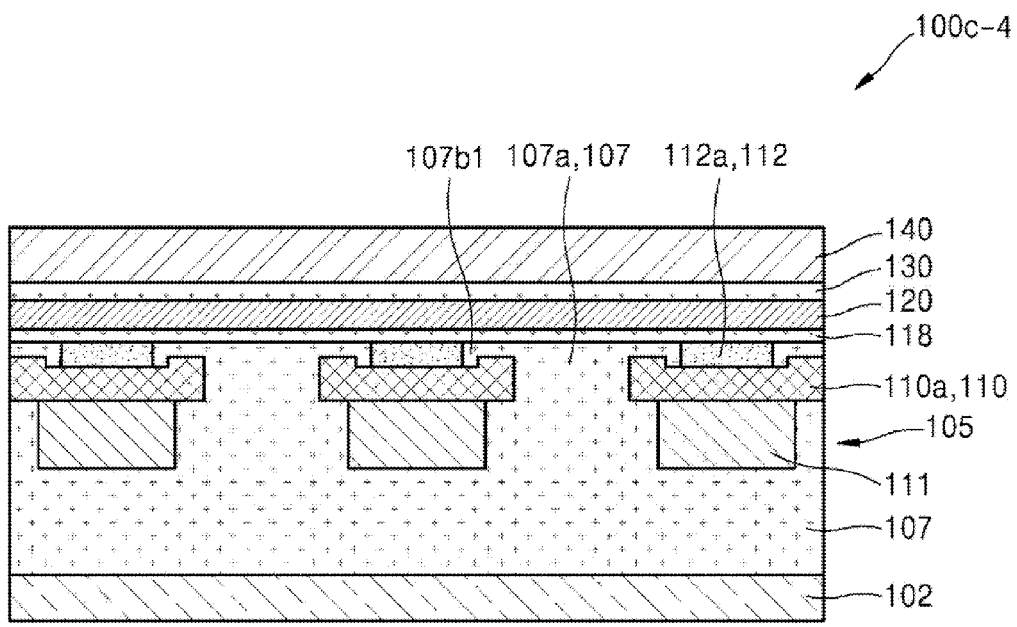

Referring to FIG. 44, in the power semiconductor device 100c-4, the first well region 110a may further protrude from the first source region 112a toward the protruding portion 107a of the drift region 107, and may include a tab portion extending toward the gate electrode layer 120 at an end thereof.

A channel region 107b1 may be formed in the semiconductor layer 105 on the protruding portion of the first well region 110a. For example, the channel region 107b1 may be formed in a bent shape on the protruding portion and the tab portion of the first well region 110a. This structure may allow the channel region 107b1 to be more limited between the gate electrode layer 120 and the first well region 110a.

Figure 45:
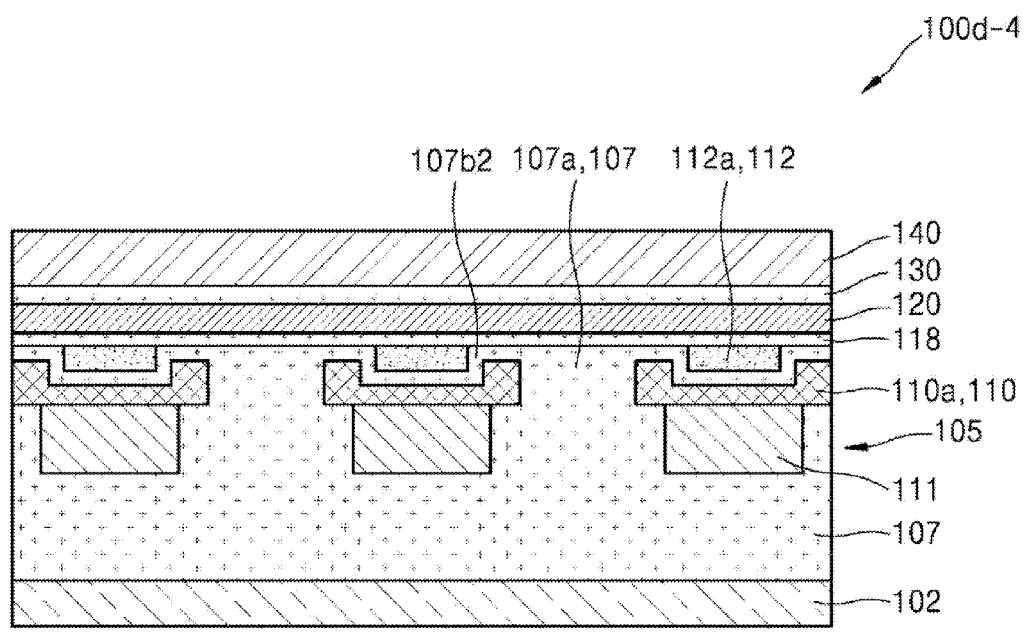

Referring to FIG. 45, in the power semiconductor device 100d-4, the first well region 110a may further protrude from the first source region 112a toward the protruding portion 107a of the drift region 107, and may include a tab portion extending toward the gate electrode layer 120 at an end thereof. Furthermore, the protruding portion 107a of the drift region 107 may further extend between a lower part of the first source region 112a and the first well region 110a.

A channel region 107b2 may be formed to extend further into the semiconductor layer 105 between the lower part of the first source region 112a and the first well region 110a. For example, the channel region 107b2 may be formed in a bent shape from an upper part of the tab portion of the first well region 110a to the lower part of the first source region 112a. This structure may contribute to widening the contact area between the channel region 107b2 and the first source region 112a.

Figure 46:
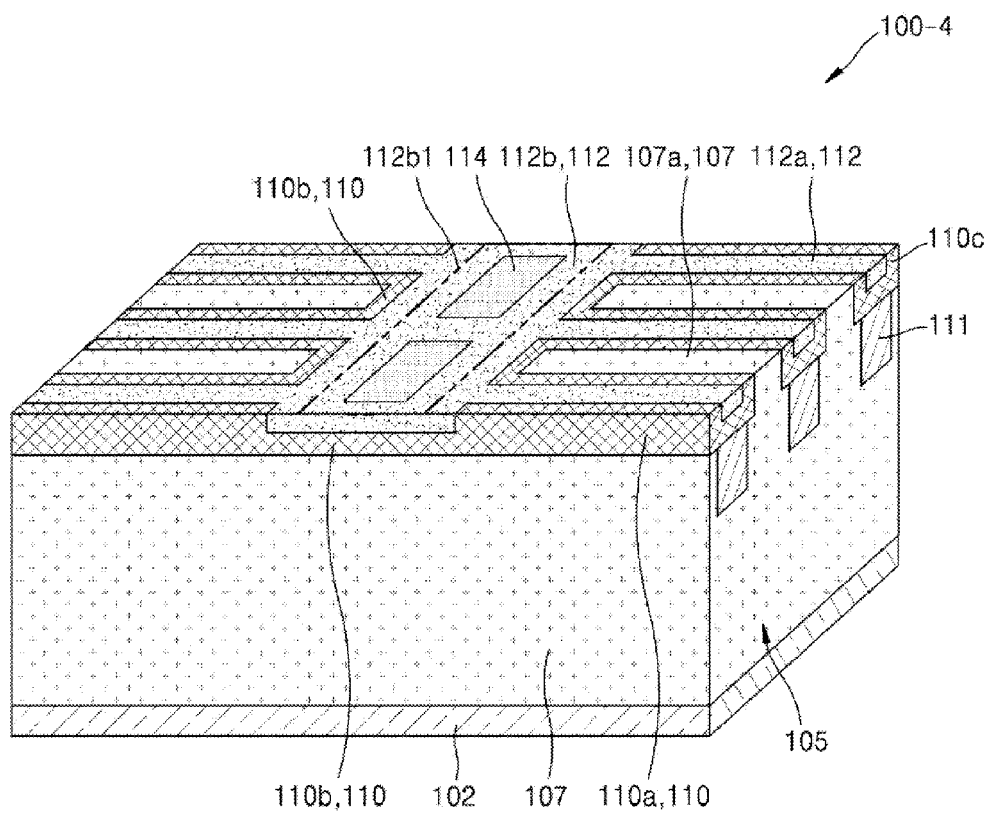
FIGS. 46 to 48 are schematic perspective views illustrating a method of fabricating a power semiconductor device according to an embodiment of the present disclosure.
Figure 47:
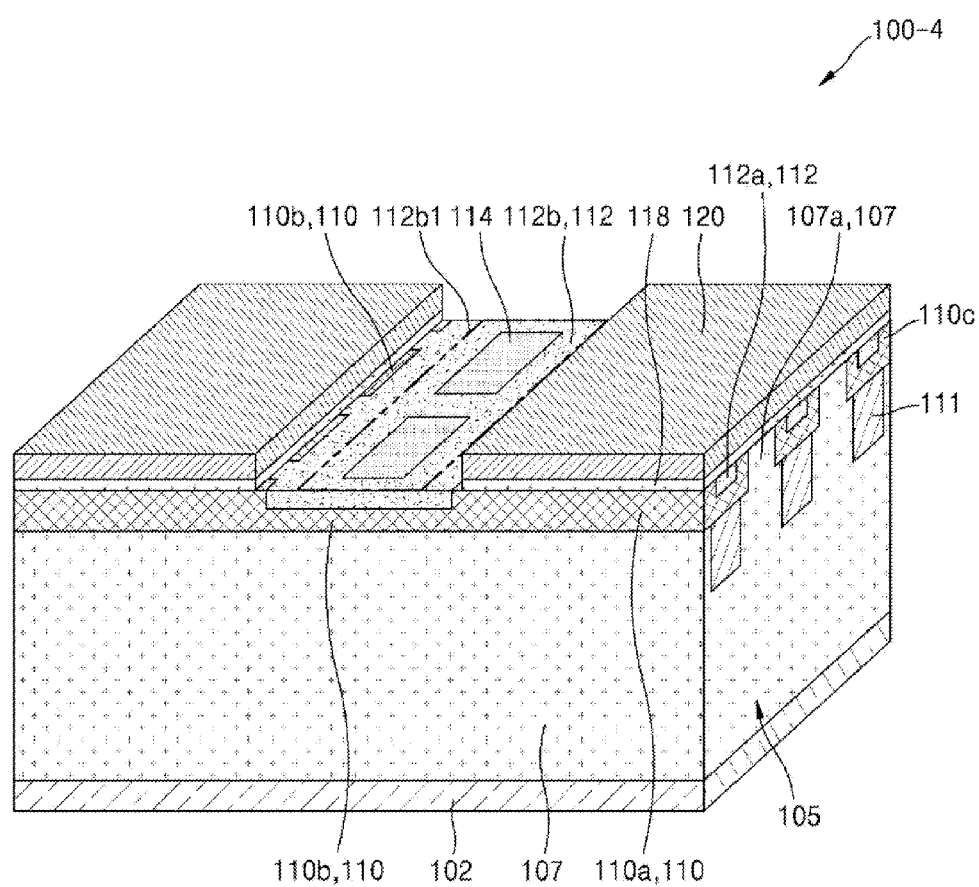
Figure 48:
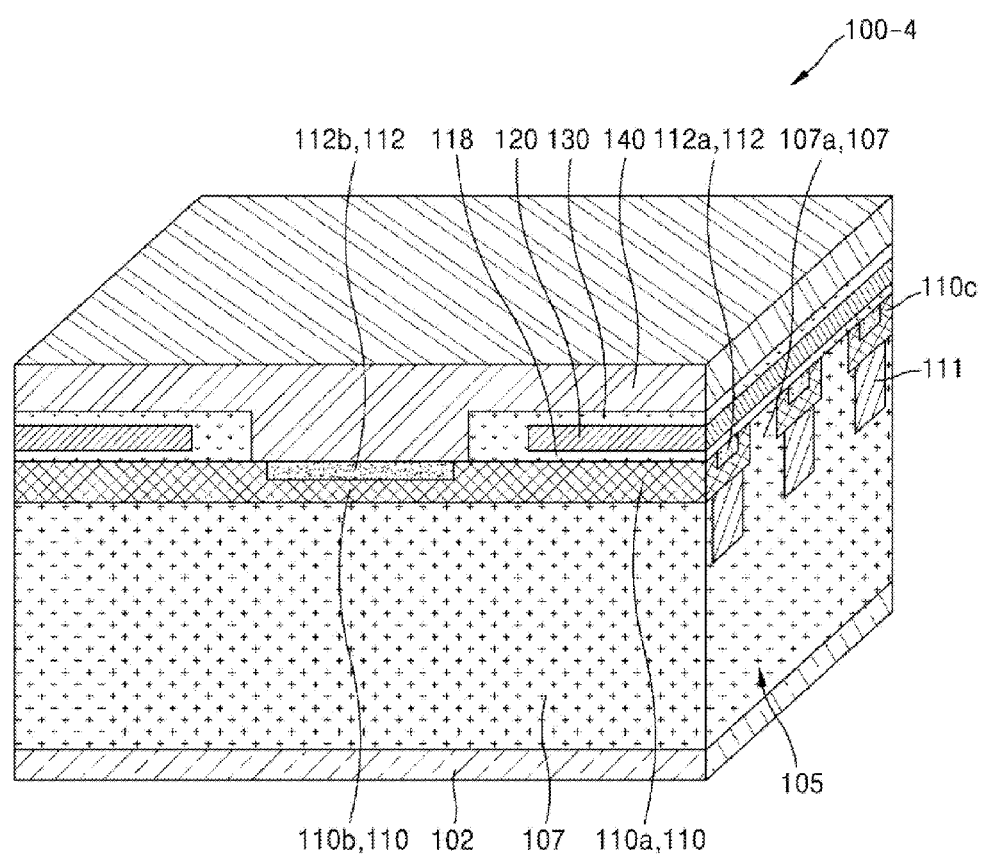

FIGS. 46 to 48 are schematic perspective views illustrating a method of fabricating the power semiconductor device 100-4 according to an embodiment of the present disclosure.

Referring to FIG. 46, the drift region 107 having the first conductivity type may be formed in the semiconductor layer 105 of silicon carbide (SiC) to provide a vertical movement path of charges. For example, the drift region 107 may be formed on the drain region 102 having the first conductivity type. In some embodiments, the drain region 102 may be provided as a substrate of the first conductivity type, and the drift region 107 may be formed as one or the plurality of epitaxial layers on the substrate.

Subsequently, the well region 110 having the second conductivity type may be formed in the semiconductor layer 105 to be in contact with the at least a part of the drift region 107. For example, the forming of the well region 110 may be performed by implanting impurities of the second conductivity type into the semiconductor layer 105.

In detail, the well region 110 may be formed on the semiconductor layer 105 in contact with the protruding portion 107a to define at least one protruding portion 107a of the drift region 107. Specifically, the well region 110 may be formed by doping the drift region 107 or the semiconductor layer 105 with impurities of conductivity type opposite to the drift region 107.

The well region 110 may be divided into the first well region 110a under the gate electrode layer 120 and the second well region 110b outside the gate electrode layer 120. For example, the first well region 110a may define the protruding portion 107a of the drift region 107, and the well contact region 114 may be formed in the second well region 110b later. The first well region 110a and the second well region 110b may be connected to each other.

The deep well region 111 may be formed in the semiconductor layer 105 under the well region 110 to be in contact with the well region 110 and the drift region 107. The deep well region 111 may have the second conductivity type which is opposite to that of the drift region 107 and identical to that of the well region 110. For example, the deep well region 111 may be formed by implanting the impurities of the second conductivity type into the semiconductor layer 105 or the drift region 107.

Further, a source region 112 having the first conductivity type may be formed on or in the well region 110.

For example, the forming of the source region 112 may be performed by implanting impurities of the first conductivity type into the well region 110 or into the semiconductor layer 105.

For example, the forming of the source region 112 may include forming the first source region 112a on or in the first well region 110a and forming the second source region 112b on the second well region 110b or in the second well region 110b. A part of the second source region 112b may be allocated as the source contact region 112b1 to be connected to the source electrode layer 140. The first source region 112a and the second source region 112b may be connected to each other. The source region 112 may be formed substantially from a surface of the semiconductor layer 105 into the well region 110 or above the well region 110, with a certain depth.

In addition to the formation of the source region 112, the channel region 110c having the second conductivity type may be formed to form the inversion channel in the semiconductor layer 105 between the source region 112 and the drift region 107. For example, the channel region 110c may be formed in the semiconductor layer 105 between the protruding portion 107a of the drift region 107 and the first source region 112a. For example, the channel region 110c that is a part of the first well region 110a may not be separately formed but may be formed together with the first well region 110a.

Optionally, the well contact region 114 extending from the second well region 110b through the second source region 112b may be formed in the second source region 112b. For example, the well contact region 114 may be formed by implanting impurities of the second conductivity type into a part of the well region 110 at a higher concentration than the well region 110.

In a modified example of this embodiment, an impurity doping order of the well region 110, the deep well region 111, the source region 112, the channel region 110c, and the well contact region 114 may be appropriately changed.

In the above-described fabricating method, impurity implantation or impurity doping may be performed such that the impurities are mixed when the impurities are implanted into the semiconductor layer 105 or the epitaxial layer is formed. However, for implantation of the impurities in the selective region, an ion implantation method using a mask pattern may be used.

Optionally, after ion implantation, a heat treatment for activating or diffusing the impurities may be followed.

Referring to FIG. 47, the gate insulating layer 118 may be formed on at least a part of the semiconductor layer 105. For example, the gate insulating layer 118 may be formed on at least the channel region 110c and the protruding portion 107a of the drift region 107.

For example, the gate insulating layer 118 may be formed by oxidizing the semiconductor layer 105 to form an oxide, or by depositing an insulating material such as oxide or nitride on the semiconductor layer 105.

Subsequently, the gate electrode layers 120 may be formed on the gate insulating layer 118. For example, the gate electrode layers 120 may be formed by forming a conductive layer on the gate insulating layer 118 and then patterning the conductive layer. The gate electrode layer 120 may be formed by doping polysilicon with impurities, or may be formed to include a conductive metal or metal silicide.

The patterning process may be performed using photo lithography and etching processes. The photolithography process may include a process which forms a photoresist pattern as a mask layer using a photo process and a development process. The etching process may include a process which selectively etches an underlying structure using the photoresist pattern.

Referring to FIG. 48, the interlayer insulating layer 130 may be formed on the gate electrode layers 120. Optionally, when the interlayer insulating layer 130 is entirely formed on the underlying structure, a process which forms a contact hole pattern for exposing the source contact region 112b1 and the well contact region 114 may be followed.

Subsequently, the source electrode layer 140 may be formed on the semiconductor layer 105 to be connected to the second source region 112b and the well contact region 114. For example, the source electrode layer 140 may be formed by forming a conductive layer, such as a metal layer, on the interlayer insulating layer 130 and then patterning or planarizing the conductive layer.

Meanwhile, the power semiconductor device 100a-4 of FIG. 42 may be fabricated by adding or modifying some processes to the fabricating process of the power semiconductor device 100-4 described above.

The fabricating of the power semiconductor device 100a-4 of FIG. 42 may further include forming at least one groove 138 through the second source region 112b and exposing the second well region 110b in the second source region 112b, forming the well contact region 114 to be in contact with the well region 110 on a bottom surface of the groove 138, and filling the groove 138 to form the source electrode layer 140 to be connected to the source region 112 and the well contact region 114.

Meanwhile, when the power semiconductor devices 100*b*-4, 100*c*-4, and 100*d*-4 of FIGS. 43 to 45 are fabricated, the channel regions 107*b*, 107*b*1, and 107*b*2 may have the first conductive type to form the accumulation channel. For example, the channel regions 107*b*, 107*b*1, and 107*b*2 may be formed as a part of the drift region 107.

According to the above-described fabricating method, it is possible to economically fabricate the highly integrated power semiconductor device 100-4 by using a process used in an existing silicon substrate, using the semiconductor layer 105 of silicon carbide.

Figure 49:
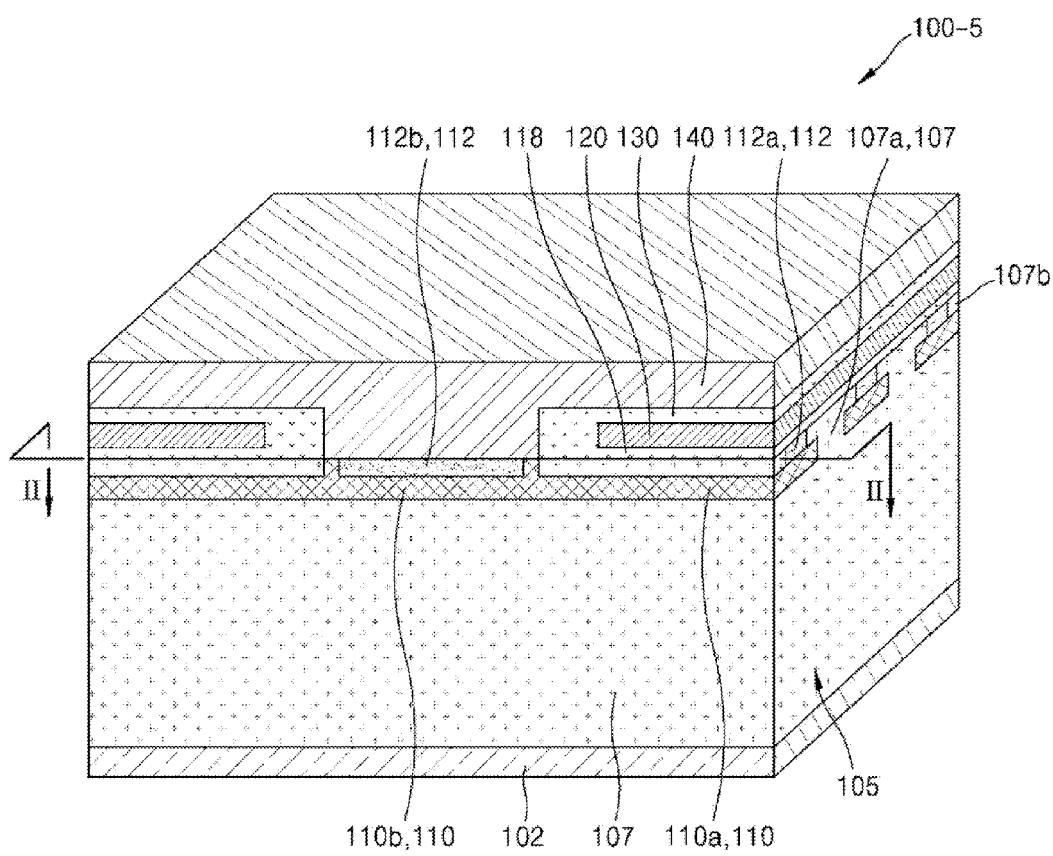
FIG. 49 is a schematic perspective view showing a power semiconductor device according to an embodiment of the present disclosure.
Figure 50:
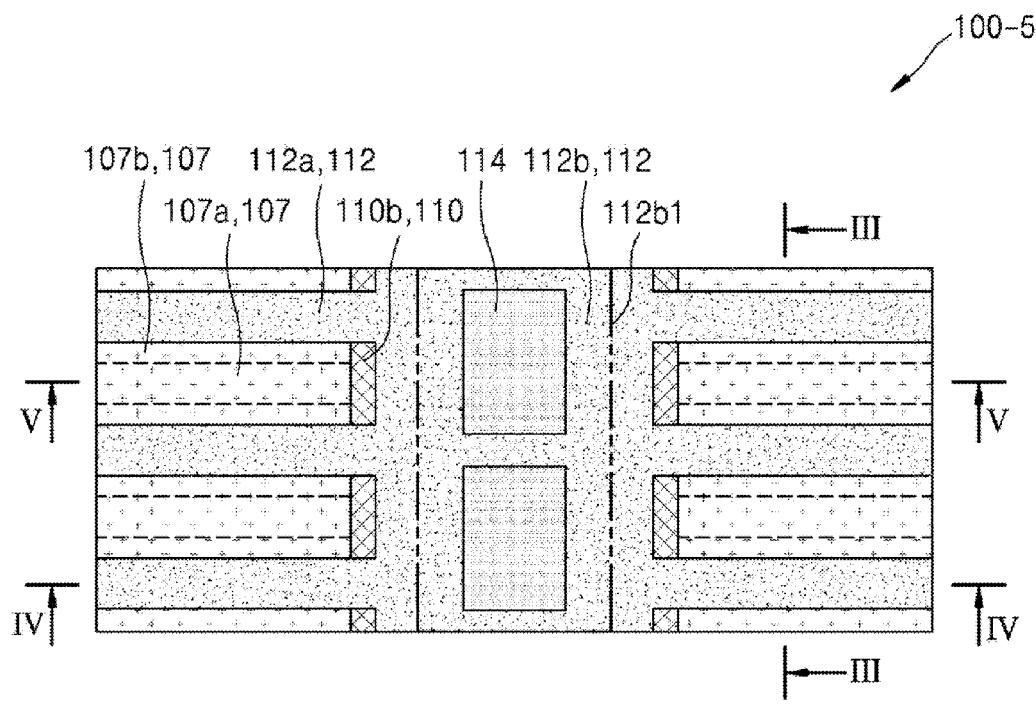
FIG. 50 is a plan view illustrating the power semiconductor device taken along line II-II of FIG. 49.
Figure 51:
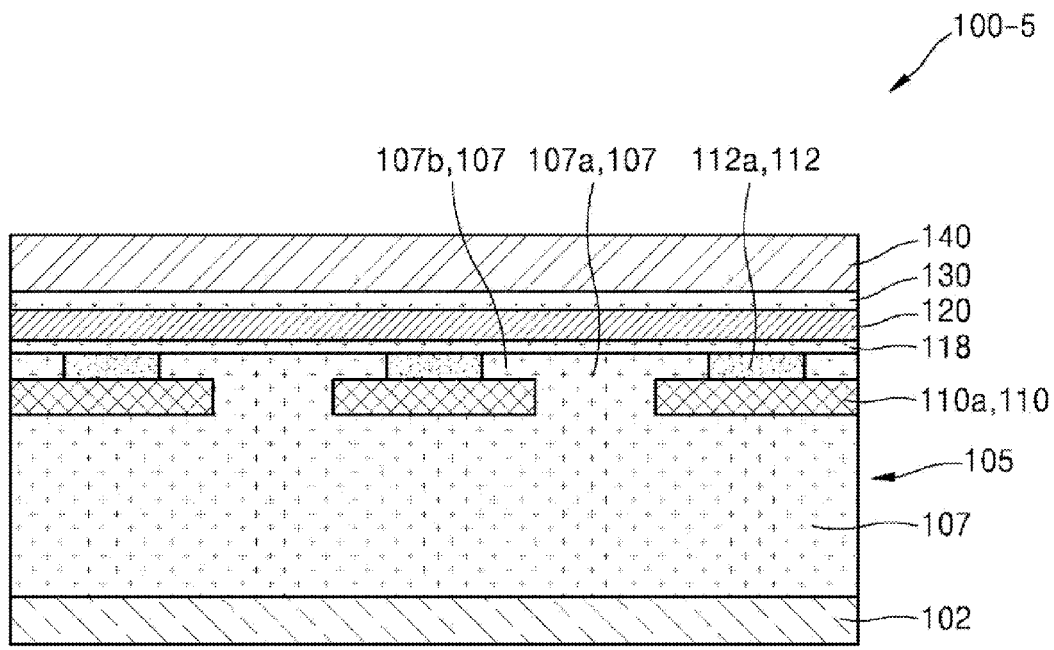
FIG. 51 is a cross-sectional view illustrating the power semiconductor device taken along line III-III of FIG. 50.
Figure 52:
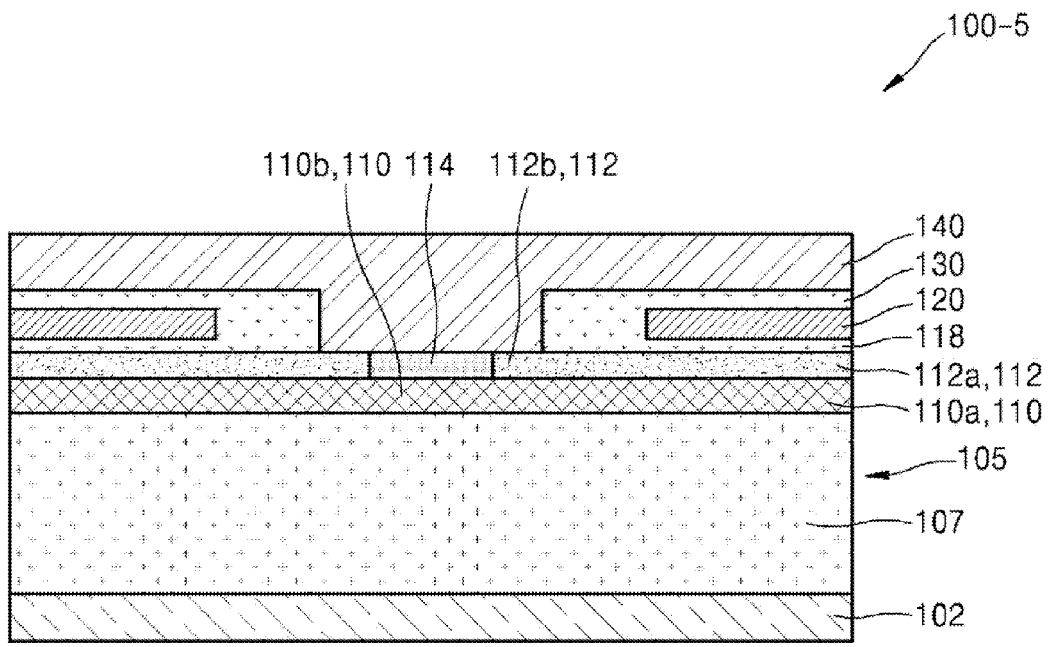
FIG. 52 is a cross-sectional view illustrating the power semiconductor device taken along line IV-IV of FIG. 50.
Figure 53:
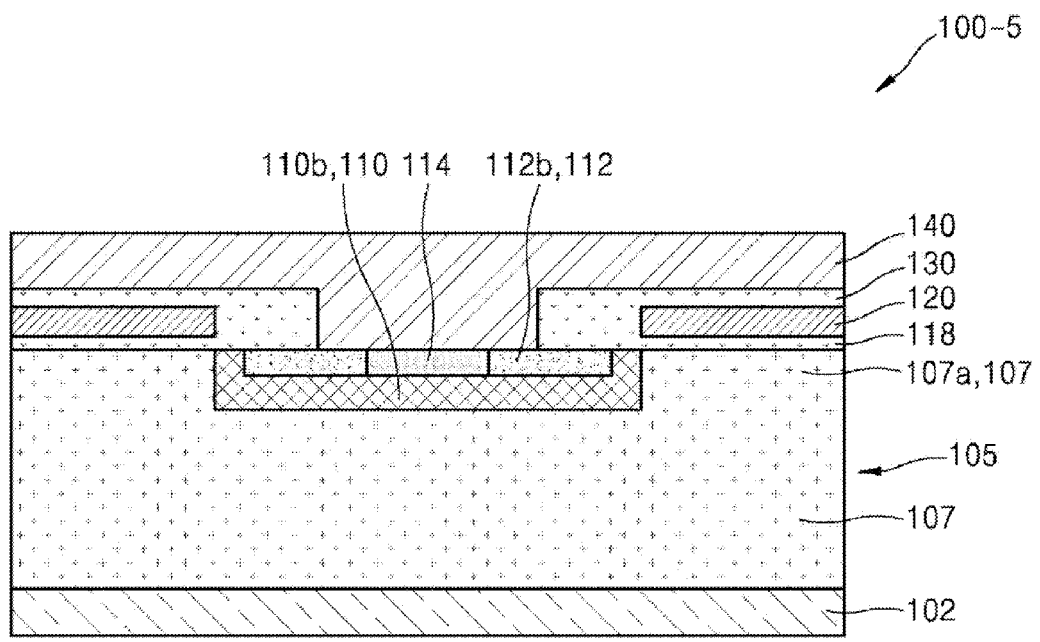
FIG. 53 is a cross-sectional view illustrating the power semiconductor device taken along line V-V of FIG. 50.

FIG. 49 is a schematic perspective view showing a power semiconductor device 100-5 according to an embodiment of the present disclosure, FIG. 50 is a plan view illustrating the power semiconductor device 100-5 taken along line II-II of FIG. 49, FIG. 51 is a cross-sectional view illustrating the power semiconductor device 100-5 taken along line III-III of FIG. 50, FIG. 52 is a cross-sectional view illustrating the power semiconductor device 100-5 taken along line IV-IV of FIG. 50, and FIG. 53 is a cross-sectional view illustrating the power semiconductor device 100-5 taken along line V-V of FIG. 50.

Referring to FIGS. 49 to 53, the power semiconductor device 100-5 may include at least a semiconductor layer 105, a gate insulating layer 118, and a gate electrode layer 120. For example, the power semiconductor device 100-5 may have a power MOSFET structure.

The semiconductor layer 105 may refer to one or a plurality of layers of semiconductor material, and may refer to, for example, one or a plurality of epitaxial layers. Furthermore, the semiconductor layer 105 may refer to one or a plurality of epitaxial layers on a semiconductor substrate.

For example, the semiconductor layer 105 may be formed of silicon carbide (SiC). Specifically, the semiconductor layer 105 may include at least one epitaxial layer of silicon carbide.

Silicon carbide (SiC) may have a wider bandgap compared to silicon, and thus may maintain stability even at a high temperature. In addition, because a breakdown electric field of the silicon carbide is higher than that of the silicon, the silicon carbide may stably operate even at a high temperature. Accordingly, the power semiconductor device 100-1 using the silicon carbide as the semiconductor layer 105 shows stable operational characteristics due to higher breakdown voltage and excellent heat release compared to silicon.

Specifically, the semiconductor layer 105 may include a drift region 107. The drift region 107 may have a first conductivity type, and may be formed by implanting impurities of the first conductivity type into a part of the semiconductor layer 105. For example, the drift region 107 may be formed by doping the impurities of the first conductivity type in the epitaxial layer of silicon carbide.

The drift region 107 may provide a vertical movement path for electric charges. Furthermore, the drift region 107 may include at least one protruding portion 107*a* disposed under the gate electrode layer 120. The protruding portion 107*a* may extend substantially onto a surface of the semiconductor layer 105.

A well region 110 may be formed in the semiconductor layer 105 to be in contact with at least a part of the drift region 107, and may have a second conductivity type. For example, the well region 110 may be formed by doping impurities of the second conductivity type opposite to the first conductivity type in the semiconductor layer 105 or the drift region 107.

For example, the well region 110 may include a first well region 110*a* formed in the semiconductor layer 105 under the gate electrode layer 120 and in contact with the protruding portion 107*a* of the drift region 107 and a second well region 110*b* formed in the semiconductor layer 105 outside the gate electrode layer 120. The first well region 110*a* and the second well region 110*b* may be connected to each other. Substantially, a lower part of the protruding portion 107*a* of the drift region 107 may be defined by the first well region 110*a*, and specifically, may be in contact with a sidewall of the first well region 110*a*.

A source region 112 may be formed on or in the well region 110 and may have the first conductivity type. For example, the source region 112 may be formed by doping the semiconductor layer 105 or the well region 110 with impurities of the first conductivity type. The source region 112 may be formed by doping with a higher concentration of the impurities of the first conductivity type than the drift region 107.

For example, the source region 112 may include a first source region 112*a* formed on the first well region 110*a* and a second source region 112*b* formed on the second well region 110*b*. The first source region 112*a* and the second source region 112*b* may be connected to each other. The first source region 112*a* may be disposed under the gate electrode layer 120, and the second source region 112*b* may be disposed outside the gate electrode layer 120.

The second source region 112*b* may include a source contact region 112*b*1 connected to a source electrode layer 140 outside the gate electrode layer 120. For example, the source contact region 112*b*1 may be a part of the second source region 112*b* and may refer to a part to which the source electrode layer 140 is connected.

A well contact region 114 may be formed in the second source region 112*b*, specifically, in the source contact region 112*b*1. For example, the well contact region 114 may be extended from the second well region 110*b* through the second source region 112*b*, and may have the second conductivity type. One or a plurality of well contact regions 114 may be formed in the source contact region 112*b*1.

The well contact region 114 may be connected to the source electrode layer 140. When connected to the source electrode layer 140, the well contact region 114 may be formed by doping with a higher concentration of the impurities of the second conductivity type than the well region 110 for lowering contact resistance.

A channel region 107*b* may be formed in the semiconductor layer 105 between the drift region 107 and the source region 112. For example, the channel region 107*b* may be formed in the semiconductor layer 105 between the protruding portion 107*a* of the drift region 107 and the first source region 112*a*. The channel region 107*b* may have the first conductivity type such that an accumulation channel is formed.

For example, the channel region 107*b* may have the same doping type as the source region 112 and the drift region 107. In this case, the source region 112, the channel region 107*b*, and the drift region 107 may have a structure that is normally electrically connected. However, in the structure of the semiconductor layer 105 of silicon carbide, a band of the channel region 107*b* is bent upward due to influence of negative charges generated when carbon clusters are formed in the gate insulating layer 118, thereby causing a potential barrier. Accordingly, when an operation voltage is applied to the gate electrode layer 120, the accumulation channel that allows the flow of electric charges or current may be formed in the channel region 107b.

Therefore, a threshold voltage to be applied to the gate electrode layer 120 to form the accumulation channel in the channel region 107b may be significantly lower than a threshold voltage to be applied to the gate electrode layer 120 to form a conventional inversion channel.

In some embodiments, the channel region 107b may be a part of the drift region 107. Specifically, the channel region 107b may be a part of the protruding portion 107a of the drift region 107. For example, the channel region 107b may be integrally formed with the drift region 107.

The drift region 107 may be connected to the source region 112 through the channel region 107b. Specifically, in the channel region 107b, the protruding portion 107a of the drift region 107 and the first source region 112a may be in contact with each other.

For example, a doping concentration of the impurities of the first conductivity type in the channel region 107b may be the same as other parts of the drift region 107 or may be different therefrom for adjusting the threshold voltage.

In some embodiments, the first well region 110a may be formed under the first source region 112a to further protrude toward the protruding portion 107a of the drift region 107 than the first source region 112a. The channel region 107b may be formed in the semiconductor layer 105 on the protruding portion of the first well region 110a. For example, the protruding portion 107a of the drift region 107 may be further extended to a groove portion between the first well region 110a and the gate electrode layer 120, and the channel region 107b may be formed thereon. This structure may allow the channel region 107b to be defined between the gate electrode layer 120 and the well region 110.

In some embodiments, the first well region 110a and the first source region 112a may have the same width. In this case, the first source region 112a may be in contact with the protruding portion 107a of the drift region 107, and the channel region 107b may be defined at a part in contact with the protruding portion 107a.

In some embodiments, the protruding portion 107a of the drift region 107, the first well region 110a, the channel region 107b, and/or the first source region 112a may extend in one direction. Here, a direction of the line IV-IV or the line V-V of FIG. 50 may be the one direction. Here, the direction of extension of the channel region 107b does not mean the direction of movement of electric charges.

In some embodiments, the first well region 110a, the channel region 107b, and the first source region 112a may be symmetrically formed with respect to the protruding portion 107a of the drift region 107. For example, the first well region 110a, the channel region 107b, and the first source region 112a may be formed on the semiconductor layers 105 on opposite sides of the protruding portion 107a of the drift region 107, respectively.

In some embodiments, the drift region 107 may include a plurality of protruding portions 107a formed parallel to each other in one direction. For example, the first well region 110a may be formed in a stripe pattern extending in the one direction, and the protruding portions 107a may also be formed in a stripe pattern.

In addition, the first source region 112a may be formed in a stripe pattern on the first well region 110a. The channel region 107b may be formed between the protruding portions 107a of the drift region 107 and the first source region 112a.

In some embodiments, the first well regions 110a may be formed symmetrically with respect to the second well region 110b, and the first source regions 112a may be formed symmetrically with respect to the second source region 112b. In this case, the protruding portions 107a of the drift region 107 and the channel region 107b may be formed symmetrically with respect to the second well region 110b or the second source region 112b.

Further, the first well region 110a and the second well region 110b may be formed repeatedly and alternately in one direction. In this case, the first source region 112a and the second source region 112b may also be repeatedly formed.

Additionally, a drain region 102 may be formed in the semiconductor layer 105 under the drift region 107 and may have the first conductivity type. For example, the drain region 102 may be doped with a higher concentration than the drift region 107.

In some embodiments, the drain region 102 may be provided as a substrate of silicon carbide having the first conductivity type. In this case, the drain region 102 may be understood as a part of the semiconductor layer 105 or a separate substrate from the semiconductor layer 105.

The gate insulating layer 118 may be formed on at least a part of the semiconductor layer 105. For example, the gate insulating layer 118 may be formed on at least the channel region 107b. Specifically, the gate insulating layer 118 may be formed on the first source region 112a, the channel region 107b, and the protruding portion 107a of the drift region 107.

For example, the gate insulating layer 118 may include an insulating material such as silicon oxide, silicon carbide oxide, silicon nitride, hafnium oxide, zirconium oxide, aluminum oxide, or a stacked structure thereof.

At least one gate electrode layer 120 may be formed on the gate insulating layer 118. For example, the gate electrode layer 120 may be formed on at least the channel region 107b. Specifically, the gate electrode layer 120 may be formed on the first source region 112a, the channel region 107b, and the protruding portion 107a of the drift region 107. The second well region 110b, the second source region 112b, and the well contact region 114 may be disposed outside the gate electrode layer 120 and may be exposed from the gate electrode layer 120.

For example, the gate electrode layer 120 may include a suitable conductive material, such as polysilicon, metal, metal nitride, metal silicide, or the like, or may include a stacked structure thereof.

An interlayer insulating layer 130 may be formed on the gate electrode layer 120. For example, the interlayer insulating layer 130 may include a suitable insulating material, such as an oxide layer, a nitride layer, or a stacked structure thereof.

The source electrode layer 140 may be formed on the interlayer insulating layer 130 and may be connected to the source region 112, specifically, the second source region 112b or the source contact region 112b1. Furthermore, the source electrode layer 140 may be commonly connected to the second source region 112b and the well contact region 114. For example, the source electrode layer 140 may be formed of an appropriate conductive material, metal, or the like.

In the above-described power semiconductor device 100-5, the first conductivity type and the second conductivity type may have opposite conductivity types, but may be any one of n-type and p-type, respectively. For example, when the first conductivity type is n-type, the second conductivity type is p-type, and vice versa.

Specifically, when the power semiconductor device 100-5 is an N-type MOSFET, the drift region 107 and the channel region 107b may be N− regions, the source region 112 and the drain region 102 may be N+ regions, the well region 110 may be a P− region, and the well contact region 114 may be a P+ region.

During the operation of the power semiconductor device 100-5, current may generally flow in a vertical direction from the drain region 102 along the protruding portions 107a of the drift region 107, and then may flow through the channel region 107b to the source region 112.

In the power semiconductor device 100-5 described above, the source contact region 112b and the well contact region 114 may be separately disposed outside the gate electrode layer 120. Accordingly, the first well region 110a and the first source region 112a may be formed such that the protruding portions 107a of the drift region 107 are densely disposed, and thus the channel region 107b may be densely formed under the gate electrode layer 120. Accordingly, the power semiconductor device 100-5 may have a high degree of integration.

Figure 54:
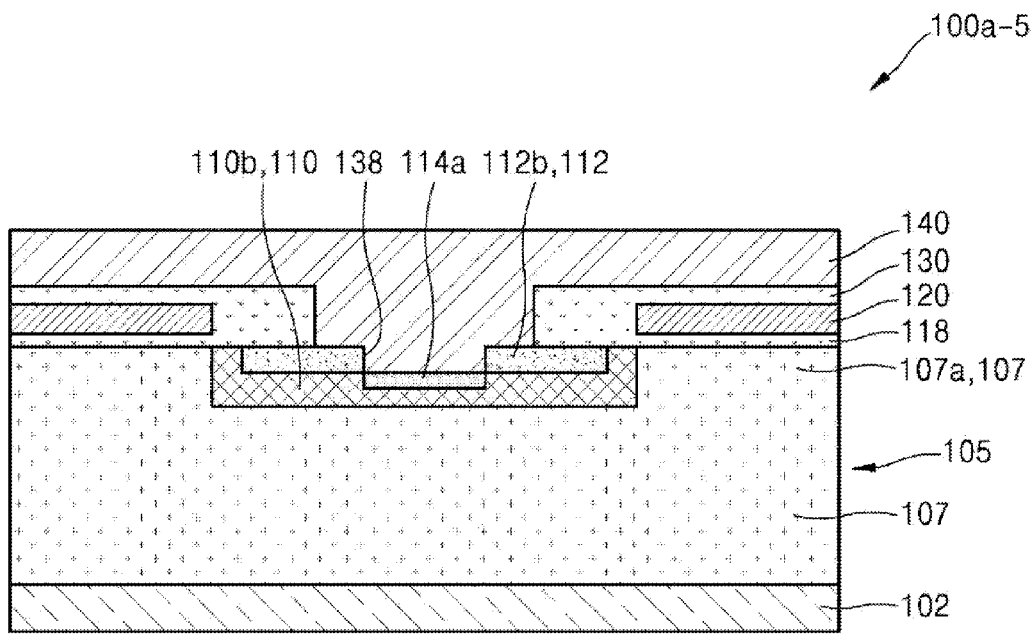
FIGS. 54 to 56 are cross-sectional views illustrating power semiconductor devices according to other embodiments of the present disclosure.
Figure 55:
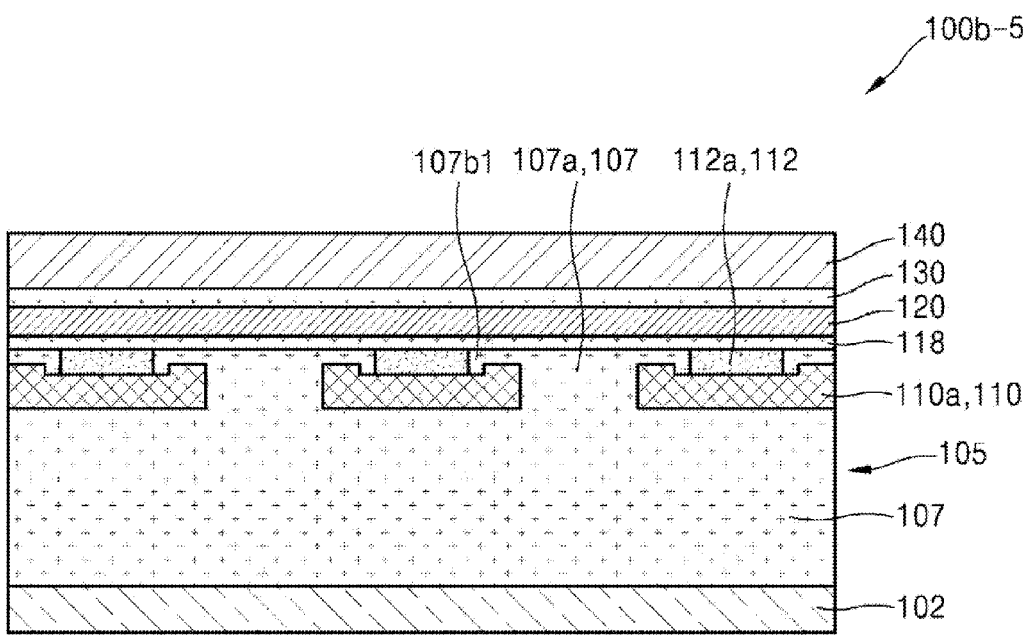
Figure 56:
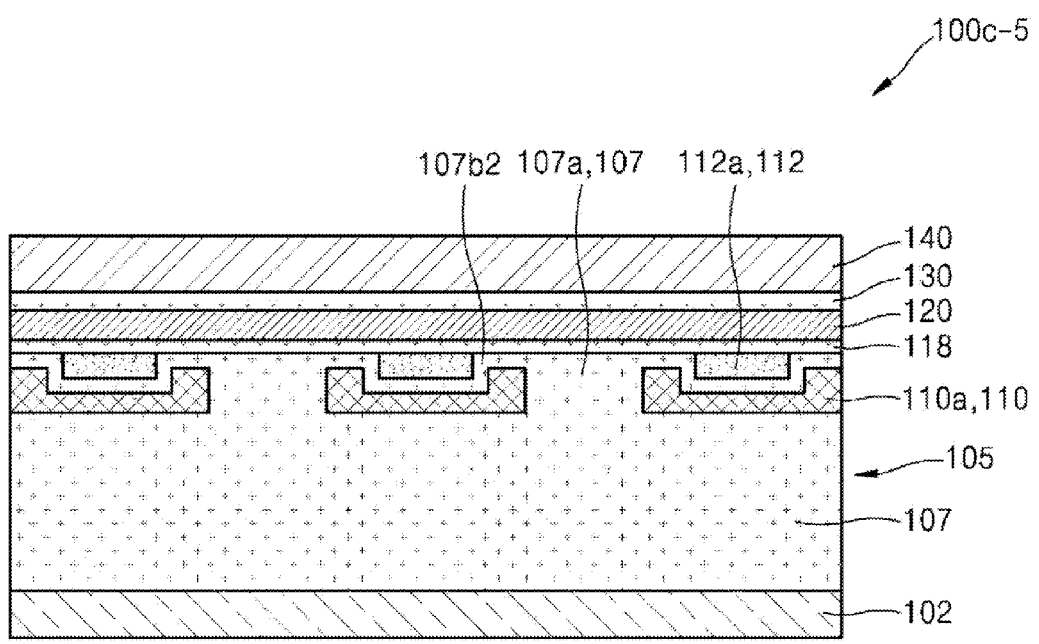

FIGS. 54 to 56 are cross-sectional views illustrating power semiconductor devices 100a-5, 100b-5, and 100c-5 according to other embodiments of the present disclosure. The power semiconductor devices 100a-5, 100b-5, and 100c-5 are partially modified or added to the power semiconductor device 100-5 of FIGS. 49 to 53, and thus the embodiments may refer to each other, and redundant descriptions are omitted.

Referring to FIG. 54, the power semiconductor device 100a-5 may include at least one groove 138 penetrating the second source region 112b and recessed in the second well region 110b with a certain depth. A well contact region 114a may be formed on at least a bottom surface of the groove 138 to be in contact with the second well region 110b.

The source electrode layer 140 may be formed to fill the groove 138, and thus may be connected to the well contact region 114a, the second well region 110b, and/or the second source region 112b. This structure may help to reduce contact resistance between the source electrode layer 140, and the second well region 110b and the second source region 112b by increasing the contact area therebetween.

In some embodiments, the well contact region 114a may be entirely formed on a surface of the second well region 110b exposed by the groove 138. Accordingly, the well contact region 114a may be formed on the second well region 110b exposed from the bottom and sidewall of the groove 138. The structure of the well contact region 114a may further reduce contact resistance between the source electrode layer 140 and the second well region 110b.

Referring to FIG. 55, in the power semiconductor device 100b-5, the first well region 110a may further protrude from the first source region 112a toward the protruding portion 107a of the drift region 107, and may include a tab portion extending toward the gate electrode layer 120 at an end thereof. A channel region 107b1 may be formed in the semiconductor layer 105 on the protruding portion of the first well region 110a. For example, the channel region 107b1 may be formed in a bent shape on the protruding portion and the tab portion of the first well region 110a. This structure may allow the channel region 107b1 to be more limited between the gate electrode layer 120 and the first well region 110a.

Referring to FIG. 56, in the power semiconductor device 100c-5, the first well region 110a may further protrude from the first source region 112a toward the protruding portion 107a of the drift region 107, and may include a tab portion extending toward the gate electrode layer 120 at an end thereof. Furthermore, the protruding portion 107a of the drift region 107 may further extend between a lower part of the first source region 112a and the first well region 110a.

A channel region 107b2 may be formed to extend further into the semiconductor layer 105 between the lower part of the first source region 112a and the first well region 110a. For example, the channel region 107b2 may be formed in a bent shape from an upper part of the tab portion of the first well region 110a to the lower part of the first source region 112a. This structure may contribute to widening the contact area between the channel region 107b2 and the first source region 112a.

Figure 57:
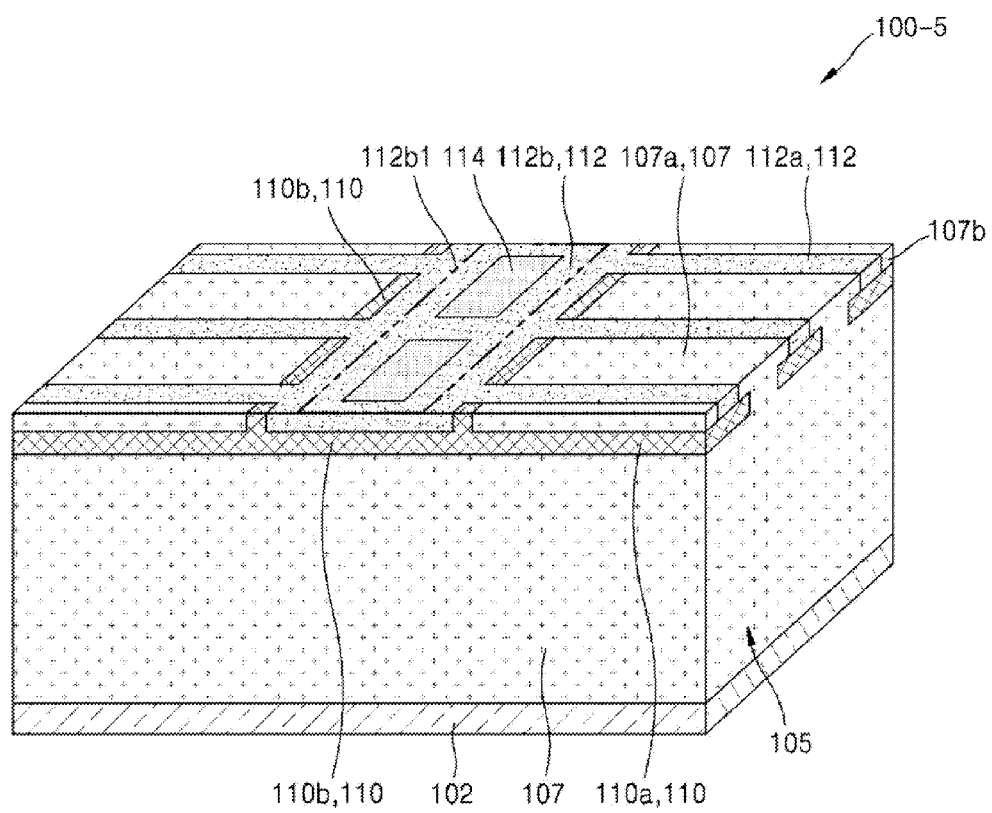
FIGS. 57 to 59 are schematic perspective views illustrating a method of fabricating a power semiconductor device according to an embodiment of the present disclosure.
Figure 58:
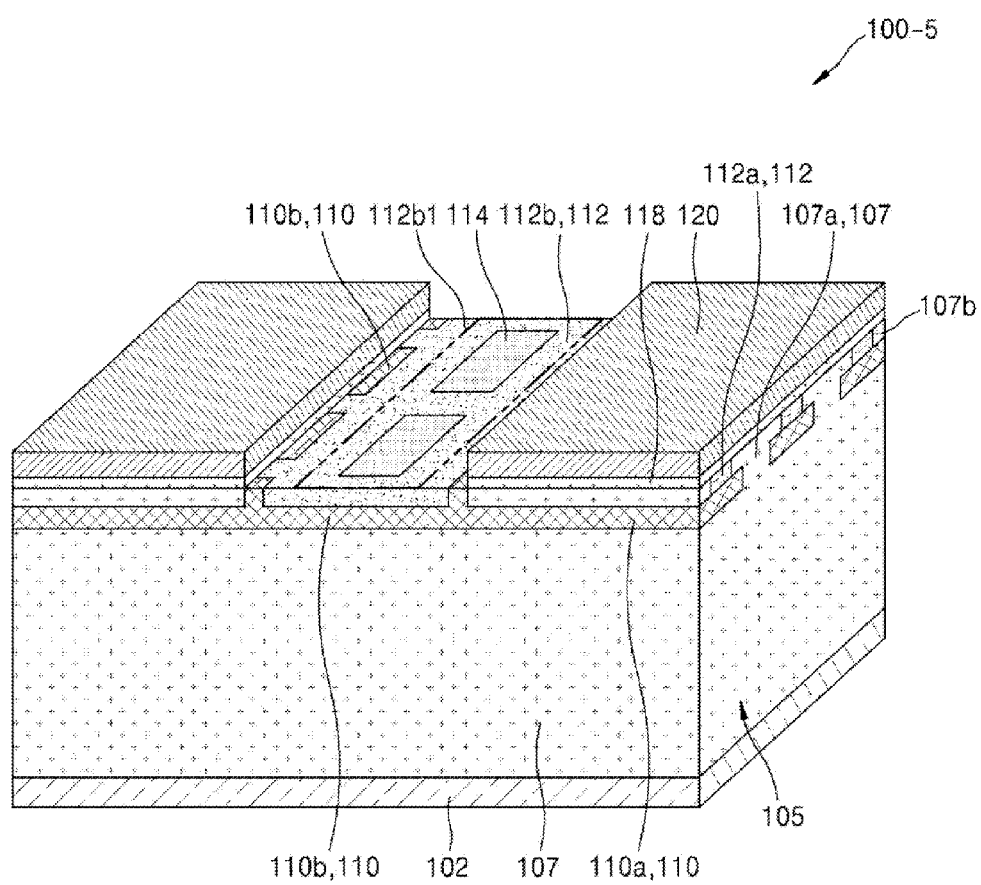
Figure 59:
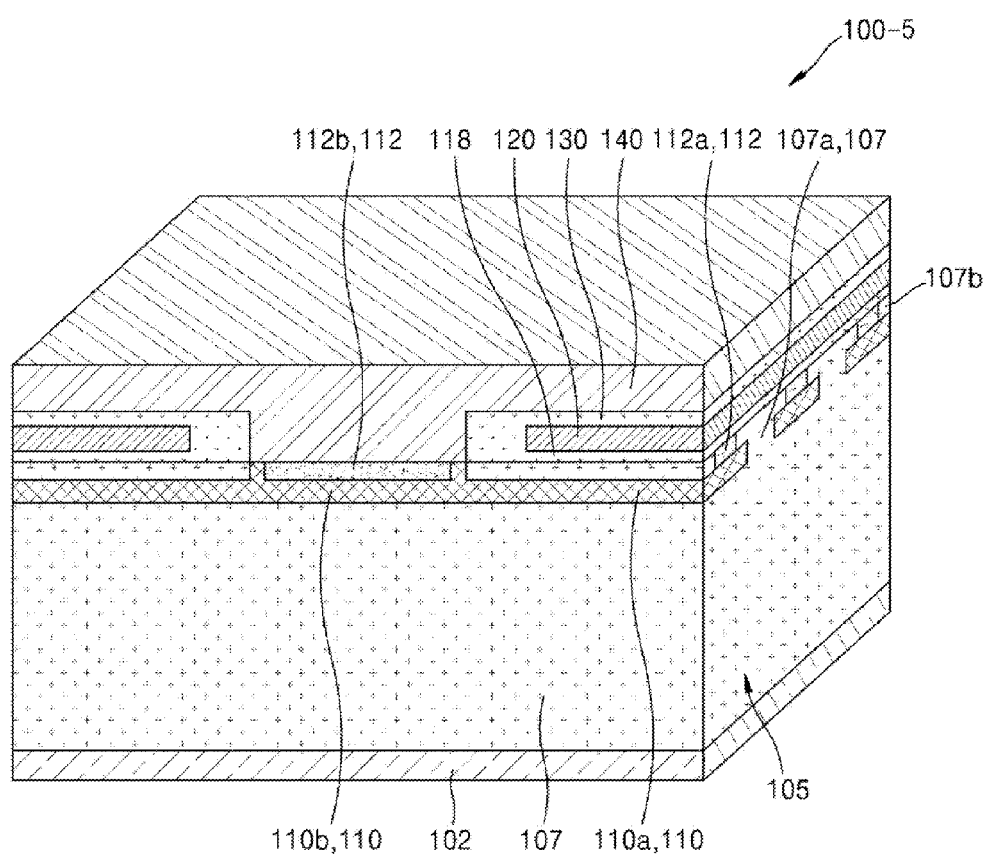

FIGS. 57 to 59 are schematic perspective views illustrating a method of fabricating the power semiconductor device 100-5 according to an embodiment of the present disclosure.

Referring to FIG. 57, the drift region 107 having the first conductivity type may be formed in the semiconductor layer 105 of silicon carbide (SiC) to provide a vertical movement path of charges. For example, the drift region 107 may be formed on the drain region 102 having the first conductivity type. In some embodiments, the drain region 102 may be provided as a substrate of the first conductivity type, and the drift region 107 may be formed as one or the plurality of epitaxial layers on the substrate.

Subsequently, the well region 110 having the second conductivity type may be formed in the semiconductor layer 105 to be in contact with the at least a part of the drift region 107. For example, the forming of the well region 110 may be performed by implanting impurities of the second conductivity type into the semiconductor layer 105.

In detail, the well region 110 may be formed on the semiconductor layer 105 in contact with the protruding portion 107a to define at least one protruding portion 107a of the drift region 107. Specifically, the well region 110 may be formed by doping the drift region 107 or the semiconductor layer 105 with impurities of conductivity type opposite to the drift region 107.

The well region 110 may be divided into the first well region 110a under the gate electrode layer 120 and the second well region 110b outside the gate electrode layer 120. For example, the first well region 110a may define the protruding portion 107a of the drift region 107, and the well contact region 114 may be formed in the second well region 110b later. The first well region 110a and the second well region 110b may be connected to each other.

Further, a source region 112 having the first conductivity type may be formed on or in the well region 110. For example, the forming of the source region 112 may be performed by implanting impurities of the first conductivity type into the well region 110 or into the semiconductor layer 105.

For example, the forming of the source region 112 may include forming the first source region 112a on or in the first well region 110a and forming the second source region 112b on the second well region 110b or in the second well region 110b. A part of the second source region 112b may be allocated as the source contact region 112b1 to be connected to the source electrode layer 140. The first source region 112a and the second source region 112b may be connected to each other. The source region 112 may be formed substantially from a surface of the semiconductor layer 105 into the well region 110 or above the well region 110, with a certain depth.

In addition to the formation of the source region 112, the channel region 107b having the first conductivity type may be formed to form the accumulation channel in the semiconductor layer 105 between the source region 112 and the drift region 107. For example, the channel region 107b may be formed in the semiconductor layer 105 between the protruding portion 107a of the drift region 107 and the first source region 112a. For example, the channel region 107b that is a part of the first well region 110a may not be separately formed but may be formed together with the first well region 110a.

Optionally, the well contact region 114 extending from the second well region 110b through the second source region 112b may be formed in the second source region 112b. For example, the well contact region 114 may be formed by implanting impurities of the second conductivity type into a part of the well region 110 at a higher concentration than the well region 110.

In a modified example of this embodiment, an impurity doping order of the well region 110, the source region 112, the channel region 107b, and the well contact region 114 may be appropriately changed.

In the above-described fabricating method, impurity implantation or impurity doping may be performed such that the impurities are mixed when the impurities are implanted into the semiconductor layer 105 or the epitaxial layer is formed. However, for implantation of the impurities in the selective region, an ion implantation method using a mask pattern may be used.

Optionally, after ion implantation, a heat treatment for activating or diffusing the impurities may be followed.

Referring to FIG. 58, the gate insulating layer 118 may be formed on at least a part of the semiconductor layer 105. For example, the gate insulating layer 118 may be formed on at least the channel region 107b and the protruding portion 107a of the drift region 107.

For example, the gate insulating layer 118 may be formed by oxidizing the semiconductor layer 105 to form an oxide, or by depositing an insulating material such as oxide or nitride on the semiconductor layer 105.

Subsequently, the gate electrode layers 120 may be formed on the gate insulating layer 118. For example, the gate electrode layers 120 may be formed by forming a conductive layer on the gate insulating layer 118 and then patterning the conductive layer. The gate electrode layer 120 may be formed by doping polysilicon with impurities, or may be formed to include a conductive metal or metal silicide.

The patterning process may be performed using photo lithography and etching processes. The photolithography process may include a process which forms a photoresist pattern as a mask layer using a photo process and a development process. The etching process may include a process which selectively etches an underlying structure using the photoresist pattern.

Referring to FIG. 59, the interlayer insulating layer 130 may be formed on the gate electrode layer 120. Optionally, when the interlayer insulating layer 130 is entirely formed on the underlying structure, a process which forms a contact hole pattern for exposing the source contact region 112b1 and the well contact region 114 may be followed.

Subsequently, the source electrode layer 140 may be formed on the semiconductor layer 105 to be connected to the second source region 112b and the well contact region 114. For example, the source electrode layer 140 may be formed by forming a conductive layer, such as a metal layer, on the interlayer insulating layer 130 and then patterning or planarizing the conductive layer.

Meanwhile, the power semiconductor device 100a-5 of FIG. 54 may be fabricated by adding or modifying some processes to the fabricating process of the power semiconductor device 100-5 described above.

The fabricating of the power semiconductor device 100a-5 of FIG. 54 may further include forming at least one groove 138 through the second source region 112b and recessed in the second well region 110b in the second source region 112b, forming the well contact region 114 to be in contact with the well region 110 on a bottom surface of the groove 138, and filling the groove 138 to form the source electrode layer 140 to be connected to the source region 112 and the well contact region 114.

According to the above-described fabricating method, it is possible to economically fabricate the highly integrated power semiconductor device 100-5 by using a process used in an existing silicon substrate, using the semiconductor layer 105 of silicon carbide.

Figure 60:
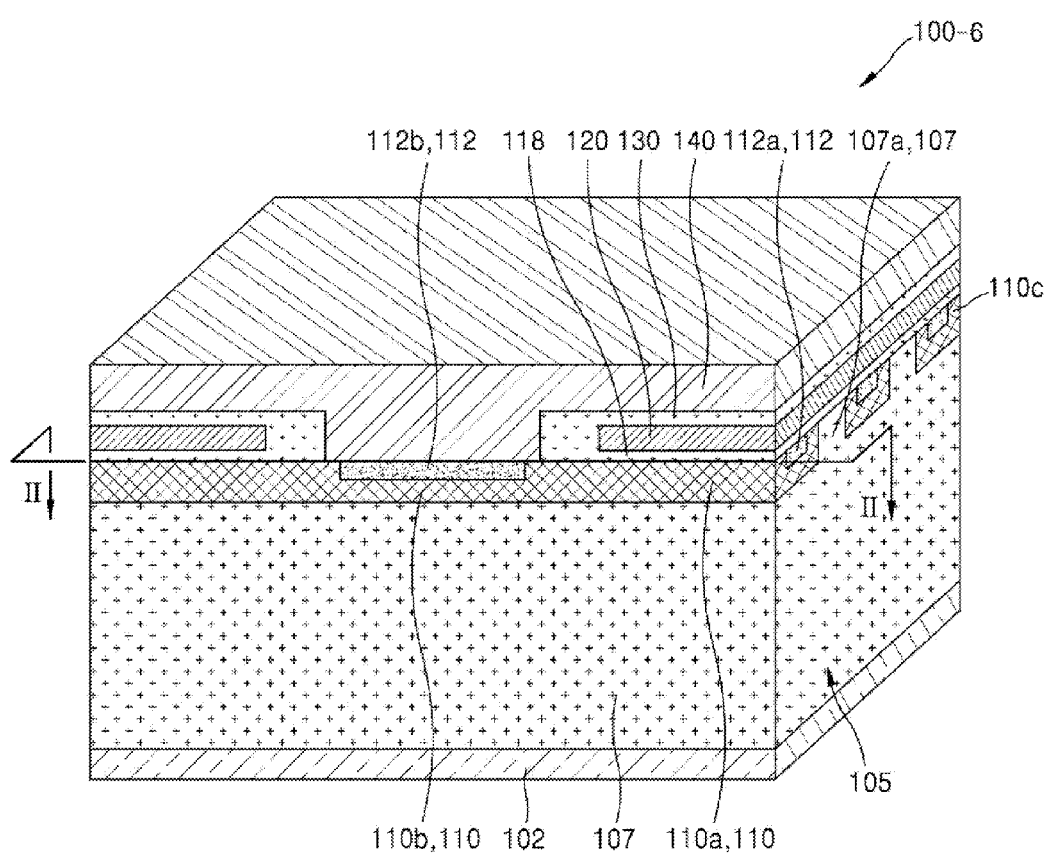
FIG. 60 is a schematic perspective view illustrating a power semiconductor device according to an embodiment of the present disclosure.
Figure 61:
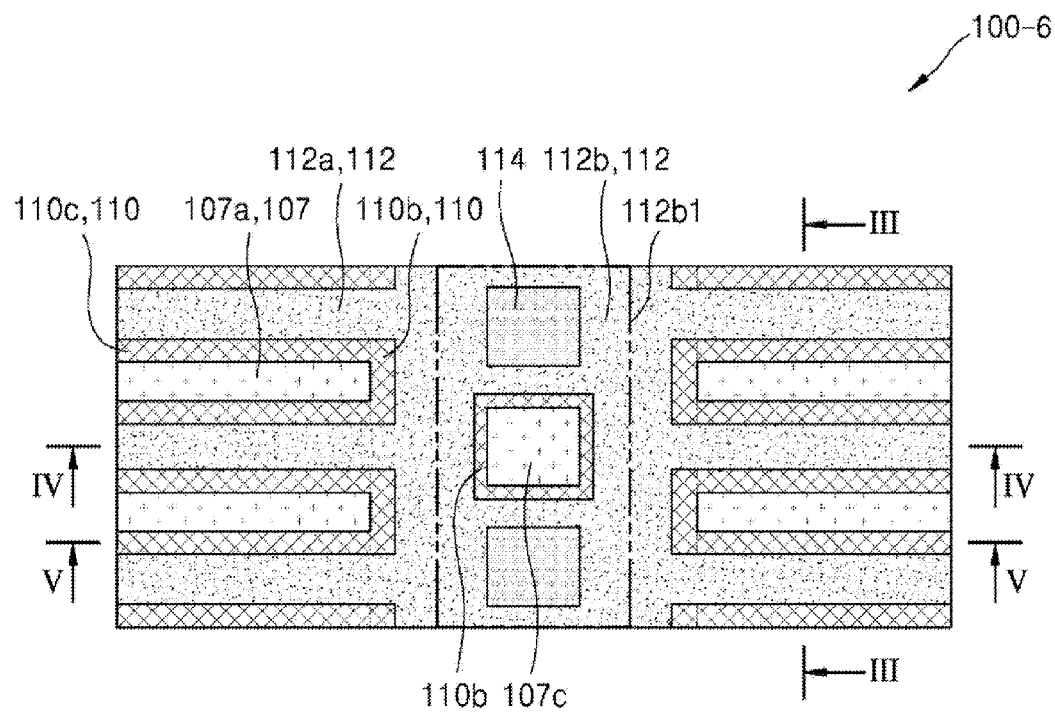
FIG. 61 is a plan view illustrating the power semiconductor device taken along line II-II of FIG. 60.
Figure 62:
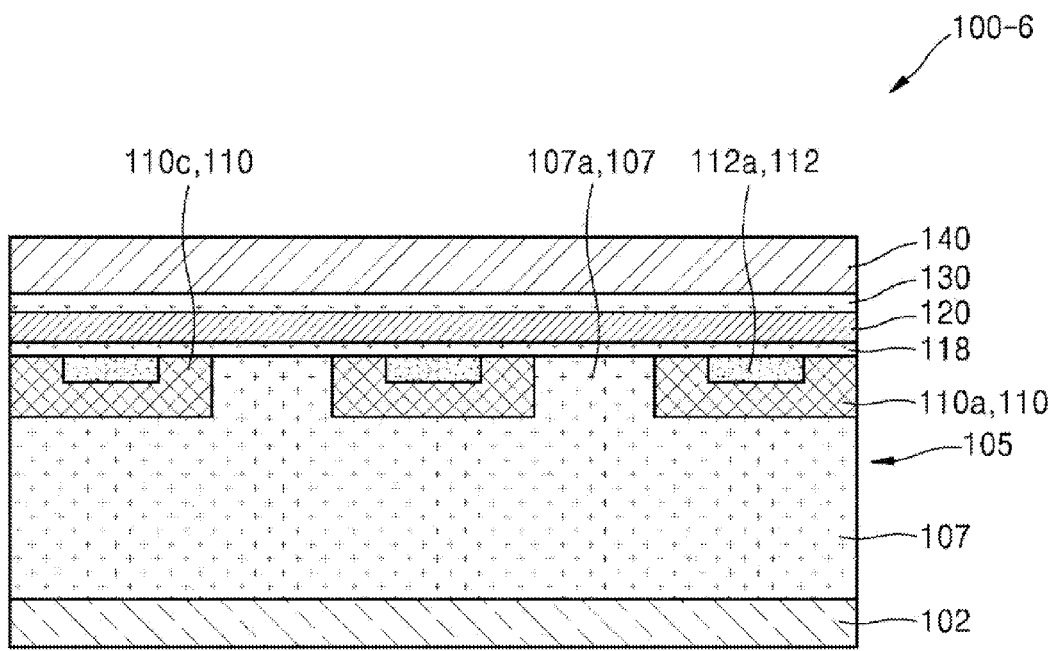
FIG. 62 is a cross-sectional view illustrating the power semiconductor device taken along line III-III of FIG. 61.
Figure 63:
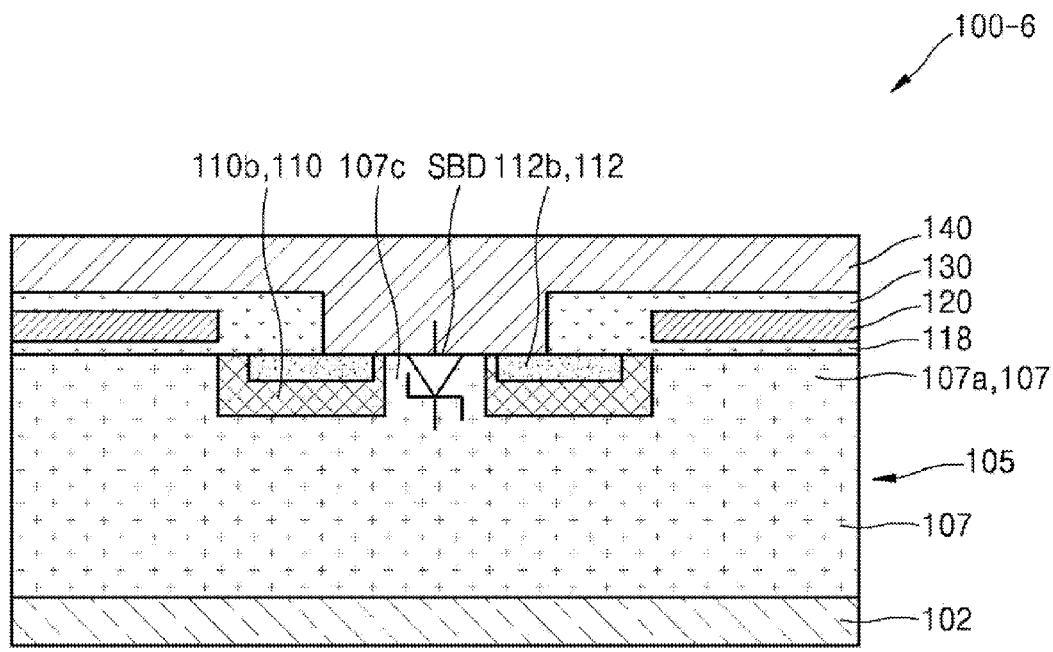
FIG. 63 is a cross-sectional view illustrating the power semiconductor device taken along line IV-IV of FIG. 61.
Figure 64:
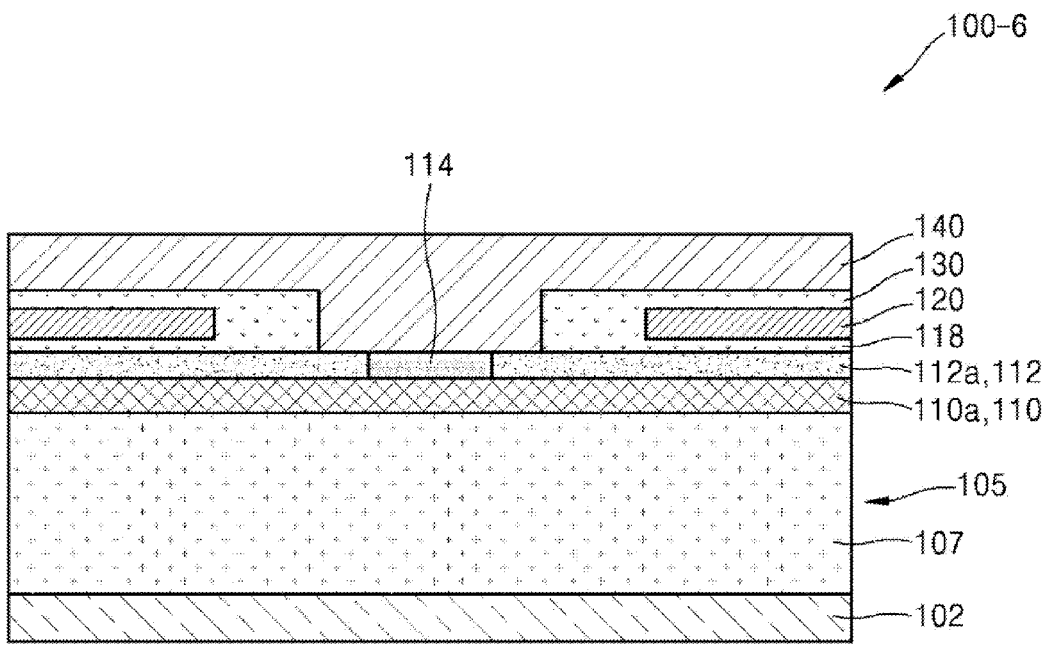
FIG. 64 is a cross-sectional view illustrating the power semiconductor device taken along line V-V of FIG. 61.

FIG. 60 is a schematic perspective view illustrating a power semiconductor device 100-6 according to an embodiment of the present disclosure, FIG. 61 is a plan view illustrating the power semiconductor device 100-6 taken along line II-II of FIG. 60, FIG. 62 is a cross-sectional view illustrating the power semiconductor device 100-6 taken along line III-III of FIG. 61, FIG. 63 is a cross-sectional view illustrating the power semiconductor device 100-6 taken along line IV-IV of FIG. 61, and FIG. 64 is a cross-sectional view illustrating the power semiconductor device 100-6 taken along line V-V of FIG. 61.

Referring to FIGS. 60 to 64, the power semiconductor device 100-6 may include at least a semiconductor layer 105, a gate insulating layer 118, and a gate electrode layer 120. For example, the power semiconductor device 100-6 may have a power MOSFET structure.

The semiconductor layer 105 may refer to one or a plurality of layers of semiconductor material, and may refer to, for example, one or a plurality of epitaxial layers. Furthermore, the semiconductor layer 105 may refer to one or a plurality of epitaxial layers on a semiconductor substrate.

For example, the semiconductor layer 105 may be formed of silicon carbide (SiC). Specifically, the semiconductor layer 105 may include at least one epitaxial layer of silicon carbide.

Silicon carbide (SiC) may have a wider bandgap compared to silicon, and thus may maintain stability even at a high temperature. In addition, because a breakdown electric field of the silicon carbide is higher than that of the silicon, the silicon carbide may stably operate even at a high temperature. Accordingly, the power semiconductor device 100-6 using the silicon carbide as the semiconductor layer 105 shows stable operational characteristics due to higher breakdown voltage and excellent heat release compared to silicon.

Specifically, the semiconductor layer 105 may include a drift region 107. The drift region 107 may have a first conductivity type, and may be formed by implanting impurities of the first conductivity type into a part of the semiconductor layer 105. For example, the drift region 107 may be formed by doping the impurities of the first conductivity type in the epitaxial layer of silicon carbide.

The drift region 107 may provide a vertical movement path for electric charges. Furthermore, the drift region 107 may include at least one protruding portion 107a disposed under the gate electrode layer 120. The protruding portion 107a may extend substantially onto a surface of the semiconductor layer 105.

A well region 110 may be formed in the semiconductor layer 105 to be in contact with at least a part of the drift region 107, and may have a second conductivity type. For example, the well region 110 may be formed by doping impurities of the second conductivity type opposite to the first conductivity type in the semiconductor layer 105 or the drift region 107.

For example, the well region 110 may include a first well region 110a formed in the semiconductor layer 105 under the gate electrode layer 120 and in contact with the protruding portion 107a of the drift region 107 and a second well region 110b formed in the semiconductor layer 105 outside the gate electrode layer 120. The first well region 110a and the second well region 110b may be connected to each other. Substantially, a lower part of the protruding portion 107a of the drift region 107 may be defined by the first well region 110a, and specifically, may be in contact with a sidewall of the first well region 110a.

A source region 112 may be formed on or in the well region 110 and may have the first conductivity type. For example, the source region 112 may be formed by doping the semiconductor layer 105 or the well region 110 with impurities of the first conductivity type. The source region 112 may be formed by doping with a higher concentration of the impurities of the first conductivity type than the drift region 107.

For example, the source region 112 may include a first source region 112a formed on the first well region 110a and a second source region 112b formed on the second well region 110b. The first source region 112a and the second source region 112b may be connected to each other. The first source region 112a may be disposed under the gate electrode layer 120, and the second source region 112b may be disposed outside the gate electrode layer 120.

The second source region 112b may include a source contact region 112b1 connected to a source electrode layer 140 outside the gate electrode layer 120. For example, the source contact region 112b1 may be a part of the second source region 112b and may refer to a part to which the source electrode layer 140 is connected.

A well contact region 114 may be formed in the second source region 112b, specifically, in the source contact region 112b1. For example, the well contact region 114 may be extended from the second well region 110b through the second source region 112b, and may have the second conductivity type. One or a plurality of well contact regions 114 may be formed in the source contact region 112b1.

The well contact region 114 may be connected to the source electrode layer 140. When connected to the source electrode layer 140, the well contact region 114 may be formed by doping with a higher concentration of the impurities of the second conductivity type than the well region 110 for lowering contact resistance.

In some embodiments, in the source contact region 112b1, at least a part of the second well region 110b may be exposed from the second source region 112b. A part 107c of the drift region 107 may penetrate a part of the second well region 110b exposed from the second source region 112b and may be exposed to a surface of the semiconductor layer 105. Accordingly, the part 107c of the drift region 107 may be spaced from the second source region 112b by the part of the second well region 110b.

A channel region 110c may be formed in the semiconductor layer 105 between the drift region 107 and the source region 112. For example, the channel region 110c may be formed in the semiconductor layer 105 between the protruding portion 107a of the drift region 107 and the first source region 112a.

For example, the channel region 110c may have the second conductivity type such that an inversion channel is formed. Because the channel region 110c has the doping type opposite to the source region 112 and the drift region 107, the channel region 110c, the source region 112, and the drift region 107 may form a diode junction. Accordingly, the channel region 110c may not allow movement of charges in a normal situation, but when an operation voltage is applied to the gate electrode layer 120, the inversion channel may be formed therein to allow the movement of charges.

For example, the channel region 110c may be a part of the well region 110. In detail, the channel region 110c may be a part of the well region 110 adjacent to the lower part of the gate electrode layer 120. In this case, the channel region 110c may be formed to be integrally or continuously connected to the well region 110a. A doping concentration of the impurities of the second conductivity type in the channel region 110c may be the same as those of other portions of the well region 110 or may be different therefrom for adjusting a threshold voltage.

In some embodiments, the protruding portion 107a of the drift region 107, the first well region 110a, the channel region 110c, and/or the first source region 112a may extend in one direction. Here, a direction of extension of the channel region 110c does not mean the direction of movement of electric charges.

In some embodiments, the first well region 110a, the channel region 110c, and the first source region 112a may be symmetrically formed with respect to the protruding portion 107a of the drift region 107. For example, the first well region 110a, the channel region 110c, and the first source region 112a may be formed on the semiconductor layers 105 on opposite sides of the protruding portion 107a of the drift region 107, respectively.

In some embodiments, the drift region 107 may include a plurality of protruding portions 107a formed parallel to each other in one direction. For example, the first well region 110a may be formed in a stripe pattern extending in the one direction, and the protruding portions 107a may also be formed in a stripe pattern. In addition, the first source region 112a may be formed in a stripe pattern on the first well region 110a. The channel region 110c may be formed between the protruding portions 107a of the drift region 107 and the first source region 112a.

In some embodiments, the first well regions 110a may be formed symmetrically with respect to the second well region 110b, and the first source regions 112a may be formed symmetrically with respect to the second source region 112b. In this case, the protruding portions 107a of the drift region 107 may include a plurality of protruding portions 107a formed symmetrically with respect to the second well region 110b or the second source region 112b.

Further, the first well region 110a and the second well region 110b may be formed repeatedly and alternately in one direction. In this case, the first source region 112a and the second source region 112b may also be repeatedly formed.

Additionally, a drain region 102 may be formed in the semiconductor layer 105 under the drift region 107 and may have the first conductivity type. For example, the drain region 102 may be doped with a higher concentration than the drift region 107.

In some embodiments, the drain region 102 may be provided as a substrate of silicon carbide having the first conductivity type. In this case, the drain region 102 may be understood as a part of the semiconductor layer 105 or a separate substrate from the semiconductor layer 105.

The gate insulating layer 118 may be formed on at least a part of the semiconductor layer 105. For example, the gate insulating layer 118 may be formed on at least the channel region 110c. Specifically, the gate insulating layer 118 may be formed on the first source region 112a, the channel region 110c, and the protruding portion 107a of the drift region 107.

For example, the gate insulating layer 118 may include an insulating material such as silicon oxide, silicon carbide oxide, silicon nitride, hafnium oxide, zirconium oxide, aluminum oxide, or a stacked structure thereof.

At least one gate electrode layer 120 may be formed on the gate insulating layer 118. For example, the gate electrode layer 120 may be formed on at least the channel region 110c. Specifically, the gate electrode layer 120 may be formed on the first source region 112a, the channel region 110c, and the protruding portion 107a of the drift region 107. The second well region 110b, the second source region 112b, and the well contact region 114 may be disposed outside the gate electrode layer 120 and may be exposed from the gate electrode layer 120.

For example, the gate electrode layer 120 may include a suitable conductive material, such as polysilicon, metal, metal nitride, metal silicide, or the like, or may include a stacked structure thereof.

An interlayer insulating layer 130 may be formed on the gate electrode layer 120. For example, the interlayer insulating layer 130 may include a suitable insulating material, such as an oxide layer, a nitride layer, or a stacked structure thereof.

The source electrode layer 140 may be formed on the interlayer insulating layer 130 and may be connected to the source region 112, specifically, the second source region 112b or the source contact region 112b1. In addition, the source electrode layer 140 may be further connected to the well contact region 114.

Further, the source electrode layer 140 may be in contact with the part 107c of the drift region 107, thereby forming a Schottky barrier diode (SBD). For example, the source electrode layer 140 may be in contact with the part 107c of the drift region 107 exposed from the second well region 110b on the surface of the semiconductor layer 105. The Schottky Barrier Diode (SBD) may refer to a diode using a Schottky barrier generated by junction of a metal and a semiconductor.

In addition to the Schottky barrier diode (SBD), a body diode may be parasitically formed in the power semiconductor device 100-6. For example, the body diode may be formed between the well region 110 and the drift region 107. The body diode may be one of PN diodes formed by junction of semiconductors of different polarities.

Figure 73:
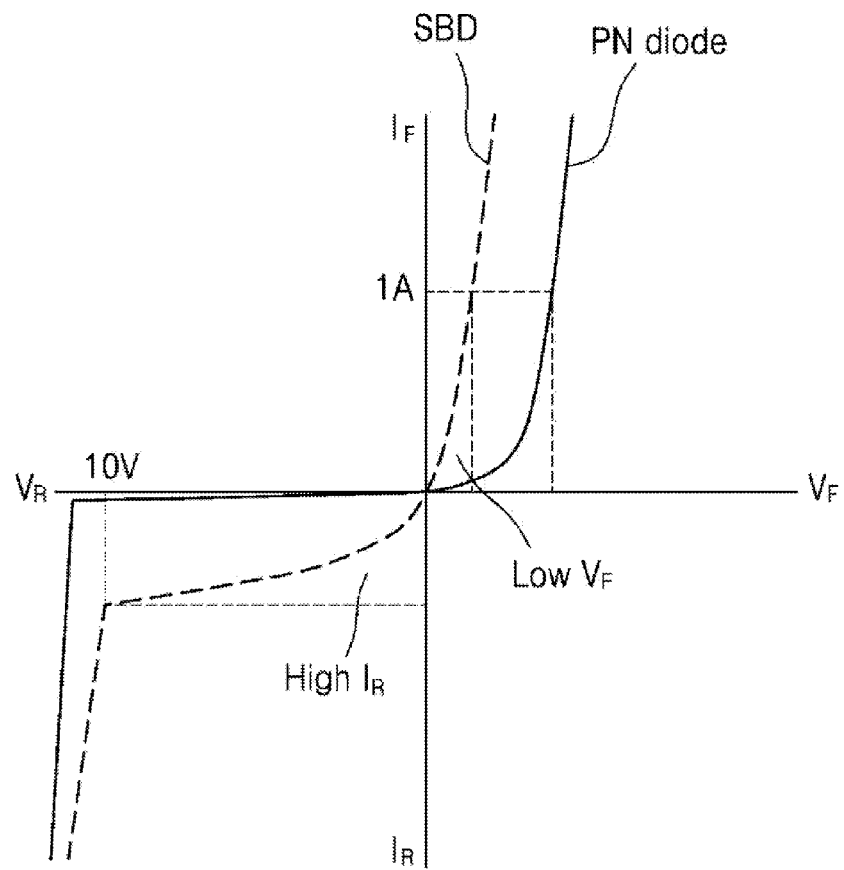
FIG. 73 is a graph showing characteristics of diodes of a power semiconductor device according to embodiments of the present disclosure.

As shown in FIG. 73, it may be seen that the Schottky barrier diode SBD has a low forward voltage VF and fast switching characteristics, compared to a PN diode.

The Schottky barrier diode (SBD) may reduce switching loss together with the body diode in an operation of the power semiconductor device 100-6. For example, the Schottky barrier diode (SBD) and the body diode may function as free wheeling diodes in the operation of the power semiconductor device 100-6.

In some embodiments, the source electrode layer 140 may be commonly connected to the second source region 112b, the well contact region 114, and the part 107c of the drift region 107. For example, the source electrode layer 140 may be formed of an appropriate conductive material, metal, or the like.

In the power semiconductor device 100-6 described above the first conductivity type and the second conductivity type may have opposite conductivity types, but may be any one of n-type and p-type, respectively. For example, when the first conductivity type is n-type, the second conductivity type is p-type, and vice versa.

Specifically, when the power semiconductor device 100-6 is an N-type MOSFET, the drift region 107 may be an N– region, the source region 112 and the drain region 102 may be N+ regions, the well region 110 and the channel region 110c may be P– regions, and the well contact region 114 may be a P+ region.

During the operation of the power semiconductor device 100-6, current may generally flow in a vertical direction from the drain region 102 along the protruding portions 107a of the drift region 107, and then may flow through the channel region 110c to the source region 112.

In the power semiconductor device 100-6 described above, the source contact region 112b and the well contact region 114 may be separately disposed outside the gate electrode layer 120. Accordingly, the first well region 110a and the first source region 112a may be formed such that the protruding portions 107a of the drift region 107 are densely disposed, and thus the channel region 110c may be densely formed under the gate electrode layer 120. Accordingly, the power semiconductor device 100-6 may have a high degree of integration.

Figure 65:
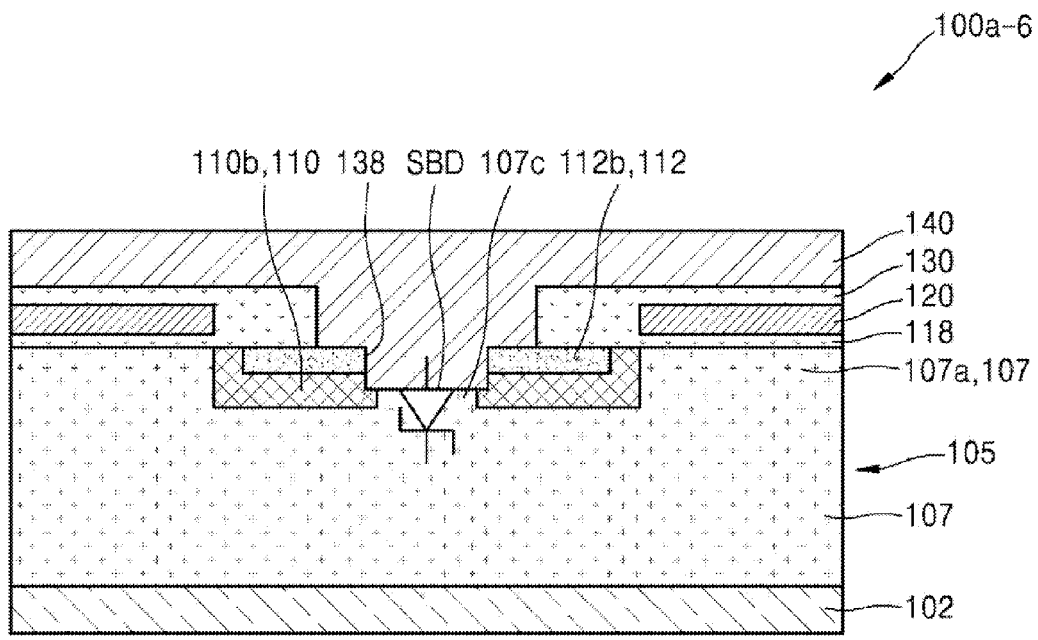
FIGS. 65 and 66 are cross-sectional views illustrating power semiconductor devices according to other embodiments of the present disclosure.
Figure 66:
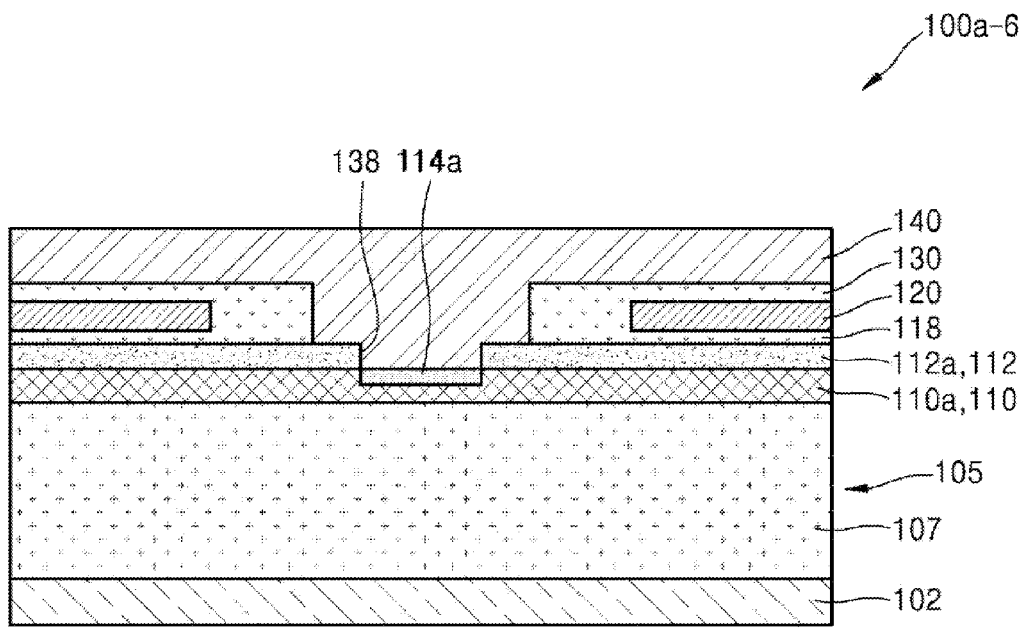

FIGS. 65 and 66 are cross-sectional views illustrating a power semiconductor device 100a-6 according to another embodiment of the present disclosure. The power semiconductor device 100a-6 is a modified or additional component of the power semiconductor device 100-6 of FIGS. 60 to 64, and thus the embodiments may refer to each other, and redundant descriptions are omitted Referring to FIGS. 65 and 66, the power semiconductor device 100a-6 may include at least one groove 138 formed by partially etching a part of the second well region 110b exposed from the second source region 112b and the part 107c of the drift region 107. The groove 138 may be formed to expose a surface of the second well region 110b or to be recessed to make the second well region 110b have a certain depth. The well contact region 114a may be formed on at least a bottom surface of the groove.

The source electrode layer 140 may be formed to fill the groove 138 and may be connected to the well contact region 114a and the second source region 112b within the groove 138. Further, the source electrode layer 140 may be in contact with the part 107c of the drift region 107 within the groove 138 to form the Schottky barrier diode. For example, the source electrode layer 140 may be in contact with the part 107c of the drift region 107 on the bottom surface of the groove 138. The recess structure may help to reduce contact resistance between the source electrode layer 140, and the second source region 112b and the well contact region 114a by increasing the contact area therebetween.

In some embodiments, the well contact region 114a may be entirely formed on a surface of the second well region 110b exposed by the groove 138. Accordingly, the well contact region 114a may be formed on the second well region 110b exposed from the bottom and sidewall of the groove 138. The structure of the well contact region 114a may further reduce contact resistance between the source electrode layer 140 and the second well region 110b.

Figure 67:
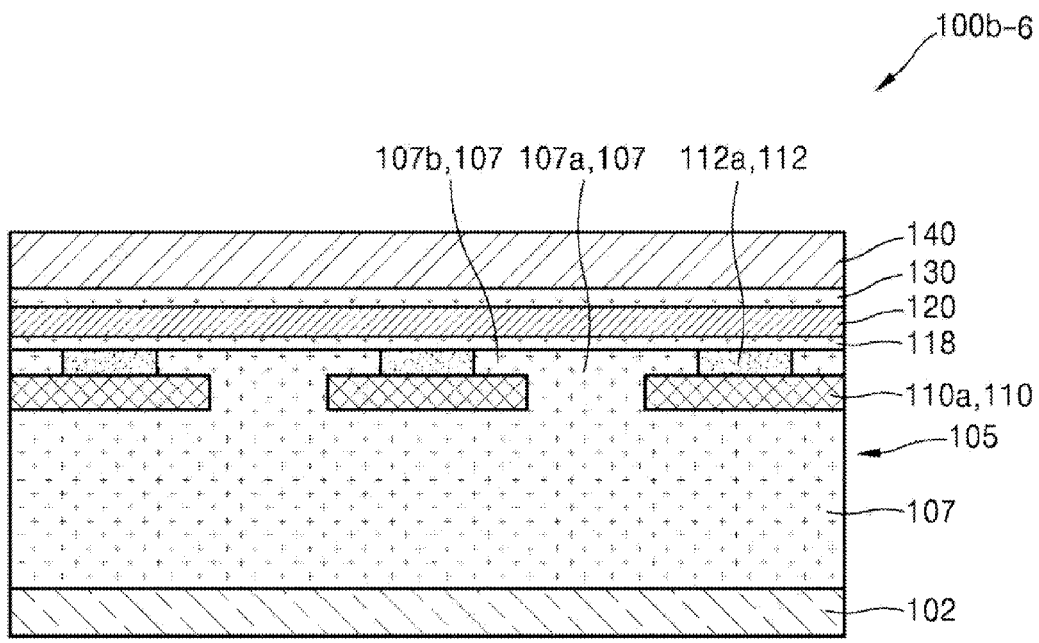
FIGS. 67 to 69 are cross-sectional views illustrating power semiconductor devices according to still other embodiments of the present disclosure.
Figure 68:
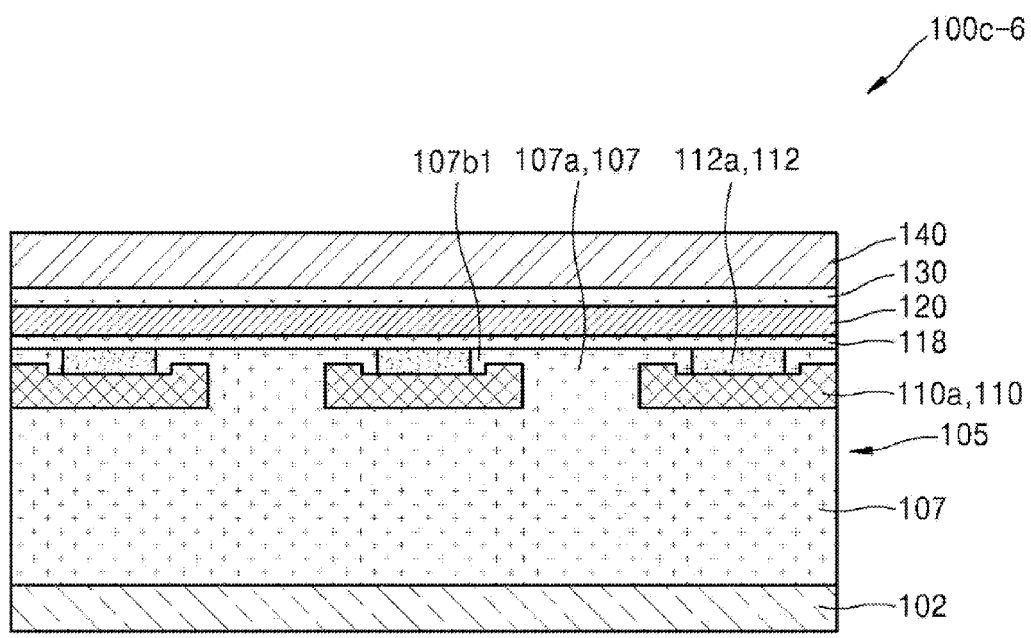
Figure 69:
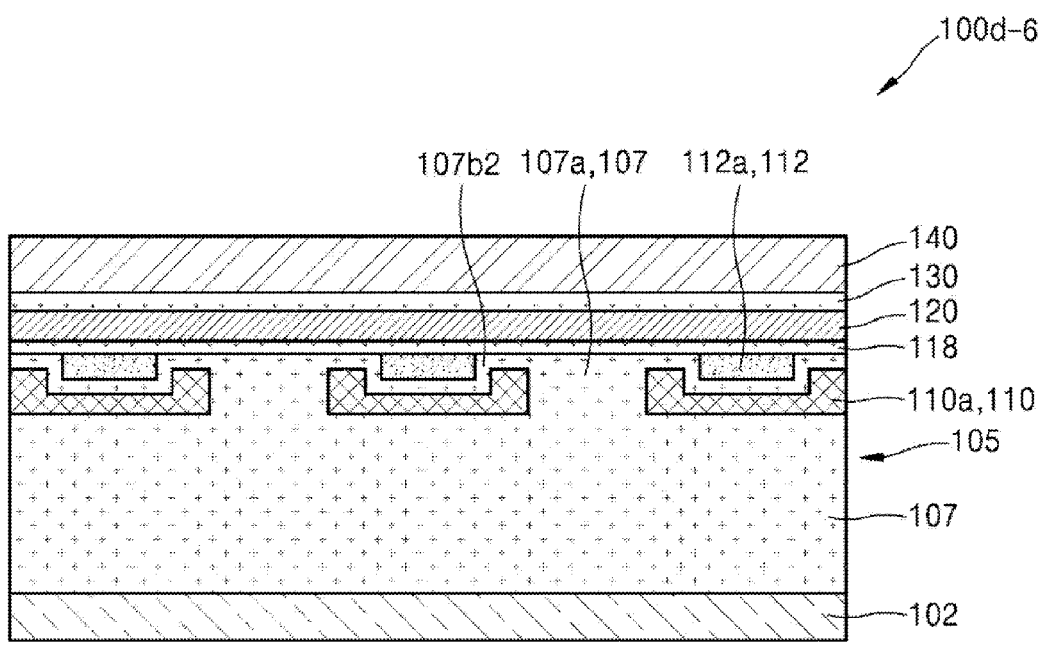

FIGS. 67 to 69 are cross-sectional views illustrating power semiconductor devices 100b-6, 100c-6, and 100d-6 according to other embodiments of the present disclosure. The power semiconductor devices 100b-6, 100c-6, and 100d-6 are partially modified or added to the power semiconductor device 100-6 of FIGS. 60 to 64, and thus the embodiments may refer to each other, and redundant descriptions are omitted.

Referring to FIG. 67, in the power semiconductor device 100b-6, a channel region 107b may be formed in the semiconductor layer 105 between the drift region 107 and the source region 112. For example, the channel region 107b may be formed in the semiconductor layer 105 between the protruding portion 107a of the drift region 107 and the first source region 112a. The channel region 107b may have the first conductivity type such that an accumulation channel is formed.

For example, the channel region 107b may have the same doping type as the source region 112 and the drift region 107. In this case, the source region 112, the channel region 107b, and the drift region 107 may have a structure that is normally electrically connected. However, in the structure of the semiconductor layer 105 of silicon carbide, a band of the channel region 107b is bent upward due to influence of negative charges generated when carbon clusters are formed in the gate insulating layer 118, thereby causing a potential barrier. Accordingly, when an operation voltage is applied to the gate electrode layer 120, the accumulation channel that allows the flow of electric charges or current may be formed in the channel region 107b.

Therefore, a threshold voltage to be applied to the gate electrode layer 120 to form the accumulation channel in the channel region 107b may be significantly lower than a threshold voltage to be applied to the gate electrode layer 120 to form a conventional inversion channel.

In some embodiments, the channel region 107b may be a part of the drift region 107. Specifically, the channel region 107b may be a part of the protruding portion 107a of the drift region 107. For example, the channel region 107b may be integrally formed with the drift region 107.

The drift region 107 may be connected to the source region 112 through the channel region 107b. Specifically, in the channel region 107b, the protruding portion 107a of the drift region 107 and the first source region 112a may be in contact with each other.

For example, a doping concentration of the impurities of the first conductivity type in the channel region 107b may be the same as other parts of the drift region 107 or may be different therefrom for adjusting the threshold voltage.

In some embodiments, the first well region 110a may be formed under the first source region 112a to further protrude toward the protruding portion 107a of the drift region 107 than the first source region 112a. The channel region 107b may be formed in the semiconductor layer 105 on the protruding portion of the first well region 110a. For example, the protruding portion 107a of the drift region 107 may be further extended to a groove portion between the first well region 110a and the gate electrode layer 120, and the channel region 107b may be formed thereon. This structure may allow the channel region 107b to be defined between the gate electrode layer 120 and the well region 110.

In some embodiments, the first well region 110a and the first source region 112a may have the same width. In this case, the first source region 112a may be in contact with the protruding portion 107a of the drift region 107, and the channel region 107b may be defined at a part in contact with the protruding portion 107a.

Referring to FIG. 68, in the power semiconductor device 100c-6, the first well region 110a may further protrude from the first source region 112a toward the protruding portion 107a of the drift region 107, and may include a tab portion extending toward the gate electrode layer 120 at an end thereof.

A channel region 107b1 may be formed in the semiconductor layer 105 on the protruding portion of the first well region 110a. For example, the channel region 107b1 may be formed in a bent shape on the protruding portion and the tab portion of the first well region 110a. This structure may allow the channel region 107b1 to be more limited between the gate electrode layer 120 and the first well region 110a.

Referring to FIG. 69, in the power semiconductor device 100d-6, the first well region 110a may further protrude from the first source region 112a toward the protruding portion 107a of the drift region 107, and may include a tab portion extending toward the gate electrode layer 120 at an end thereof. Furthermore, the protruding portion 107a of the drift region 107 may further extend between a lower part of the first source region 112a and the first well region 110a.

A channel region 107b2 may be formed to extend further into the semiconductor layer 105 between the lower part of the first source region 112a and the first well region 110a. For example, the channel region 107b2 may be formed in a bent shape from an upper part of the tab portion of the first well region 110a to the lower part of the first source region 112a. This structure may contribute to widening the contact area between the channel region 107b2 and the first source region 112a.

Figure 70:
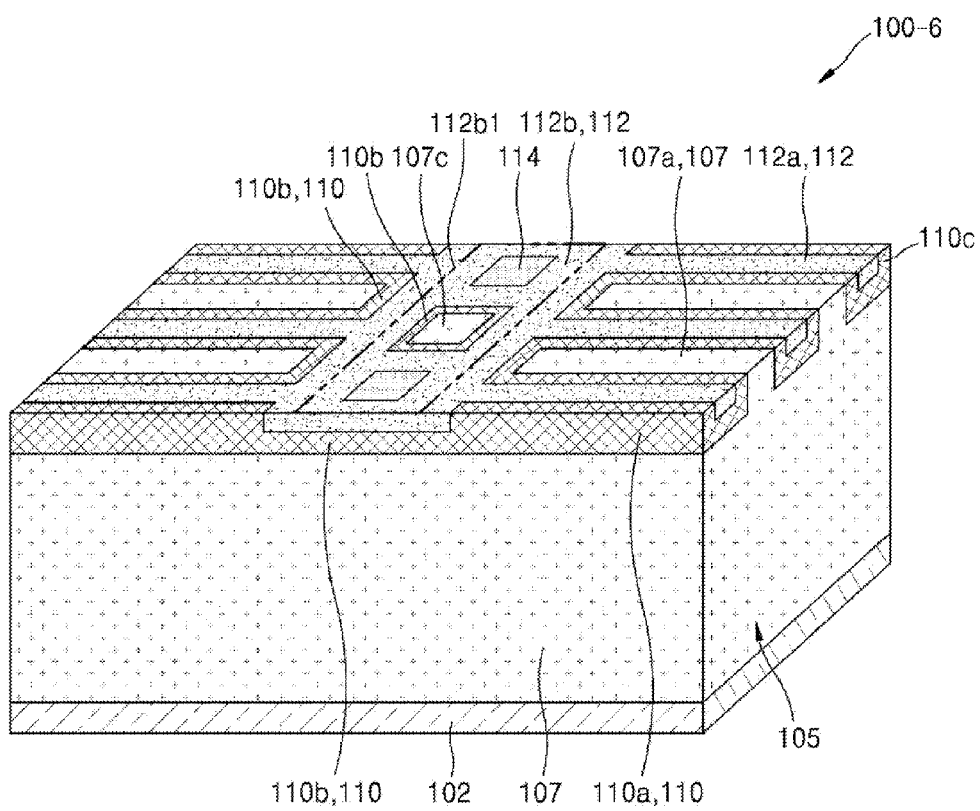
FIGS. 70 to 72 are schematic perspective views illustrating a method of fabricating a power semiconductor device according to an embodiment of the present disclosure.
Figure 71:
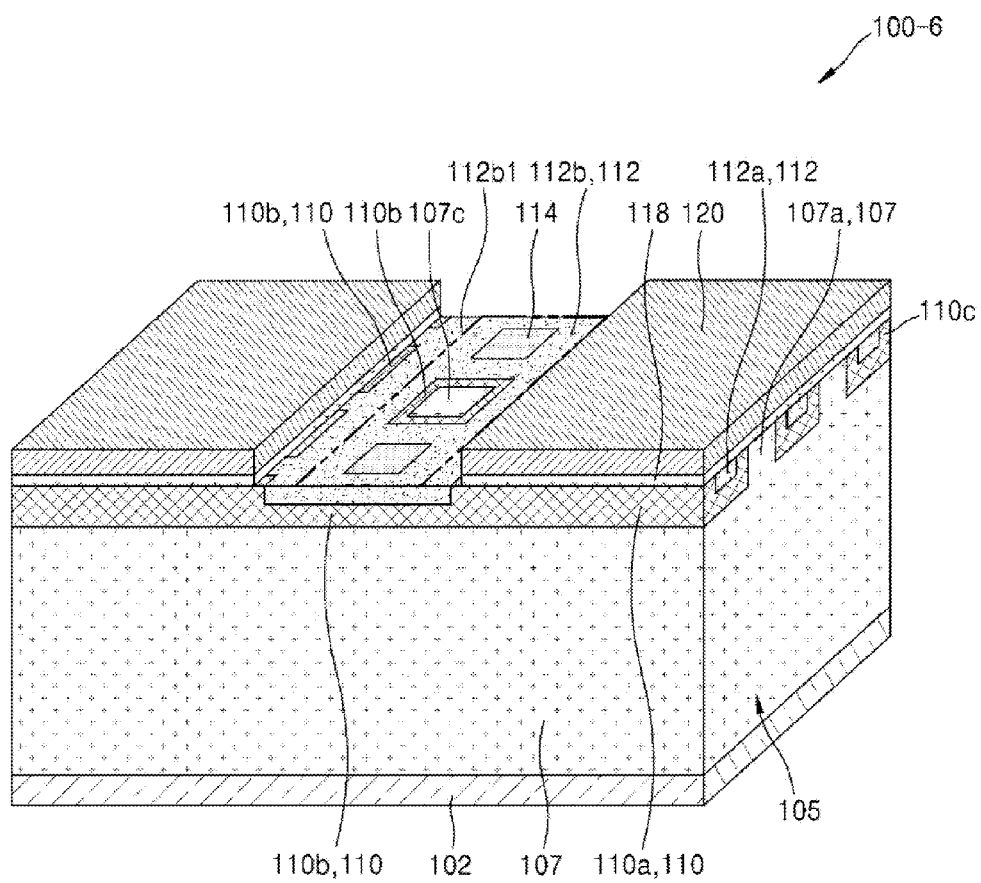
Figure 72:
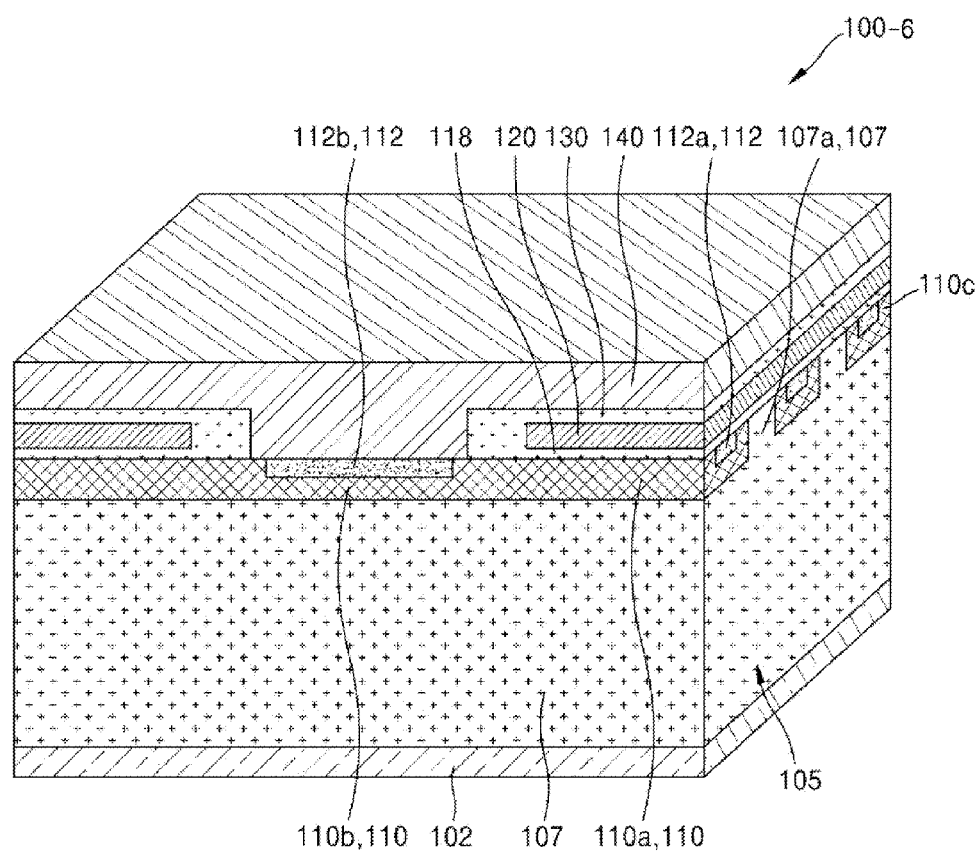

FIGS. 70 to 72 are schematic perspective views illustrating a method of fabricating the power semiconductor device 100-6 according to an embodiment of the present disclosure.

Referring to FIG. 70, the drift region 107 having the first conductivity type may be formed in the semiconductor layer 105 of silicon carbide (SiC) to provide a vertical movement path of charges. For example, the drift region 107 may be formed on the drain region 102 having the first conductivity type. In some embodiments, the drain region 102 may be provided as a substrate of the first conductivity type, and the drift region 107 may be formed as one or the plurality of epitaxial layers on the substrate.

Subsequently, the well region 110 having the second conductivity type may be formed in the semiconductor layer 105 to be in contact with the at least a part of the drift region 107. For example, the forming of the well region 110 may be performed by implanting impurities of the second conductivity type into the semiconductor layer 105.

In detail, the well region 110 may be formed on the semiconductor layer 105 in contact with the protruding portion 107a to define at least one protruding portion 107a of the drift region 107. Specifically, the well region 110 may be formed by doping the drift region 107 or the semiconductor layer 105 with impurities of conductivity type opposite to the drift region 107.

The well region 110 may be divided into the first well region 110a under the gate electrode layer 120 and the second well region 110b outside the gate electrode layer 120. For example, the first well region 110a may define the protruding portion 107a of the drift region 107, and the well contact region 114 may be formed in the second well region 110b later. The first well region 110a and the second well region 110b may be connected to each other.

Further, a source region 112 having the first conductivity type may be formed on or in the well region 110. For example, the forming of the source region 112 may be performed by implanting impurities of the first conductivity type into the well region 110 or into the semiconductor layer 105.

For example, the forming of the source region 112 may include forming the first source region 112a on or in the first well region 110a and forming the second source region 112b on the second well region 110b or in the second well region 110b. A part of the second source region 112b may be allocated as the source contact region 112b1 to be connected to the source electrode layer 140. The first source region 112a and the second source region 112b may be connected to each other. The source region 112 may be formed substantially from a surface of the semiconductor layer 105 into the well region 110 or above the well region 110, with a certain depth.

In addition to the formation of the source region 112, the channel region 110c having the second conductivity type may be formed to form an inversion channel in the semiconductor layer 105 between the source region 112 and the drift region 107. For example, the channel region 110c may be formed in the semiconductor layer 105 between the protruding portion 107a of the drift region 107 and the first source region 112a. For example, the channel region 110c that is a part of the first well region 110a may not be separately formed but may be formed together with the first well region 110a.

Optionally, the well contact region 114 extending from the second well region 110b through the second source region 112b may be formed in the second source region 112b. For example, the well contact region 114 may be formed by implanting impurities of the second conductivity type into a part of the well region 110 at a higher concentration than the well region 110.

A part of the second well region 110b may be exposed from the second source region 112b, and the part 107c of the drift region 107 may be exposed from the surface of the semiconductor layer 105 through the part of the second well region 110b.

In a modified example of this embodiment, an impurity doping order of the well region 110, the source region 112, the channel region 110c, and the well contact region 114 may be appropriately changed.

In the above-described fabricating method, impurity implantation or impurity doping may be performed such that the impurities are mixed when the impurities are implanted into the semiconductor layer 105 or the epitaxial layer is formed. However, for implantation of the impurities in the selective region, an ion implantation method using a mask pattern may be used.

Optionally, after ion implantation, a heat treatment for activating or diffusing the impurities may be followed.

Referring to FIG. 71, the gate insulating layer 118 may be formed on at least a part of the semiconductor layer 105. For example, the gate insulating layer 118 may be formed on at least the channel region 110c and the protruding portion 107a of the drift region 107.

For example, the gate insulating layer 118 may be formed by oxidizing the semiconductor layer 105 to form an oxide, or by depositing an insulating material such as oxide or nitride on the semiconductor layer 105.

Subsequently, the gate electrode layers 120 may be formed on the gate insulating layer 118. For example, the gate electrode layers 120 may be formed by forming a conductive layer on the gate insulating layer 118 and then patterning the conductive layer. The gate electrode layer 120 may be formed by doping polysilicon with impurities, or may be formed to include a conductive metal or metal silicide.

The patterning process may be performed using photo lithography and etching processes. The photolithography process may include a process which forms a photoresist pattern as a mask layer using a photo process and a development process. The etching process may include a process which selectively etches an underlying structure using the photoresist pattern.

Referring to FIG. 72, the interlayer insulating layer 130 may be formed on the gate electrode layer 120. Optionally, when the interlayer insulating layer 130 is entirely formed on the underlying structure, a process which forms a contact hole pattern for exposing the source contact region 112b1 and the well contact region 114 may be followed.

Subsequently, the source electrode layer 140 may be formed on the semiconductor layer 105 to be connected to the second source region 112b the well contact region 114, and the part 107c of the drift region 107. The contact structure between the source electrode layer 140 and the part 107c of the drift region 107 may form the Schottky barrier diode (SBD). For example, the source electrode layer 140 may be formed by forming a conductive layer, such as a metal layer, on the interlayer insulating layer 130 and then patterning or planarizing the conductive layer.

Meanwhile, the power semiconductor device 100a-6 of FIGS. 65 and 66 may be fabricated by adding or modifying some processes to the fabricating process of the power semiconductor device 100-6 described above.

The fabricating of the power semiconductor device 100a-6, may further include forming at least one groove 138 by partially etching the part of the second well region 110b exposed from the second source region 112b and the part 107c of the drift region 107, forming the well contact region 114 having the second conductive type on a part of the second well region 110b in a portion of the bottom surface of the groove 138, and filling the groove 138 to form the source electrode layer 140 to be in common contact with the second source region 112b, the well contact region 114, and the part 107c of the drift region 107.

Meanwhile, when the power semiconductor devices 100b-6, 100c-6, and 100d-6 of FIGS. 67 to 69 are fabricated, the channel regions 107b, 107b1, and 107b2 may have the first conductive type to form the accumulation channel. For example, the channel regions 107b, 107b1, and 107b2 may be formed as a part of the drift region 107.

According to the above-described fabricating method, it is possible to economically fabricate the highly integrated power semiconductor device 100-6 by using a process used in an existing silicon substrate, using the semiconductor layer 105 of silicon carbide.

According to the power semiconductor device and the method of fabricating the same according to an embodiment of the present disclosure made as described above, it is possible to increase the degree of integration by increasing the channel density.

Of course, these effects are exemplary, and the scope of the invention is not limited by these effects.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
a semiconductor layer of silicon carbide (SiC);
a gate insulating layer disposed on at least a part of the semiconductor layer;
a gate electrode layer disposed on the gate insulating layer;
a drift region including at least one protruding portion disposed under the gate electrode layer in the semiconductor layer and having a first conductivity type;
a well region including a first well region, which is disposed in the semiconductor layer of a lower part of the gate electrode layer and is in contact with the at least one protruding portion, and a second well region, which is disposed in the semiconductor layer outside the gate electrode layer and is connected to the first well region, and having a second conductivity type;

a source region including a first source region disposed in the first well region and a second source region disposed in the second well region and connected to the first source region, and having the first conductivity type;

a channel region disposed under the gate electrode layer, disposed in the semiconductor layer between the at least one protruding portion of the drift region and the first source region, and having the first conductivity type;

a source electrode layer connected to the second source region outside the gate electrode layer; and a plurality of well contact regions extending from the second well region through the second source region in the second source region, connected to the source electrode layer, and having the second conductivity type, wherein the first source region is symmetrically disposed on both sides of the second source region, and wherein the plurality of well contact regions are disposed in a line at a predetermined distance in the same direction as an extension direction of the second source region, and are not disposed in the first source region.

2. The power semiconductor device of claim 1 wherein the plurality of well contact regions are doped with impurities having a higher concentration than the well region.

3. The power semiconductor device of claim 1, wherein the at least one protruding portion of the drift region, the first well region, and the first source region extend in one direction.

4. The power semiconductor device of claim 3, wherein the first well region, the first source region, and the channel region are respectively disposed in the semiconductor layer on opposite sides of the at least one protruding portion of the drift region.

5. The power semiconductor device of claim 1, wherein the channel region is part of the well region.

6. The power semiconductor device of claim 1, wherein the at least one protruding portion includes a plurality of protruding portions whose sidewalls are surrounded by the first well region, and wherein the channel region is disposed between the plurality of protruding portions and the first source region.

7. The power semiconductor device of claim 6, wherein the plurality of protruding portions extend side by side in one direction.

8. The power semiconductor device of claim 1, wherein the first well region is symmetrically disposed with respect to the second well region, wherein the first source region is symmetrically disposed with respect to the second source region, and wherein the channel region is symmetrically disposed with respect to the second well region or the second source region.

9. The power semiconductor device of claim 8, wherein the at least one protruding portion includes a plurality of protruding portions symmetrically disposed with respect to the second well region or the second source region, and wherein the plurality of protruding portions extend in one direction.

10. The power semiconductor device of claim 1, wherein the gate electrode layer exposes the second source region and covers the first source region, the channel region, and the at least one protruding portion of the drift region.

11. The power semiconductor device of claim 1, further comprising:

a drain region having the first conductivity type in the semiconductor layer under the drift region, wherein the drain region is doped with impurities having a higher concentration than the drift region.

12. A method of fabricating a power semiconductor device, the method comprising:

forming a drift region having a first conductivity type in a semiconductor layer of silicon carbide (SiC);

forming a well region having a second conductivity type, to allow the drift region to include at least one protruding portion, and including a first well region defining the at least one protruding portion and a second well region connected to the first well region;

forming a source region including a first source region formed in the first well region and a second source region formed in the second well region and connected to the first source region, and having the first conductivity type;

forming a channel region, having the first conductivity type, in the semiconductor layer between the at least one protruding portion of the drift region and the first source region;

forming a gate insulating layer on at least the channel region and the at least one protruding portion of the drift region;

forming at least one gate electrode layer on the gate insulating layer;

forming a plurality of well contact regions extending from the second well region in the second source region outside the gate electrode layer through the second source region, connected to a source electrode layer, and having the second conductivity type; and forming the source electrode layer on the semiconductor layer to be connected to the second source region and the plurality of well contact regions, wherein the second well region is formed in the semiconductor layer outside the gate electrode layer wherein the first source region is symmetrically formed on both sides of the second source region, and wherein the plurality of well contact regions are formed in a line at a predetermined distance in the same direction as an extension direction of the second source region, and are not formed in the first source region.

13. The method of claim 12, wherein the plurality of well contact regions are doped with impurities having a higher concentration than the well region.

14. The method of claim 12, wherein the forming of the well region and the channel region is performed by implanting impurities of the second conductivity type into the semiconductor layer, and wherein the forming of the source region is performed by implanting impurities of the first conductivity type into the well region.

15. The method of claim 12, wherein the at least one protruding portion includes a plurality of protruding portions whose sidewalls are surrounded by the first well region, and wherein the channel region is formed between the plurality of protruding portions and the source region.

16. The method of claim 12, wherein the first well region is symmetrically formed with respect to the second well region, wherein the first source region is symmetrically formed with respect to the second source region, and wherein the channel region is symmetrically formed with respect to the second well region or the second source region.

17. The method of claim 12, wherein the drift region is formed on a drain region having the first conductivity type, and wherein the drift region is formed as an epitaxial layer on the drain region.

18. The method of claim 12, wherein the second source region is different from the plurality of well contact regions.

19. The power semiconductor device of claim 1, wherein the second source region is different from the plurality of well contact regions.

20. The power semiconductor device of claim 1, wherein the second well region surrounds both side surfaces of the second source region and lower portions of the second source region and the plurality of well contact regions.

* * * * *